US008476699B2

(12) United States Patent
Masuoka et al.

(10) Patent No.: US 8,476,699 B2
(45) Date of Patent: Jul. 2, 2013

(54) METHOD FOR PRODUCING SEMICONDUCTOR DEVICE AND SEMICONDUCTOR DEVICE

(75) Inventors: Fujio Masuoka, Tokyo (JP); Nozomu Harada, Tokyo (JP)

(73) Assignee: Unisantis Electronics Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/414,039

(22) Filed: Mar. 7, 2012

(65) Prior Publication Data
US 2012/0228677 A1 Sep. 13, 2012

Related U.S. Application Data

(60) Provisional application No. 61/450,335, filed on Mar. 8, 2011.

(51) Int. Cl.
*H01L 29/66* (2006.01)
*H01L 31/062* (2012.01)
*H01L 27/14* (2006.01)
*H01L 31/06* (2012.01)
*H01L 27/108* (2006.01)
*H01L 21/00* (2006.01)
*H01L 21/46* (2006.01)
*H01L 21/461* (2006.01)

(52) U.S. Cl.
USPC ........... 257/329; 257/290; 257/292; 257/431; 257/461; 257/302; 257/E29.262; 257/E21.41; 257/E27.133; 438/57; 438/459; 438/692

(58) Field of Classification Search
USPC ................. 257/290–292, 431–432, 459, 329, 257/302, 461, 466, E27.133, E29.262, E21.41, 257/E27.112, E29.274, E21.652, E27.132, 257/E27.096; 438/48, 57, 60, 455, 458, 459, 438/542, 73, 74, 75, 689–692; 348/294, 308
See application file for complete search history.

(56) References Cited

U.S. PATENT DOCUMENTS

| 7,872,287 | B2* | 1/2011 | Masuoka et al. | 257/291 |
|---|---|---|---|---|
| 8,158,468 | B2* | 4/2012 | Masuoka et al. | 438/152 |
| 8,241,976 | B2* | 8/2012 | Masuoka et al. | 438/212 |
| 8,330,089 | B2* | 12/2012 | Masuoka et al. | 250/208.1 |
| 2008/0185622 | A1 | 8/2008 | Lim | |

(Continued)

FOREIGN PATENT DOCUMENTS

| JP | 2005-026366 A | 1/2005 |
|---|---|---|
| JP | 2009-164589 A | 7/2009 |
| WO | WO 2009/034623 A1 | 3/2009 |

OTHER PUBLICATIONS

M. Bruel, "Silicon on Insulator Material Technology", *Electronics Letters*, vol. 31, No. 14, pp. 1201-1202, Jul. 6, 1995.

(Continued)

*Primary Examiner* — Mary Wilczewski
*Assistant Examiner* — Erik T. K. Peterson
(74) *Attorney, Agent, or Firm* — Brinks Hofer Gilson & Lione

(57) ABSTRACT

A method for producing a semiconductor device includes a step of forming a conductor layer and a first semiconductor layer containing a donor impurity or an acceptor impurity on a first semiconductor substrate; a step of forming a second insulating layer so as to cover the first semiconductor layer; a step of thinning the first semiconductor substrate to a predetermined thickness; a step of forming, from the first semiconductor substrate, a pillar-shaped semiconductor having a pillar-shaped structure on the first semiconductor layer; a step of forming a first semiconductor region in the pillar-shaped semiconductor by diffusing the impurity from the first semiconductor layer; and a step of forming a pixel of a solid-state imaging device with the pillar-shaped semiconductor into which the impurity has been diffused.

20 Claims, 34 Drawing Sheets

U.S. PATENT DOCUMENTS

2009/0152611 A1* 6/2009 Fujimoto ................ 257/296
2009/0197379 A1* 8/2009 Leslie .................... 438/253

OTHER PUBLICATIONS

Takahashi, Hidekazu et al., "A 3.9-μm Pixel Pitch VGA Format 10-b Digital Output CMOS Image Sensor With 1.5 Transistor/Pixel", *IEEE Journal of Solid-State Circuits*, vol. 39, No. 12, pp. 2417-2425, Dec. 2004.

Yonehara, Takao et al., "Epitaxial layer transfer by bond and etch back of porous Si", *Appl. Phys. Lett.*, vol. 64, No. 16, pp. 2108-2110, Apr. 18, 1994.

* cited by examiner

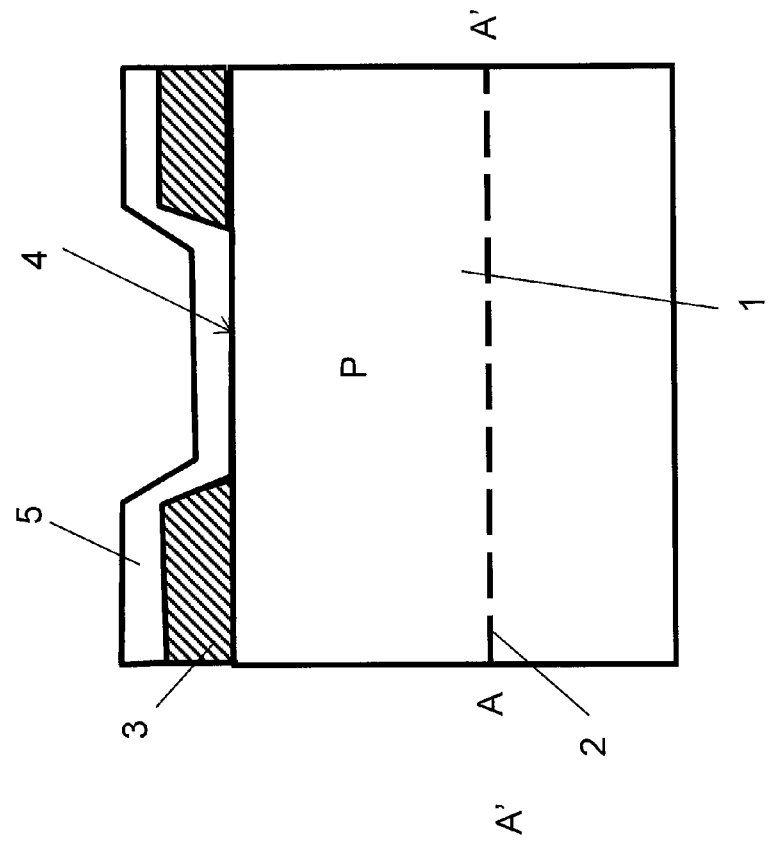
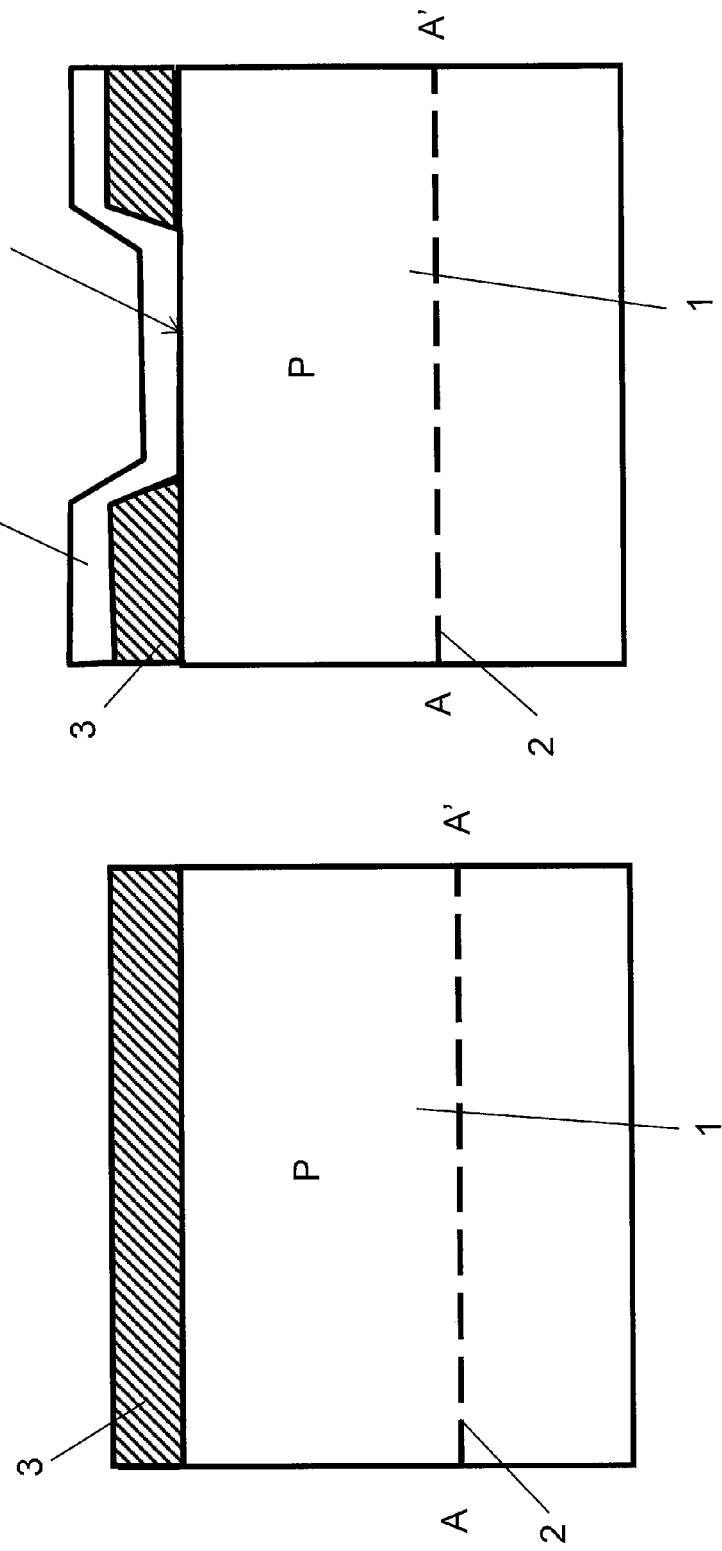
FIG. 1A
FIG. 1B

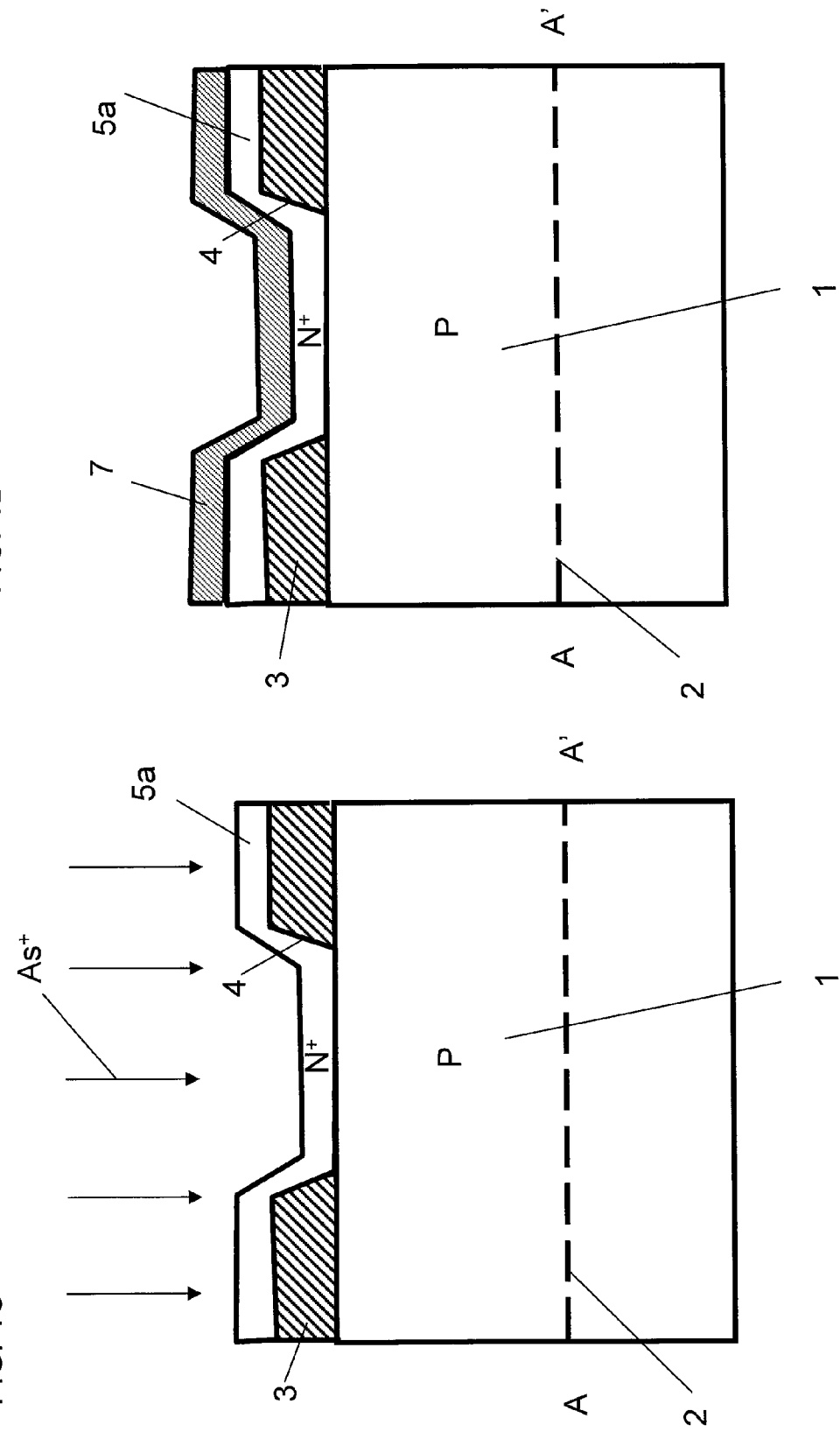

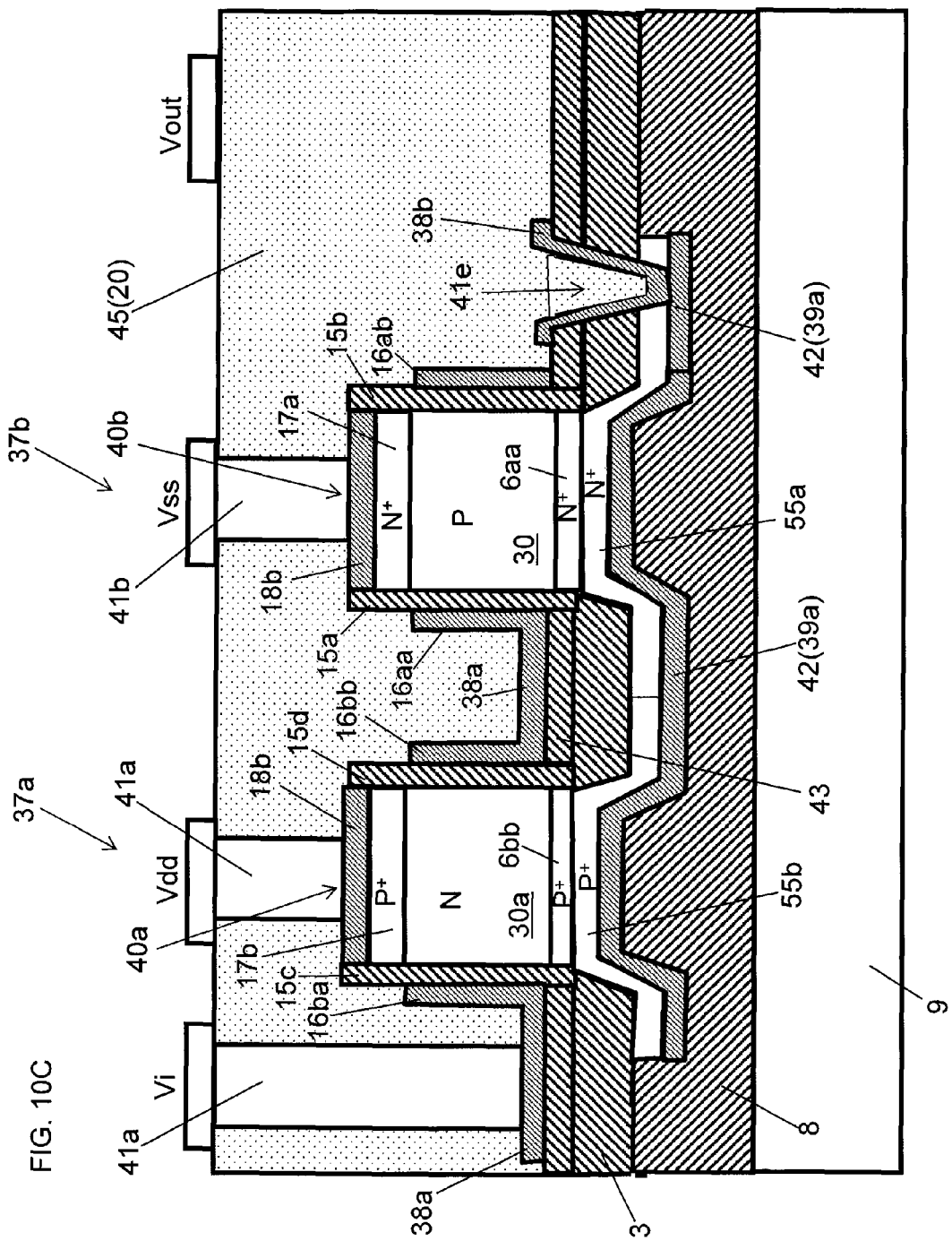

METHOD FOR PRODUCING SEMICONDUCTOR DEVICE AND SEMICONDUCTOR DEVICE

RELATED APPLICATIONS

Pursuant to 35 U.S.C. §119(e), this application claims the benefit of the filing date of Provisional U.S. Patent Application Ser. No. 61/450,335 filed on Mar. 8, 2011. The entire content of this application is hereby incorporated by reference.

BACKGROUND OF THE INVENTION

1. Field of the Invention

The present invention relates to a method for producing a semiconductor device and a semiconductor device and, in particular, to a method for producing a semiconductor device including a transistor in which a channel region is formed in a semiconductor having a pillar-shaped structure, and the semiconductor device.

2. Description of the Related Art

Solid-state imaging devices such as CCDs and CMOS devices are widely used for video cameras, still cameras, and the like. Improvements in the performances of solid-state imaging devices such as a higher resolution, a higher operation speed, and a higher sensitivity have been demanded.

As illustrated in FIG. 17, a solid-state imaging device in which a single pixel is constituted within a single pillar-shaped semiconductor 110 is known (for example, refer to International Publication No. 2009/034623).

In this pixel structure, an $N^+$-type silicon layer 51 functioning as a signal line of the solid-state imaging device is formed on a semiconductor substrate. The pillar-shaped semiconductor 110 is connected to the $N^+$-type silicon layer 51. In the pillar-shaped semiconductor 110, a MOS transistor is formed that is constituted by a P-type silicon layer 52, insulating films 53a and 53b, and gate conductor layers 54a and 54b and is configured to discharge stored charges. In addition, in the pillar-shaped semiconductor 110, a photodiode that is connected to the MOS transistor and is configured to store charges generated through irradiation with light (electromagnetic energy waves) is formed. This photodiode is constituted by the P-type silicon layer 52 and N-type silicon layers 58a and 58b. A junction field-effect transistor (junction transistor) is formed in which the P-type semiconductor 52 surrounded by the photodiode serves as a channel, the photodiode serves as a gate, a $P^+$-type silicon layer 56 that is formed on the photodiode and is connected to pixel selection wirings 57a and 57b serves as a source, and a portion of the P-type silicon layer 52 close to the $N^+$-type silicon layer 51 serves as a drain.

The basic operations of the solid-state imaging device are a signal-charge storage operation of storing, in the photodiode, signal charges (in this case, electrons) generated by irradiation with light; a signal reading operation of modulating a source-drain current flowing between the portion of the P-type silicon layer 52 close to the $N^+$-type silicon layer 51 and the $P^+$-type silicon layer 56, with a gate voltage based on a photodiode voltage according to the stored signal charges, and reading the modulated source-drain current as a signal current; and a reset operation of, after the signal reading operation is completed, discharging the signal charges stored in the photodiode to the $N^+$-type silicon layer 51 by the application of on-voltage to the gate conductor layers 54a and 54b of the MOS transistor.

In a two-dimensional solid-state imaging device, such pixels illustrated in FIG. 17 are two-dimensionally arranged in a light-sensitive region. The signal reading operation is performed by transmitting pixel signals (signal current) via the $N^+$-type silicon layer 51 to an output circuit disposed around the light-sensitive region. The reset operation is also performed by electric transmission between pixels and the circuit around the light-sensitive region. To increase the number of pixels or the number of images read per unit time in a solid-state imaging device, the speed of performing the signal reading operation needs to be increased. Accordingly, a decrease in the electrical resistance of the $N^+$-type silicon layer 51 functioning as a signal line is required.

To achieve the decrease in the electrical resistance of the $N^+$-type silicon layer 51, as illustrated in FIG. 18A, a structure may be conceived in which a metal layer 59 formed on a silicon substrate 60 is joined to the back surface of the $N^+$-type silicon layer 51. In this structure, the electrical resistance of the signal line is substantially determined by the metal layer 59 and hence the above-described increase in the speed of performing the signal reading operation is achieved. However, it is difficult to form the metal layer 59 joined to the $N^+$-type silicon layer 51 in view of the joining affinity between metal material and silicon material.

The metal layer 59 may be formed on the silicon substrate 60 by the following method. As illustrated in FIG. 18B, a silicon oxide layer 62 is formed on a semiconductor substrate 61. The metal layer 59 is formed on the silicon oxide layer 62. The semiconductor substrate 61 on which the metal layer 59 has been formed is bonded to a semiconductor substrate 64. After that, pixels are formed in portions indicated by dotted lines in the semiconductor substrate 64 in FIG. 18B. The single dot-dashed line D-D' in FIG. 18B indicates a state where the semiconductor substrate 64 is shaped so as to have a predetermined height by subjecting the semiconductor substrate 64 to polishing, etching, or another separation method.

However, since the metal layer 59 and the semiconductor substrate 64 are directly bonded together by this production method, the semiconductor substrates 61 and 64 become warped, cracked, or separated due to the difference in thermal expansion coefficient between the metal layer 59 and the semiconductor substrate 64. It is technically important to develop the method of directly bonding the metal layer 59 to the back surface of the $N^+$-type silicon layer 51 without warping, cracking, or separation as illustrated in FIG. 18A for the purpose of increasing the speed of performing the signal reading operation.

The achievements of a higher degree of integration and higher performances of semiconductor devices other than solid-state imaging devices and circuit elements incorporated in semiconductor devices by overcoming of the problems have been strongly demanded.

To achieve an increase in the speed of performing the signal reading operation, there is an SGT (surrounding gate transistor) (hereafter, simply abbreviated as "SGT") that is a vertical MOS transistor having a structure in which a side surface of a pillar-shaped semiconductor having a pillar-shaped structure is used as a channel region and a gate electrode surrounds the channel region (for example, refer to U.S. Patent Application Publication No. 2010/0213539 (A1)).

In such an SGT, as illustrated in FIG. 19, a planar silicon film 67 is formed on a buried-oxide substrate 66; and the planar silicon film 67 and a pillar-shaped silicon layer 68 form a pillar-shaped structure. In the planar silicon film 67, a $P^+$-type silicon diffusion layer 69 functioning as a drain is formed. A $P^+$-type silicon diffusion layer 70 functioning as a source is formed in an upper portion of the pillar-shaped silicon layer 68. A gate insulating layer 71 is formed on an outer peripheral portion of the pillar-shaped silicon layer 68.

A gate electrode 72 is formed on an outer peripheral portion of the gate insulating layer 71. Thus, a P-type channel SGT in which the pillar-shaped silicon layer 68 between the P+-type silicon diffusion layer 69 and the P+-type silicon diffusion layer 70 serves as a channel is formed.

A silicon nitride (SiN) film 73 and a silicon oxide (SiO$_2$) film 74 are formed so as to surround the gate electrode 72, the P+-type silicon diffusion layer 70, and the P+-type silicon diffusion layer 69. A contact hole 75 is formed in the silicon oxide layer 74. The P+-type silicon diffusion layer 70 is connected to source metal wiring 76 via the contact hole 75. Thus, a P-channel SGT is formed.

The P+-type silicon diffusion layer 69 illustrated in FIG. 19 is connected to metal wiring (not shown) in a predetermined portion that is a coplanar extension of the planar silicon film 67. To further increase the speed of performing the signal reading operation in a semiconductor device including an SGT, the connection between the P+-type silicon diffusion layer 69 and the metal wiring needs to be achieved in a short distance as in the P+-type silicon diffusion layer 70.

However, in the SGT illustrated in FIG. 19, an electrical resistance corresponding to the distance between the metal wiring and the P+-type silicon diffusion layer 69 or the distance to the drain end of the channel of the SGT in the P+-type silicon diffusion layer 69 is present. Accordingly, as in a solid-state imaging device, to increase the speed of performing the signal reading operation in a semiconductor device including an SGT, it is necessary to directly bond a metal layer to the back surface of the P+-type silicon diffusion layer 69 to thereby decrease the electrical resistance.

As described above, the signal reading operation in a two-dimensional solid-state imaging device is performed by transmitting pixel signals (signal current) to an external circuit disposed around the light-sensitive region via the N+-type silicon layer 51 functioning as a signal line. The reset operation is also performed by electric transmission between pixels and the external circuit outside the light-sensitive region. The responsivity of the electric transmission is considerably influenced by the electrical resistance and parasitic capacitance of the wiring connecting the pixels and the peripheral circuit. To increase the number of pixels or the number of images read per unit time in a solid-state imaging device, the electrical resistance of the wiring needs to be decreased.

In a solid-state imaging device illustrated in FIG. 17, the electrical resistance is substantially determined by the electrical resistance of the N+-type silicon layer 51. The N+-type silicon layer 51 is formed by doping a silicon (Si) semiconductor with a donor impurity such as phosphorus (P) or arsenic (As) by ion doping (ion implantation). Accordingly, the electrical resistance of the N+-type silicon layer 51 cannot be made smaller than the electrical resistance of metals that are used in standard semiconductor devices such as aluminum (Al), copper (Cu), tungsten (W), and nickel (Ni). Thus, the solid-state imaging device illustrated in FIG. 17 has a problem that it is inferior in a high-speed operation property to a solid-state imaging device in which the electrical connection between pixels and the peripheral circuit is established via metal wiring.

In a pixel structure in which an N+-type silicon layer is horizontally expanded in pixels and the electrical connection between the pixels and the peripheral circuit is established via metal wiring connected through contact holes formed in the extension regions, the degree of integration of the pixels is decreased.

As described above, in the SGT illustrated in FIG. 19, the P+-type silicon diffusion layer 69 is also connected to metal wiring in an extension portion of the planar silicon film 67. In this manner of connecting the P+-type silicon diffusion layer 69 and the metal wiring, a short-distance connection as in the connection between the P+-type silicon diffusion layer 70 and the metal wiring cannot be formed. Accordingly, an electrical resistance between the metal wiring and an end of the P+-type silicon diffusion layer 69 closest to the channel of the SGT is present. Accordingly, to further increase the operation speed in a semiconductor device including an SGT, the electrical resistance needs to be decreased.

SUMMARY OF THE INVENTION

The present invention has been accomplished under the above-described circumstances. An object of the present invention is to provide a semiconductor device in which a high degree of integration and a high-speed operation are achieved.

To achieve the object, a method for producing a semiconductor device according to a first aspect of the present invention includes a first insulating-layer-forming and removing step of forming a first insulating layer over a predetermined region of a semiconductor substrate and removing the first insulating layer in the predetermined region to form an insulating-layer-removed region or, a second insulating-layer-forming and removing step of removing, in a thickness direction of the semiconductor substrate, a portion of the semiconductor substrate around the predetermined region, and forming a first insulating layer in a semiconductor-substrate-removed region from which the portion of the semiconductor substrate has been removed;

a first-semiconductor-layer-forming step of forming a first semiconductor layer containing a donor impurity or an acceptor impurity on the semiconductor substrate so as to cover at least the predetermined region;

a conductor-layer-forming step of forming a conductor layer on the first semiconductor layer;

a shaping step of shaping the conductor layer and the first semiconductor layer into predetermined shapes;

a second-insulating-layer-forming step of forming a second insulating layer so as to cover the conductor layer and the first semiconductor layer that have been formed into the predetermined shapes;

a planarizing step of planarizing a surface of the second insulating layer;

a bonding step of bonding a substrate to the planarized surface of the second insulating layer;

a thinning step of thinning the semiconductor substrate to a predetermined thickness;

a pillar-shaped-semiconductor-forming step of forming, from the semiconductor substrate, a pillar-shaped semiconductor having a pillar-shaped structure on the first semiconductor layer; and a circuit-element-forming step of forming a circuit element in the pillar-shaped semiconductor, the method further including, at least after the first-semiconductor-layer-forming step, a first-semiconductor-region-forming step of forming a first semiconductor region in the pillar-shaped semiconductor through diffusion of the impurity from the first semiconductor layer containing the donor impurity or the acceptor impurity.

The circuit-element-forming step preferably includes
a step of forming a third insulating layer in an outer peripheral portion of the pillar-shaped semiconductor;
a step of forming a gate conductor layer on an outer peripheral portion of the third insulating layer;

a step of forming a fourth semiconductor region in a surface portion of the pillar-shaped semiconductor, the surface portion being located above the gate conductor layer, the fourth semiconductor region being of the same conductivity type as a conductivity type of the first semiconductor region; and a step of forming a third semiconductor region in the pillar-shaped semiconductor and above the third insulating layer, the third semiconductor region being of a conductivity type opposite to the conductivity type of the first semiconductor region.

The circuit-element-forming step preferably includes a step of forming a third insulating layer in an outer peripheral portion of the pillar-shaped semiconductor and farming a gate conductor layer on an outer peripheral portion of the third insulating layer; and a step of forming a fifth semiconductor region in the pillar-shaped semiconductor and above the third insulating layer, the fifth semiconductor region being of the same conductivity type as a conductivity type of the first semiconductor region.

The circuit-element-forming step preferably includes a step of forming a sixth semiconductor region in an upper portion of the pillar-shaped semiconductor, the sixth semiconductor region being of a conductivity type opposite to a conductivity type of the first semiconductor region.

The first-semiconductor-layer-forming step preferably includes a step of forming a second semiconductor layer that functions as an electrical resistor in the same layer as the first semiconductor layer.

The first-semiconductor-layer-forming step preferably includes a step of forming an insulating film that functions as a capacitor insulating film in a predetermined region on the first semiconductor layer that functions as a capacitor electrode, and the conductor-layer-forming step preferably includes a step of forming the conductor layer on the insulating film, the conductor layer functioning as a capacitor electrode together with the first semiconductor layer.

The first insulating-layer-forming step preferably includes a step of forming the first insulating layer and a fourth insulating layer on the semiconductor substrate and forming a fifth insulating layer that is thinner than the fourth insulating layer and functions as a capacitor insulating film in a predetermined capacitor-forming region;

the conductor-layer-forming step preferably includes a step of forming the conductor layer on the fifth insulating layer, the conductor layer functioning as a capacitor electrode; and the first or second insulating-layer-forming and removing step preferably includes a capacitor-forming step of forming, in the capacitor-forming region, an impurity layer that contains a donor impurity or an acceptor impurity and functions as a capacitor electrode.

The method preferably further includes a mask-alignment-mark-forming-region-defining step of defining a mask-alignment-mark-forming region on the semiconductor substrate;

a step of forming a mask alignment hole in the mask-alignment-mark-forming region such that at least one of the insulating-layer-removed region, the first insulating layer, and the conductor layer is exposed;

a mask-alignment-mark-forming step of forming a mask alignment mark through the mask alignment hole, the mask alignment mark being constituted by at least one of the insulating-layer-removed region, the first insulating layer, and the conductor layer; and a mask alignment step of conducting mask alignment of a photomask with reference to the mask alignment mark.

The method preferably further includes a step of filling the mask alignment hole with a transparent insulator, wherein, in the mask-alignment-mark-forming step, the mask alignment mark is preferably formed through the transparent insulator, the mask alignment mark being constituted by at least one of the insulating-layer-removed region, the first insulating layer, and the conductor layer; and in the mask alignment step, the mask alignment of the photomask is preferably conducted with reference to the mask alignment mark.

The method preferably further includes, between the first or second insulating-layer-forming and removing step and the first-semiconductor-layer-forming step, a step of forming a second semiconductor layer that is not doped with donor impurities or acceptor impurities so as to cover the insulating-layer-removed region.

The second insulating-layer-forming and removing step preferably includes a semiconductor-substrate etching step of etching the portion of the semiconductor substrate around the region in which the pillar-shaped semiconductor is to be formed, a step of forming the first insulating layer in the region formed by the etching on the semiconductor substrate, and a step of forming the first semiconductor layer on a portion of the semiconductor substrate having been exposed by the etching and on the first insulating layer positioned around the exposed portion of the semiconductor substrate.

The second insulating-layer-forming and removing step preferably includes a step of forming a local oxidation layer serving as the first insulating layer by selectively oxidizing the portion of the semiconductor substrate around the region in which the pillar-shaped semiconductor is to be formed.

The method preferably further includes a step of forming two or more regions of the first insulating layer that are separated from each other in the region in which the pillar-shaped semiconductor is to be formed, on the semiconductor substrate; and a step of forming, on an exposed surface portion of the semiconductor substrate that is surrounded by the regions of the first insulating layer that are separated from each other, a plurality of the first semiconductor layers that are separated from each other and are doped with a donor and an acceptor, and the conductor layer connected to the first semiconductor layers.

A semiconductor device according to a second aspect of the present invention is a semiconductor device produced by the method for producing a semiconductor device according to the first aspect of the present invention, wherein the pillar-shaped semiconductor includes a second semiconductor region that is formed on the first semiconductor region and is composed of a semiconductor of a conductivity type opposite to the conductivity type of the first semiconductor region or an intrinsic semiconductor, a diode is formed that stores signal charges generated from the second semiconductor region and the fourth semiconductor region by irradiation with electromagnetic energy waves, a junction field-effect transistor is formed in which the diode functions as a gate, one of the first semiconductor region and the third semiconductor region functions as a source and the other functions as a drain, and a current that flows through a channel formed in the second semiconductor region and varies in accordance with an amount of the signal charges stored in the diode can be extracted with a signal extraction unit, and a MOS transistor in which the gate conductor layer functions as a gate and one of the first semiconductor region and the fourth semiconductor region functions as a source and the other functions as a drain, forms a signal-charge discharging unit that discharges the signal charges stored in the diode to the first semiconductor region upon application of a voltage to the gate conductor layer.

A semiconductor device according to a third aspect of the present invention is a semiconductor device produced by the method for producing a semiconductor device according to the first aspect of the present invention, wherein the pillar-shaped semiconductor includes a second semiconductor region that is formed on the first semiconductor region and is composed of a semiconductor of a conductivity type opposite to the conductivity type of the first semiconductor region or an intrinsic semiconductor, and a MOS transistor in which the gate conductor layer functions as a gate and one of the first semiconductor region and the fifth semiconductor region functions as a source and the other functions as a drain is formed.

A semiconductor device according to a fourth aspect of the present invention is a semiconductor device produced by the method for producing a semiconductor device according to the first aspect of the present invention, wherein the pillar-shaped semiconductor includes a second semiconductor region that is formed between the first semiconductor region and the sixth semiconductor region, the second semiconductor region being composed of a semiconductor of a conductivity type opposite to the conductivity type of the first semiconductor region or an intrinsic semiconductor, and the second semiconductor region and the sixth semiconductor region form a diode.

A semiconductor device according to a fifth aspect of the present invention is a semiconductor device produced by the method for producing a semiconductor device according to the first aspect of the present invention, wherein a plurality of the pillar-shaped semiconductors are formed on the first semiconductor layer, and the plurality of the pillar-shaped semiconductors include a plurality of first pillar-shaped semiconductors in which the first semiconductor region is doped with an acceptor impurity and a plurality of second pillar-shaped semiconductors in which the first semiconductor region is doped with a donor impurity.

A semiconductor device according to a sixth aspect of the present invention is a semiconductor device produced by the method for producing a semiconductor device according to the first aspect of the present invention, wherein a plurality of the pillar-shaped semiconductors are formed on the first semiconductor layer, and in the plurality of the pillar-shaped semiconductors, a plurality of the first semiconductor regions are connected to one another and/or a plurality of the conductor layers are connected to one another.

A semiconductor device according to a seventh aspect of the present invention is a semiconductor device produced by the method for producing a semiconductor device according to the first aspect of the present invention, wherein a plurality of the pillar-shaped semiconductors are formed on the first semiconductor layer, each of the pillar-shaped semiconductors includes a second semiconductor region that is formed on the first semiconductor region and is composed of a semiconductor of a conductivity type opposite to the conductivity type of the first semiconductor region or an intrinsic semiconductor, the fifth semiconductor region formed on the second semiconductor region, the third insulating layer formed on an outer peripheral portion of the second semiconductor region, and the gate conductor layer formed on the outer peripheral portion of the third insulating layer, and a MOS transistor is formed in which the gate conductor layer functions as a gate and one of the first semiconductor region and the fifth semiconductor region functions as a source and the other functions as a drain, and the first semiconductor layer is formed so as to continuously extend along the plurality of the pillar-shaped semiconductors and the first semiconductor layer formed so as to extend is connected through a contact hole formed in an insulating layer to a wiring layer for establishing a connection with an external circuit.

A semiconductor device according to an eighth aspect of the present invention is a semiconductor device produced by the method for producing a semiconductor device according to the first aspect of the present invention, wherein a plurality of the pillar-shaped semiconductors are formed on the first semiconductor layer, each of the pillar-shaped semiconductors includes a second semiconductor region that is formed on the first semiconductor region and is composed of a semiconductor of a conductivity type opposite to the conductivity type of the first semiconductor region or an intrinsic semiconductor, the fifth semiconductor region formed on the second semiconductor region, the third insulating layer formed on an outer peripheral portion of the second semiconductor region, and the gate conductor layer formed on the outer peripheral portion of the third insulating layer, a MOS transistor is formed in which the gate conductor layer functions as a gate and one of the first semiconductor region and the fifth semiconductor region functions as a source and the other functions as a drain, and the first semiconductor layer is formed so as to continuously extend along the plurality of the pillar-shaped semiconductors and the first semiconductor layer is connected through a contact hole formed in an insulating layer to a wiring layer for establishing a connection with a gate of a predetermined transistor.

The present invention can provide a semiconductor device in which a high degree of integration and a high speed operation are achieved.

BRIEF DESCRIPTION OF THE DRAWINGS

FIG. 1A is a sectional view for illustrating a method for producing a solid-state imaging device according to a first embodiment of the present invention.

FIG. 1B is a sectional view for illustrating a method for producing a solid-state imaging device according to the first embodiment.

FIG. 1C is a sectional view for illustrating a method for producing a solid-state imaging device according to the first embodiment.

FIG. 1D is a sectional view for illustrating a method for producing a solid-state imaging device according to the first embodiment.

FIG. 10C is a sectional view for illustrating a method for forming a two-stage CMOS inverter circuit according to the tenth embodiment.

DETAILED DESCRIPTION OF THE PREFERRED EMBODIMENTS

Figure 1E:
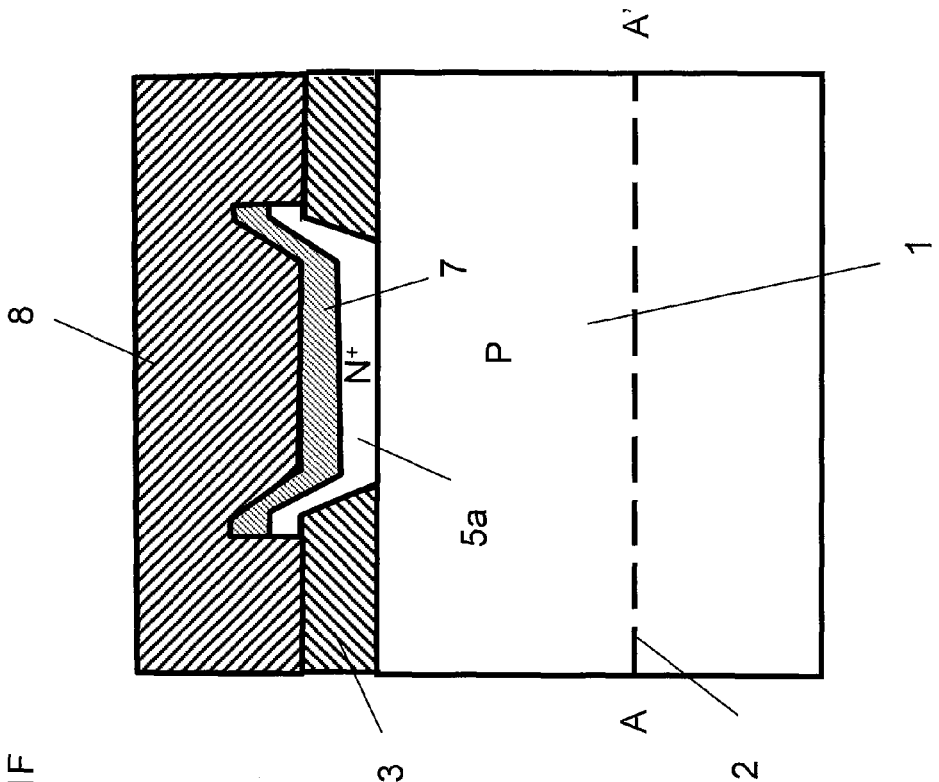
FIG. 1E is a sectional view for illustrating a method for producing a solid-state imaging device according to the first embodiment.

Hereinafter, methods for producing semiconductor devices according to embodiments of the present invention will be described with reference to FIGS. 1A to 16C.

First Embodiment

FIGS. 1A to 1L illustrate a method for producing a solid-state imaging device according to a first embodiment of the present invention.

In the method for producing a solid-state imaging device according to this embodiment, as illustrated in FIG. 1A, a division layer 2 for dividing a first semiconductor substrate 1 into two portions of an upper portion and a lower portion is formed by doping the first semiconductor substrate 1 composed of P-type silicon with protons ($H^+$) at a high concentration to a predetermined depth of the first semiconductor substrate 1 (refer to M. Bruel: "Silicon on Insulator material technology", Electronics Letters Vol. 31, No. 14, pp. 1201-1202 (6 Jul., 1995)). A first silicon oxide layer 3, which is an insulating film, is formed on the first semiconductor substrate 1 by thermal oxidation or a CVD (chemical vapor deposition) process. Instead of the P-type silicon, the first semiconductor substrate 1 may be composed of an intrinsic semiconductor (i-type silicon) that substantially contains no impurities.

As illustrated in FIG. 1B, silicon oxide ($SiO_2$) in a region of the first silicon oxide layer 3 where a drain for a signal line of the solid-state imaging device is to be formed is subsequently removed to thereby form a hole 4 serving as a silicon-oxide-layer-removed region 48 (refer to FIGS. 11A and 13A).

As illustrated in FIG. 1B, a polycrystalline silicon layer 5 is subsequently formed on the first silicon oxide layer 3 and the first semiconductor substrate 1 so as to cover the hole 4 by a CVD process.

As illustrated in FIG. 1C, the polycrystalline silicon layer 5 is subsequently doped with ions of a donor impurity such as phosphorus (P) or arsenic (As) to thereby form an $N^+$ polycrystalline silicon layer 5a serving as a signal line of the solid-state imaging device, on the first semiconductor substrate 1 and the first silicon oxide layer 3.

As illustrated in FIG. 1D, a metal layer 7 constituted by a monolayer composed of tungsten (W), tungsten silicide (WSi), nickel (Ni), nickel silicide (NiSi) or the like, or by a stack of a plurality of such layers, is subsequently formed on the $N^+$ polycrystalline silicon layer 5a by a deposition process or a CVD process.

As illustrated in FIG. 1E, the $N^+$ polycrystalline silicon layer 5a and the metal layer 7 are subsequently shaped into predetermined shapes by etching through a mask such that the portions of the $N^+$ polycrystalline silicon layer 5a and the metal layer 7 filling the hole 4 are left. A source or drain of a junction field-effect transistor in a pixel of the solid-state imaging device is formed on the $N^+$ polycrystalline silicon layer 5a.

Figure 1F:
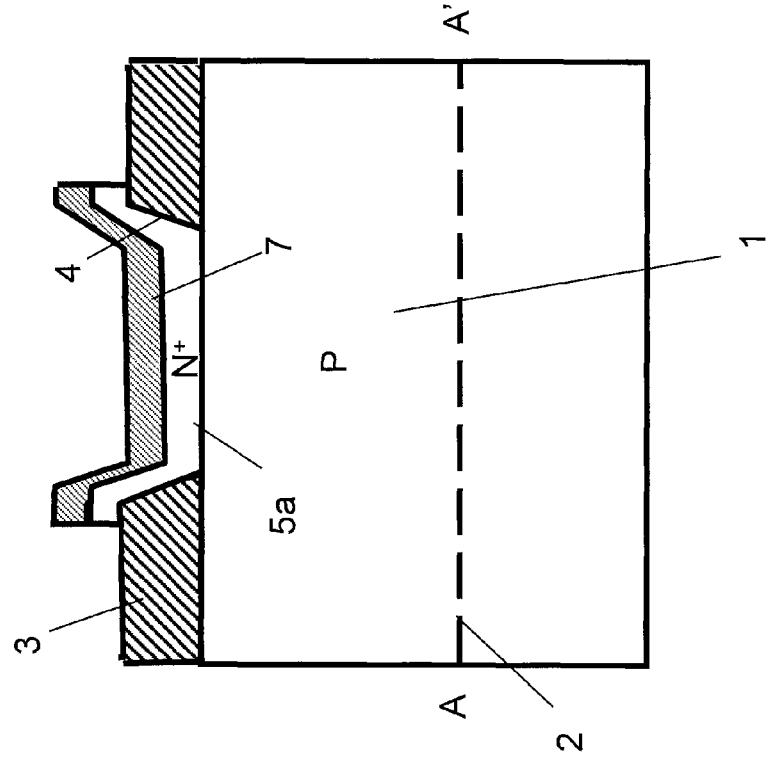
FIG. 1F is a sectional view for illustrating a method for producing a solid-state imaging device according to the first embodiment.

As illustrated in FIG. 1F, a second silicon oxide layer 8, which is an insulating film, is subsequently formed by a CVD process so as to cover the $N^+$ polycrystalline silicon layer 5a, the metal layer 7, and the first silicon oxide layer 3. The surface of the second silicon oxide layer 8 is planarized by CMP (chemical mechanical polishing).

Figure 1H:
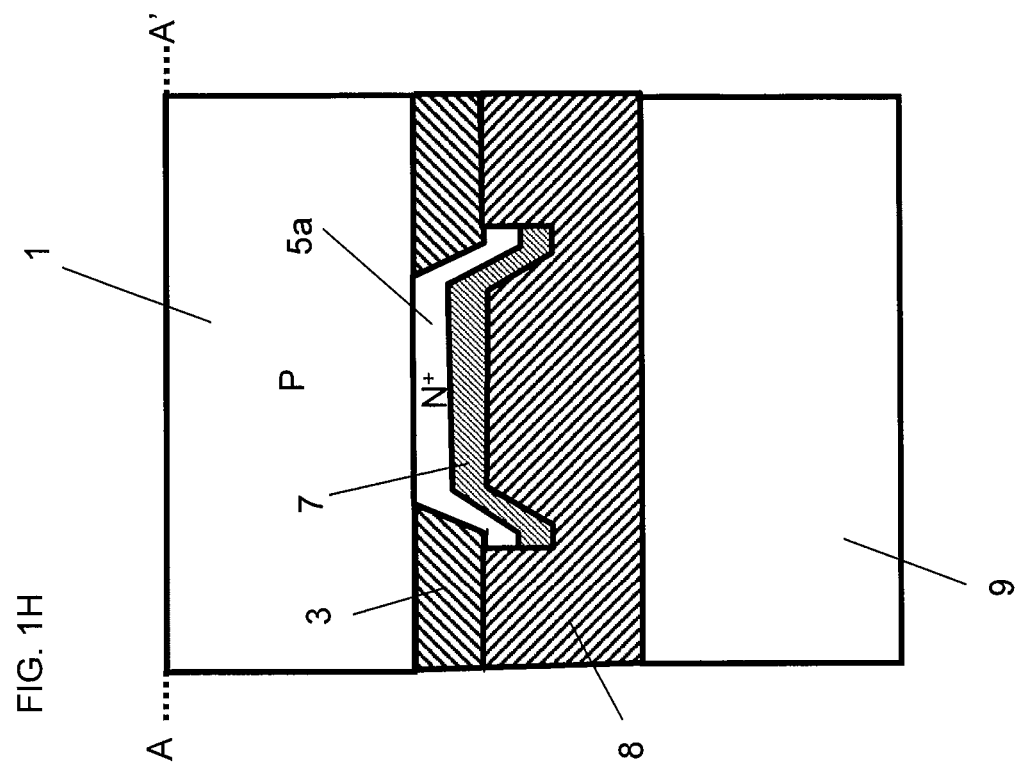
FIG. 1H is a sectional view for illustrating a method for producing a solid-state imaging device according to the first embodiment.
Figure 1G:
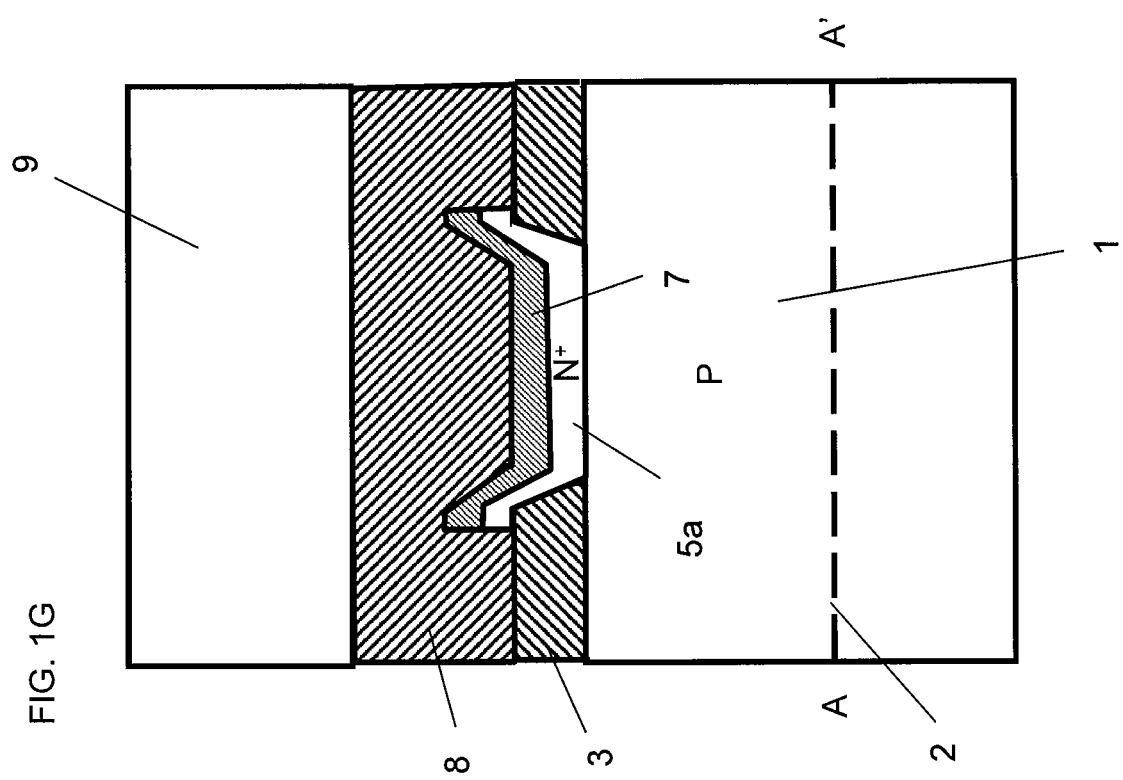
FIG. 1G is a sectional view for illustrating a method for producing a solid-state imaging device according to the first embodiment.

As illustrated in FIG. 1G, a second semiconductor substrate 9 that is composed of silicon (Si) and has a planarized surface is subsequently prepared. The planarized surface of the second semiconductor substrate 9 and the planarized surface of the second silicon oxide layer 8 are bonded together under pressure. In this bonding process, since the silicon layer of the second semiconductor substrate 9 and the silicon layer of the second silicon oxide layer 8 that only slightly differ from each other in thermal expansion coefficient are bonded together, a stack structure that is less likely to become warped, cracked, or separated due to the difference in thermal expansion coefficient between the bonded members is obtained.

As illustrated in FIG. 1H, the lower portion of the first semiconductor substrate 1 with respect to the division layer 2 serving as a boundary is subsequently removed by a heat treatment at 400° C. to 600° C. to thereby thin the first semiconductor substrate 1 to a predetermined thickness (in FIG. 1H, the drawing is turned upside down with respect to FIGS. 1A to 1G.). The $N^+$ polycrystalline silicon layer 5a corresponds to the $N^+$-type silicon layer 51 illustrated in FIG. 14. In the embodiment, the metal layer 7 is bonded to the $N^+$ polycrystalline silicon layer 5a over the entire region where the $N^+$ polycrystalline silicon layer 5a is formed.

Figure 1J:
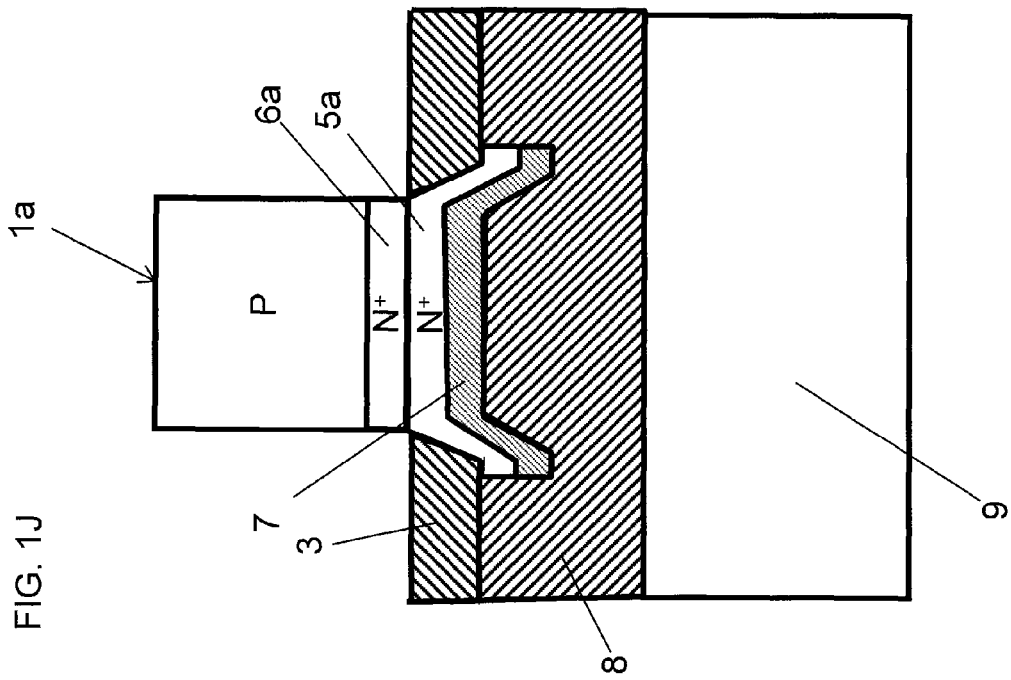
FIG. 1J is a sectional view for illustrating a method for producing a solid-state imaging device according to the first embodiment.
Figure 1I:
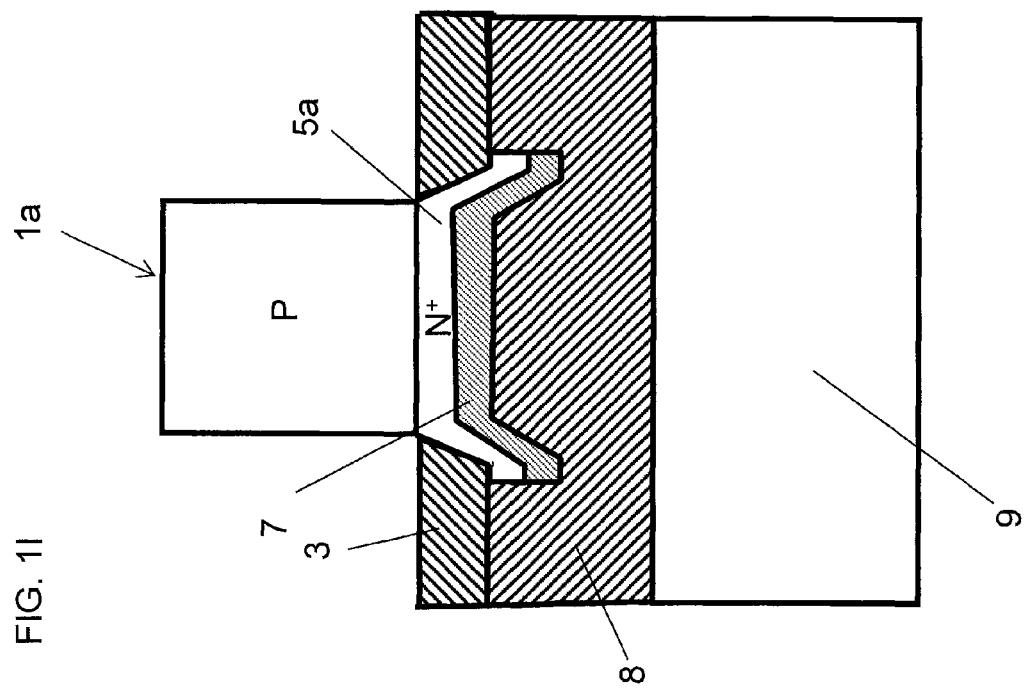
FIG. 1I is a sectional view for illustrating a method for producing a solid-state imaging device according to the first embodiment.

As illustrated in FIG. 1I, the silicon layer of the first semiconductor substrate 1 is subsequently removed by etching except for a portion thereof in a region directly above the $N^+$ polycrystalline silicon layer 5a such that the portion in the region is left. As a result, a silicon (Si) pillar 1a having a pillar-shaped structure is formed. The silicon pillar 1a is to serve as a P-type silicon layer 30 illustrated in FIGS. 1K, 1L, and the like.

As illustrated in FIG. 1J, a heat treatment is subsequently performed so that the donor impurity is thermally diffused from the $N^+$ polycrystalline silicon layer 5a to the silicon pillar 1a. Thus, an $N^+$ diffusion layer 6a is formed in a lower portion of the silicon pillar 1a.

Figure 1K:
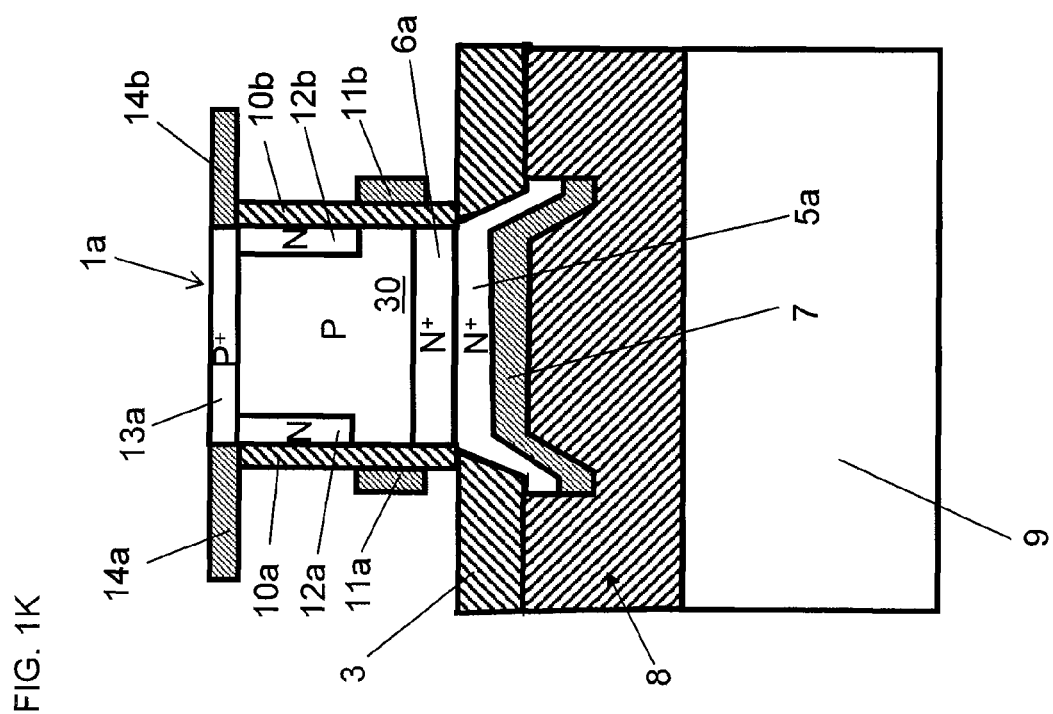
FIG. 1K is a sectional view for illustrating a method for producing a solid-state imaging device according to the first embodiment.

As illustrated in FIG. 1K, thermal oxidation is subsequently performed so that third silicon oxide layers 10a and 10b, which are insulators, are formed in the outer peripheral portion of the silicon pillar 1a. Gate conductor layers 11a and 11b are further formed on the outer peripheral portions of the third silicon oxide layers 10a and 10b by a deposition process or a CVD process.

As illustrated in FIG. 1K, surface portions of the silicon pillar 1a above the gate conductor layers 11a and 11b are subsequently doped with ions of a donor impurity such as phosphorus (P) or arsenic (As) to thereby form N-type silicon layers 12a and 12b. These N-type silicon layers 12a and 12b and the P-type silicon layer 30 of the silicon pillar 1a form a photodiode that is a signal-charge storing unit for storing signal charges (in this case, electrons) according to incident light. Signal charges are stored in the silicon pillar 1a (P-type silicon layer 30) between the $N^+$ diffusion layer 6a and a $P^+$-type silicon layer 13a.

As illustrated in FIG. 1K, a portion of the silicon pillar 1a above the third silicon oxide layers 10a and 10b is subsequently doped with ions of an acceptor impurity such as boron (B) to thereby form the $P^+$-type silicon layer 13a. This $P^+$-type silicon layer 13a is electrically connected to pixel selection metal wirings 14a and 14b.

Figure 1L:
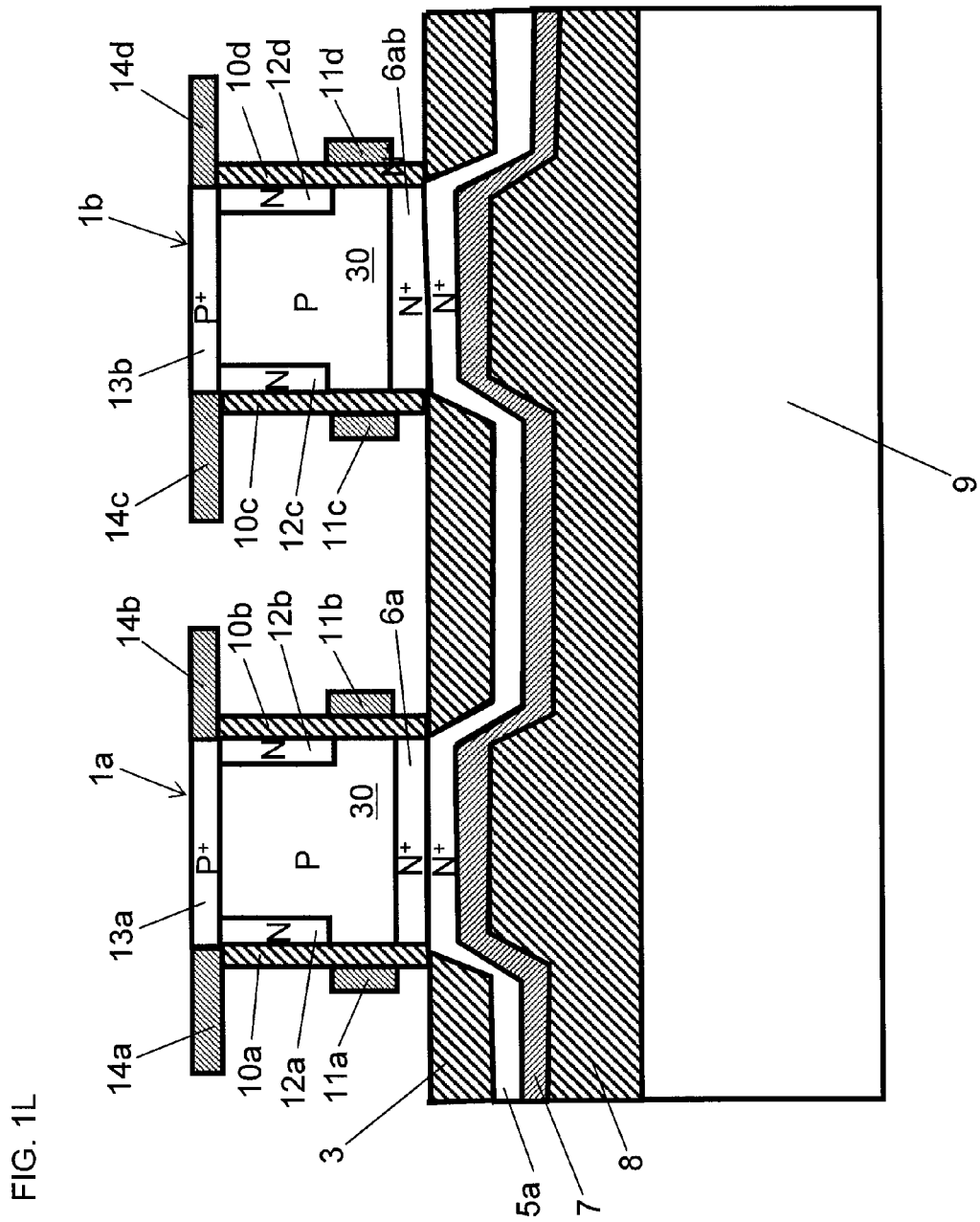
FIG. 1L is a sectional view for illustrating a method for producing a solid-state imaging device according to the first embodiment.

As illustrated in FIG. 1L, third silicon oxide layers 10c and 10d, which are insulators, are formed in the outer peripheral portions of a silicon pillar 1b, which is adjacent to the silicon pillar 1a constituting a pixel of the solid-state imaging device and constitutes another pixel, by thermal oxidation. The silicon pillar 1b is formed by the steps illustrated in FIGS. 1A to 1K as with the silicon pillar 1a.

As illustrated in FIG. 1L, gate conductor layers 11c and 11d are subsequently formed on the outer peripheral portions of the third silicon oxide layers 10c and 10d by a deposition process or a CVD process.

As illustrated in FIG. 1L, surface portions of the silicon pillar 1*b* above the gate conductor layers 11*c* and 11*d* are subsequently doped with ions of a donor impurity such as phosphorus (P) or arsenic (As) to thereby form N-type silicon layers 12*c* and 12*d*. These N-type silicon layers 12*c* and 12*d* and the silicon pillar 1*b* form a photodiode that is a signal-charge storing unit for storing signal charges (in this case, electrons) according to incident light. Signal charges are stored in the silicon pillar 1*b* (P-type silicon layer 30) between an N$^+$ diffusion layer 6*ab* and a P$^+$-type silicon layer 13*b*.

As illustrated in FIG. 1L, in the silicon pillar 1*b*, a portion of the silicon pillar 1*b* above the third silicon oxide layers 10*c* and 10*d* is subsequently doped with ions of an acceptor impurity such as boron (B) to thereby form the P$^+$-type silicon layer 13*b*.

These P$^+$-type silicon layers 13*a* and 13*b* are electrically connected to pixel selection metal wirings 14*c* and 14*d*. The plurality of pixels in the solid-state imaging device are thus formed by the above-described steps.

In the embodiment, the N$^+$ diffusion layer 6*a* in the silicon pillar 1*a* is formed in the step illustrated in FIG. 1J by thermally diffusing a donor impurity from the N$^+$ polycrystalline silicon layer 5*a* to the silicon pillar 1*a* by a heat treatment. This is not limitative and the N$^+$ diffusion layer 6*a* may be formed by diffusing a donor impurity from the N$^+$ polycrystalline silicon layer 5*a* to the first semiconductor substrate 1 by a heat treatment performed in a desired stage after the N$^+$ polycrystalline silicon layer 5*a* is formed as illustrated in FIG. 1C. That is, after the step of forming the N$^+$ polycrystalline silicon layer 5*a* illustrated in FIG. 1C, the N$^+$ diffusion layer 6*a* may be formed in the silicon pillar 1*a* by diffusing a donor impurity from the N$^+$ polycrystalline silicon layer 5*a* containing the impurity to the silicon pillar 1*a*. For example, the N$^+$ diffusion layer 6*a* may be formed in the stage illustrated in FIG. 1K after the silicon pillar 1*a* (P-type silicon layer 30) is formed. The heat treatment for forming the N$^+$ diffusion layer 6*a* may be performed as a single heat treatment or heat treatments separately performed.

The solid-state imaging device according to the embodiment is formed by the steps illustrated in FIGS. 1A to 1L. Pixels of the solid-state imaging device are also formed in the silicon pillars 1*a* and 1*b*.

In the embodiment, referring to FIG. 1L, the N$^+$ polycrystalline silicon layer 5*a* and the metal layer 7, which are formed under the silicon pillars 1*a* and 1*b* and bonded together, constitute a signal line of the solid-state imaging device and electrically connect the N$^+$ diffusion layers 6*a* and 6*ab* in the two silicon pillars 1*a* and 1*b* to each other. Thus, the electrical resistance of the signal line constituted by the N$^+$ polycrystalline silicon layer 5*a* and the metal layer 7 is decreased and the solid-state imaging device can be operated at a high speed.

In the embodiment, junction field-effect transistors are formed in the silicon pillars 1*a* and 1*b*. In these junction field-effect transistors, photodiodes constituted by the N-type silicon layers 12*a* and 12*b* (12*c* and 12*d*) and the P-type silicon layer 30 function as gates, the P$^+$-type silicon layers 13*a* and 13*b* function as drains, and the N$^+$ diffusion layers 6*a* and 6*ab* function as sources. The channels of the junction field-effect transistors are formed in the silicon pillars 1*a* and 1*b*.

In the embodiment, an external circuit (not shown) is provided as a signal extraction unit for extracting, as electrical signals, a current that is made to flow by junction field-effect transistors through the channels of the silicon pillars 1*a* and 1*b* and varies in accordance with the amount of signal charges stored in the photodiodes.

In the silicon pillars 1*a* and 1*b* illustrated in FIG. 1L, MOS transistors are formed as a signal-charge discharging unit for discharging signal charges stored by the photodiodes, to the N$^+$ diffusion layers 6*a* and 6*ab*.

In the MOS transistors, the gate conductor layers 11*a*, 11*b*, 11*c*, and 11*d* formed on the outer peripheral surfaces of the third silicon oxide layers 10*a*, 10*b*, 10*c*, and 10*d* so as to surround the silicon pillars 1*a* and 1*b* function as gates, the N$^+$ diffusion layers 6*a* and 6*ab* function as drains, and the N-type silicon layers 12*a*, 12*b*, 12*c*, and 12*d* function as sources. The channels of the MOS transistors are formed in the P-type silicon layers 30.

In the embodiment, as illustrated in FIG. 1G, the planarized surface of the silicon layer of the second semiconductor substrate 9 and the planarized surface of the second silicon oxide layer 8 on the first semiconductor substrate 1 are bonded together. In the embodiment, the first semiconductor substrate 1 (the second silicon oxide layer 8) and the second semiconductor substrate 9 are thus bonded together between the Si (silicon) surface and the SiO$_2$ (silicon oxide) surface that have a high affinity for bonding to each other, over the entire surfaces of the first semiconductor substrate 1 and the second semiconductor substrate 9. Accordingly, a stack structure that is less likely to become warped, cracked, or separated is obtained.

In the embodiment, the N$^+$ polycrystalline silicon layer 5*a* constituting the signal line in pixels of the solid-state imaging device is bonded to the metal layer 7. The N$^+$ polycrystalline silicon layer 5*a* and the metal layer 7 may be turned into silicide layers through a reaction between the N$^+$ polycrystalline silicon layer 5*a* and the metal layer 7 by a heat treatment performed in a step up to FIG. 1K or an additional heat treatment. In any of such cases, the N$^+$ polycrystalline silicon layer 5*a* and the metal layer 7 or the silicide layers are made to have a low electrical resistance. Accordingly, the electrical resistance between the pixels and the peripheral circuit of the pixels can be decreased. As a result, even when the number of pixels is increased or the number of images read per unit time is increased, a high-speed operation of the solid-state imaging device can be performed, compared with solid-state imaging devices of conventional examples.

In the embodiment, referring to FIG. 1K, both of the PN junction (photodiode) constituted by the P-type silicon layer 30 and the N-type silicon layers 12*a* and 12*b* and the PN junction constituted by the P-type silicon layer 30 and the N$^+$ diffusion layer 6*a* are formed in the silicon pillar 1*a* composed of single crystal silicon. Since the PN junctions are thus formed in single crystal silicon, pixels of the solid-state imaging device have a low leak current.

In the embodiment, light coming from above the silicon pillars 1*a* and 1*b* (refer to FIG. 1L) constituting pixels reaches the silicon pillar 1*a* serving as a photoelectric conversion region and is reflected by the metal layer 7. Accordingly, the length of the optical path in the silicon pillar 1*a* increases and the sensitivity of the solid-state imaging device is enhanced. In the embodiment, even when the silicon pillars 1*a* and 1*b* are made to have a small height, the same sensitivity as in conventional examples can be obtained. Accordingly, the advantage that the solid-state imaging device having the same sensitivity as in conventional examples can be easily produced is also provided.

In the embodiment, as illustrated in FIG. 1B, the polycrystalline silicon layer 5 that is to serve as the N$^+$ polycrystalline silicon layer 5*a* is formed by a CVD process on the first silicon oxide layer 3 and the first semiconductor substrate 1 so as to fill (cover) the hole 4. Instead of forming the polycrystalline silicon layer 5 by the CVD process, a single crystal silicon layer may be formed by epitaxial growth. When the epitaxial growth is employed, the single crystal silicon layer can also be formed on the first silicon oxide layer 3. Accordingly, the solid-state imaging device can be subsequently formed in the same manner as in the steps illustrated in FIGS. 1C to 1K.

In FIG. 1H, the lower portion of the first semiconductor substrate 1 with respect to the division layer 2 serving as a boundary is removed by a heat treatment at 400° C. to 600° C. to thereby thin the first semiconductor substrate 1 to a predetermined thickness. This is not limitative and the first semiconductor substrate 1 may be thinned by subjecting the first semiconductor substrate 1 constituted by a $P^+$-type substrate and a P-type silicon layer formed on the $P^+$-type substrate by epitaxial growth, to etching and CMP.

Second Embodiment

Hereinafter, a method for producing a semiconductor device including an SGT (surrounding gate transistor) according to a second embodiment of the present invention will be described with reference to FIG. 2.

In this embodiment, in the steps illustrated in FIGS. 1A to 1J out of the steps of the first embodiment illustrated in FIGS. 1A to 1L, the $N^+$ polycrystalline silicon layer 5a constituting the signal line in FIG. 1J is replaced by an $N^+$ polycrystalline silicon layer 55a that functions as a drain in an SGT. As in the first embodiment (refer to FIG. 1J), the metal layer 7 is bonded to the $N^+$ polycrystalline silicon layer 55a; the $N^+$ diffusion layer 6a is formed in the silicon pillar 1a by thermal diffusion of a donor impurity from the $N^+$ polycrystalline silicon layer 55a.

Figure 2:
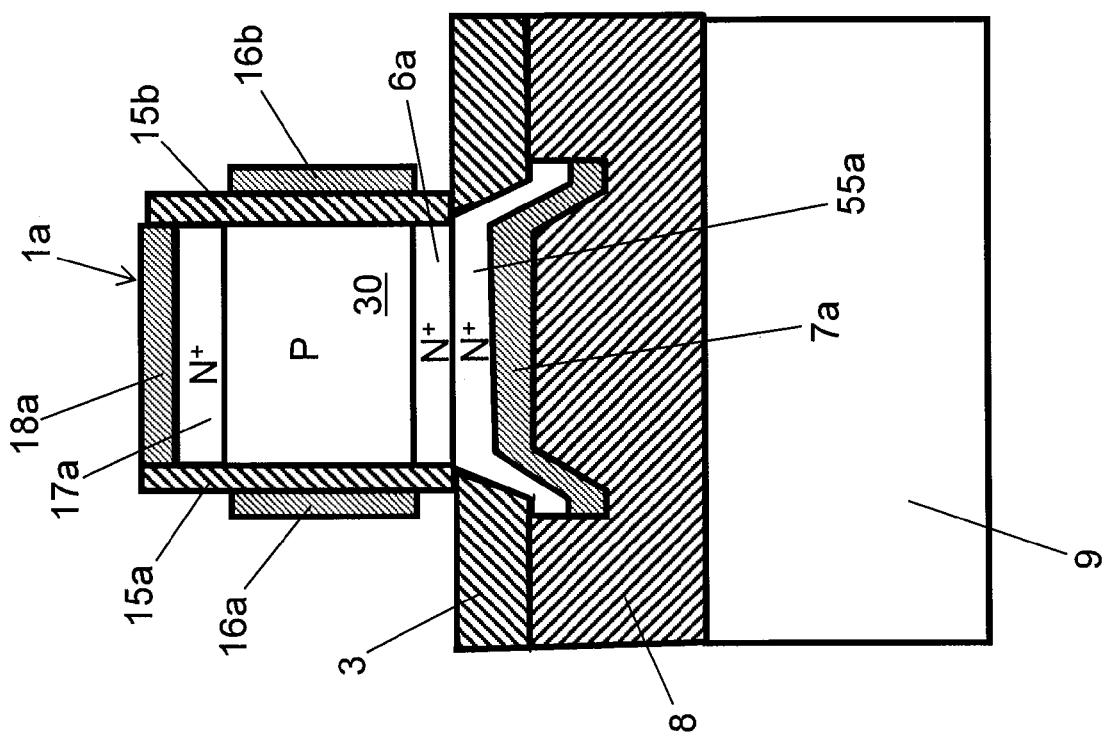
FIG. 2 is a sectional view illustrating the structure of an N-channel SGT according to a second embodiment of the present invention.

In the embodiment, the step in FIG. 1J is followed by a step illustrated in FIG. 2. In this step, gate insulating layers 15a and 15b are formed in outer peripheral portions of the silicon pillar 1a by an oxidation process or a CVD process, and gate conductor layers 16a and 16b that function as gates of the SGT are formed on outer peripheral portions of the gate insulating layers 15a and 15b.

A portion of the silicon pillar 1a above the gate conductor layers 16a and 16b is subsequently doped with ions of a donor impurity such as phosphorus (P) or arsenic (As) to thereby form an $N^+$-type silicon layer 17a functioning as a source of the SGT.

A metal wiring layer 18a is subsequently formed on the $N^+$-type silicon layer 17a by a deposition process and pattern etching.

Thus, an N-channel SGT is formed on the second semiconductor substrate 9. The $N^+$ diffusion layer 6a and the $N^+$ polycrystalline silicon layer 55a function as a source or a drain in the N-channel SGT.

In the embodiment, in the SGT (N-channel SGT), the metal layer 7 is bonded to the entire back surface of the $N^+$ polycrystalline silicon layer 55a that functions as a drain. In this configuration, the electrical resistance from the metal layer 7 to the $N^+$ diffusion layer 6a is decreased and hence an SGT that can be operated at a high speed can be obtained.

Third Embodiment

Hereinafter, a method for producing a semiconductor device including SGTs according to a third embodiment of the present invention will be described with reference to FIGS. 3A and 3B. In this embodiment, an N-channel SGT and a P-channel SGT are formed on the same semiconductor substrate. The steps for producing the semiconductor device in the embodiment and a modification of the embodiment are the same as in the first embodiment unless otherwise specified below.

Figure 3A:
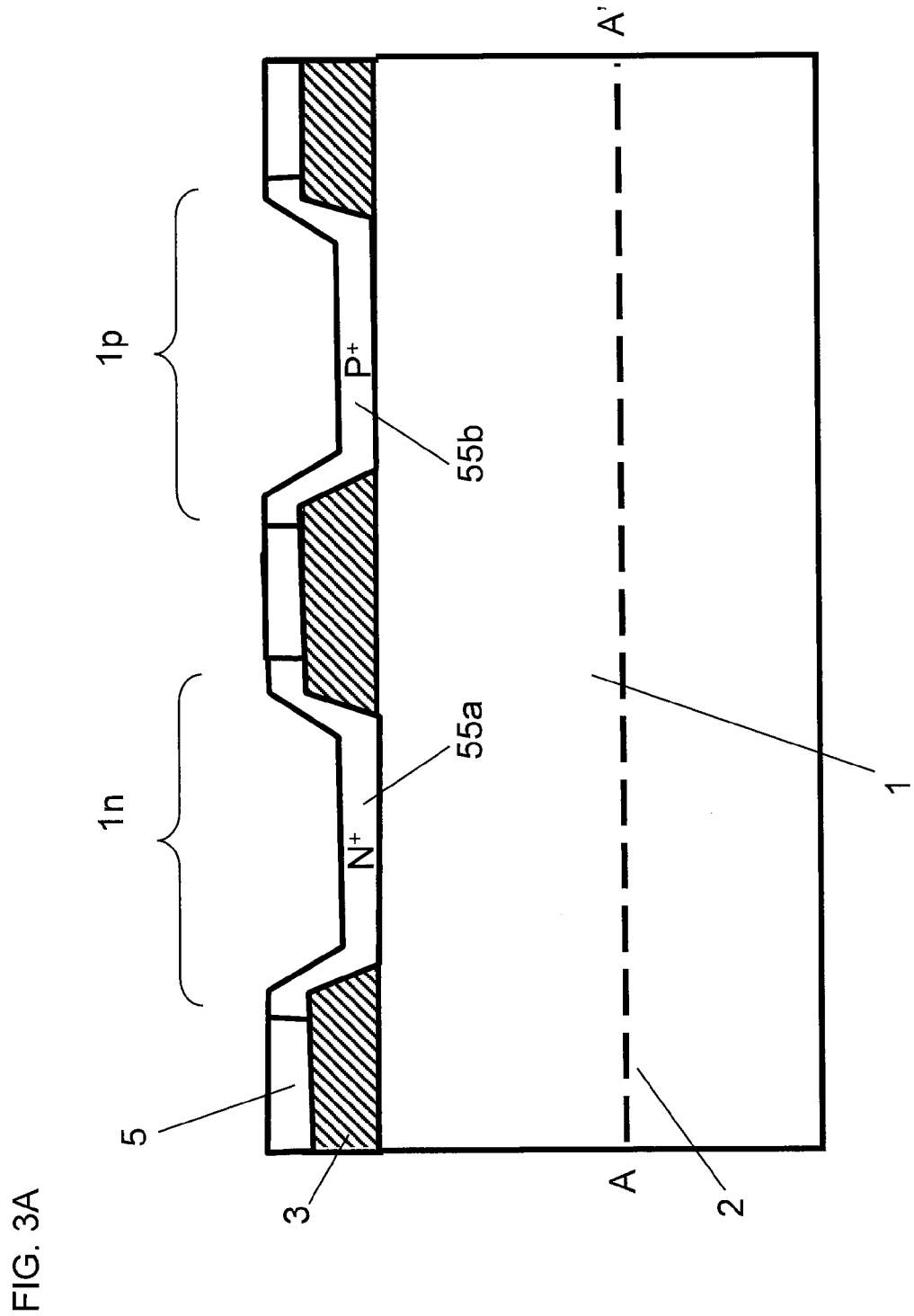
FIG. 3A is a sectional view for illustrating a method for forming an N-channel SGT and a P-channel SGT on the same substrate according to a third embodiment of the present invention.
Figure 3B:
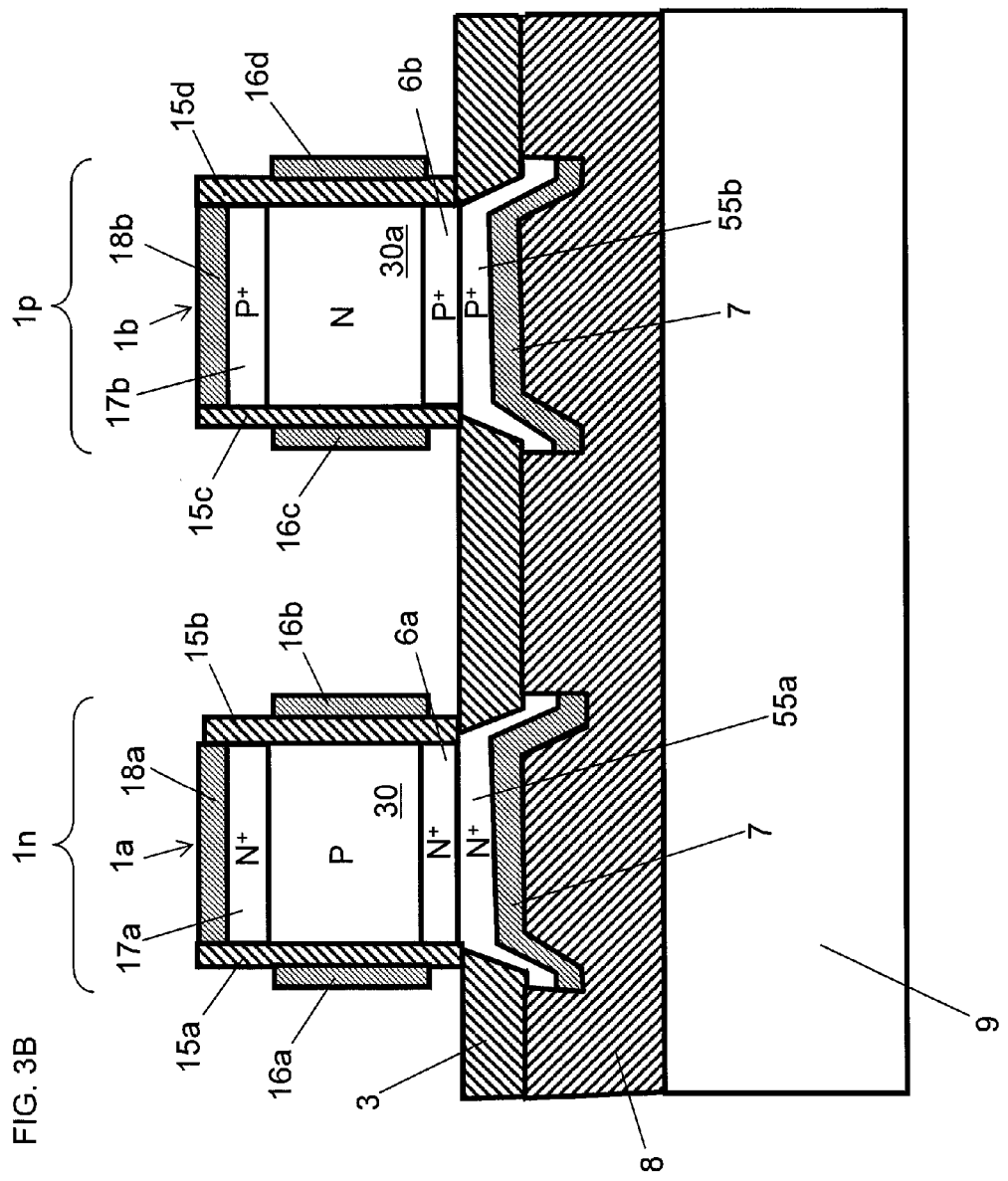
FIG. 3B is a sectional view for illustrating a method for forming an N-channel SGT and a P-channel SGT on the same substrate according to the third embodiment.

In the embodiment, referring to FIGS. 3A and 3B, an N-channel SGT is formed in an N-channel-SGT-forming region 1n and a P-channel SGT is formed in a P-channel-SGT-forming region 1p on the first semiconductor substrate 1.

The N-channel SGT in the N-channel-SGT-forming region 1n is formed in the same manner as the steps illustrated in FIGS. 1A to 1J of the first embodiment and the step illustrated in FIG. 2 of the second embodiment.

The P-channel SGT in the P-channel-SGT-forming region 1p is basically formed in the same manner as the steps illustrated in FIGS. 1A to 1J of the first embodiment and the step illustrated in FIG. 2 of the second embodiment. However, in the step corresponding to FIG. 1C, instead of forming the $N^+$ polycrystalline silicon layer 55a that functions as the drain of the N-channel SGT, a $P^+$ diffusion layer 6a and a $P^+$ polycrystalline silicon layer 55b that function as the sources of the P-channel SGT are formed by doping the polycrystalline silicon layer 5 in the P-channel-SGT-forming region 1p with ions of an acceptor impurity such as boron (B).

The steps corresponding to FIGS. 1D to 1J and the step corresponding to FIG. 2 are subsequently conducted and, as illustrated in FIG. 3B, the N-channel SGT constituted by the silicon pillar 1a and the P-channel SGT constituted by the silicon pillar 1b are formed. In the silicon pillar 1b, an N-type silicon layer 30a is formed by doping the silicon pillar 1b (P-type silicon) serving as the P-channel SGT, with ions of a donor impurity such as phosphorus (P) or arsenic (As).

In the step corresponding to FIG. 1J, a donor impurity and an acceptor impurity are respectively thermally diffused from the $N^+$ polycrystalline silicon layer 55a and the $P^+$ polycrystalline silicon layer 55b into the silicon pillars 1a and 1b by a heat treatment to thereby form the $N^+$ diffusion layer 6a and a $P^+$ diffusion layer 6b.

In the step corresponding to FIG. 2, the gate insulating layers 15a, 15b, 15c, and 15d are formed in outer peripheral portions of the silicon pillars 1a and 1b by thermal oxidation or a CVD process, and the gate conductor layers 16a, 16b, 16c, and 16d are formed on outer peripheral portions of the gate insulating layers 15a, 15b, 15c, and 15d by a CVD process (refer to FIG. 3B).

In the step illustrated in FIG. 3B, portions of the silicon pillars 1a and 1b above the gate conductor layers 16a, 16b, 16c, and 16d are respectively doped with ions of a donor impurity and an acceptor impurity to thereby form the $N^+$-type silicon layer 17a that functions as the source or drain of the N-channel SGT and a $P^+$-type silicon layer 17b that functions as the source or drain of the P-channel SGT.

In the step illustrated in FIG. 3B, metal wiring layers 18a and 18b are subsequently formed by, for example, a deposition process and etching, so as to be electrically connected to the $N^+$-type silicon layer 17a in the N-channel SGT and the $P^+$-type silicon layer 17b in the P-channel SGT.

Thus, the N-channel SGT and the P-channel SGT are formed on the second semiconductor substrate 9.

In the embodiment, when the $N^+$ polycrystalline silicon layer 55a and the $N^+$ diffusion layer 6a or the $N^+$-type silicon layer 17a in the silicon pillar 1a in the N-channel SGT functions as a drain, the other functions as a source. When the $P^+$ polycrystalline silicon layer 55b and the $P^+$ diffusion layer 6b or the $P^+$-type silicon layer 17b in the silicon pillar 1b in the P-channel SGT functions as a drain, the other functions as a source.

According to the embodiment, the N-channel SGT and the P-channel SGT can be easily formed on the second semiconductor substrate 9.

In the embodiment, after the silicon pillar 1a (P-type silicon layer 30) of the N-channel SGT is formed, the silicon pillar 1b (P-type silicon) of the P-channel SGT is doped with ions of a donor impurity such as phosphorus (P) or arsenic (As) to thereby form the N-type silicon layer 30a. This is not limitative and the following modification of the embodiment may be employed: the first semiconductor substrate 1 in FIG. 1A is composed of, instead of P-type silicon, i-type silicon, which is an intrinsic semiconductor that is not doped with impurities; in the step corresponding to FIG. 1I, the silicon pillar 1a of the N-channel SGT is doped with ions of an acceptor impurity such as boron (B) to thereby form the P-type silicon layer 30; the silicon pillar 1a of the P-channel SGT is doped with ions of a donor impurity such as phosphorus (P) or arsenic (As) to thereby form the N-type silicon layer 30a.

In the embodiment, the silicon pillars 1a and 1b may be formed of an intrinsic semiconductor and the intrinsic semiconductor in the silicon pillars 1a and 1b may be used as channels of N-channel and P-channel SGTs.

Fourth Embodiment

Hereinafter, a method for producing a semiconductor device including a plurality of SGTs according to a fourth embodiment of the present invention will be described with reference to FIG. 4.

In this embodiment, as in the third embodiment, the N-channel SGT is formed in the N-channel-SGT-forming region 1n and the P-channel SGT is formed in the P-channel-SGT-forming region 1p (refer to FIGS. 3A and 3B).

In the embodiment, the N-channel SGT and the P-channel SGT are formed on the same semiconductor substrate, that is, the second semiconductor substrate 9, basically in the same manner as in the first and third embodiments (refer to FIGS. 1A to 1J, 3A, and 3B). However, in the step corresponding to FIG. 1E, as illustrated in FIG. 4, in the plurality of the N-channel SGT and the P-channel SGT, the $N^+$ polycrystalline silicon layer 55a that functions as a source is electrically connected to the $P^+$ polycrystalline silicon layer 55b that functions as a drain by extending metal layers 7aa and 7bb.

Specifically, in the embodiment, in the step corresponding to FIG. 1D, the metal layer 7 is formed by a deposition process and etching so as to cover the silicon layer that is to serve as the $N^+$ polycrystalline silicon layer 55a and the $P^+$ polycrystalline silicon layer 55b. The metal layer 7, the $N^+$ polycrystalline silicon layer 55a, and the $P^+$ polycrystalline silicon layer 55b are then etched so as to have predetermined shapes. As a result, as illustrated in FIG. 4, the $N^+$ polycrystalline silicon layer 55a, the $P^+$ polycrystalline silicon layer 55b, and the first connection metal layers 7a and 7b are formed.

Figure 4:
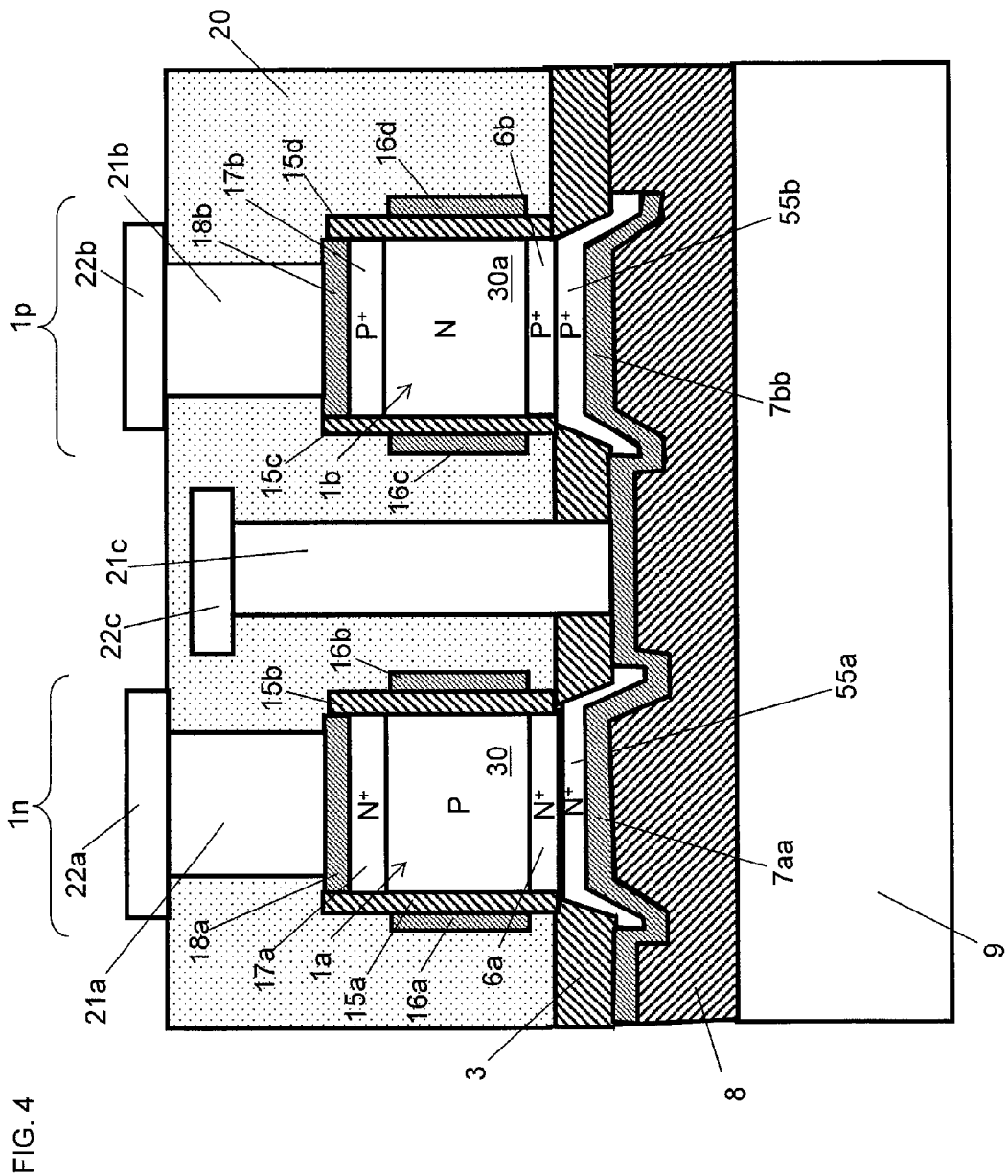
FIG. 4 is a sectional view for illustrating a method for producing a semiconductor device having a structure in which a plurality of SGTs are connected with a metal wiring layer according to a fourth embodiment of the present invention.

In the embodiment, after the step corresponding to FIG. 3B, referring to FIG. 4, a silicon oxide layer 20 is formed on the first connection metal layer 7a and a contact hole 21c is formed in the silicon oxide layer 20. The $N^+$ polycrystalline silicon layer 55a and the $P^+$ polycrystalline silicon layer 55b are connected via the contact hole 21c and the first connection metal layer 7a to an external metal wiring layer 22c formed in an upper portion of the silicon oxide layer 20.

In the embodiment, in FIG. 4, the metal layers 7aa and 7bb are respectively bonded to the entire back surfaces of the $N^+$ polycrystalline silicon layer 55a of the N-channel SGT and the $P^+$ polycrystalline silicon layer 55b of the P-channel SGT.

In the plurality of the silicon pillars 1a and 1b, the $N^+$ diffusion layers 6a and 6b are connected to each other and the plurality of the metal layers 7aa and 7bb are connected to each other.

In the embodiment, in FIG. 4, the $N^+$ diffusion layer 6a and the $N^+$ polycrystalline silicon layer 55a function as the source or drain of the N-channel SGT and the $P^+$ polycrystalline silicon layer 55b functions as the source or drain of the P-channel SGT.

As described above, according to the embodiment, in a plurality of SGTs, a source and a drain constituted by the $N^+$ polycrystalline silicon layer 55a and the $P^+$ polycrystalline silicon layer 55b are extracted to a region in an upper surface of the silicon oxide layer 20 where the metal wiring layers 22a, 22b, and 22c are formed, via contact holes or the like, and are not connected to each other while they are electrically connected to each other by extending the first connection metal layer 7a. As a result, the degree of integration of the circuit elements including SGTs can be increased.

The method for producing a semiconductor device according to the embodiment is applicable to a method for producing a solid-state imaging device. In this case, for example, in a solid-state imaging device that is configured to read a plurality of pixel signals with a single amplification MOS transistor and is described in Hidekazu Takahashi, Masakuni Kinoshita, Kazumichi Morita, Takahiro Shirai, Toshiaki Sato, Takayuki Kimura, Hiroshi Yuzurihara, Shunsuke Inoue, Member, IEEE, and Shigeyuki Matsumoto: "A 3.9-µm Pixel Pitch VGA Format 10-b Digital Output CMOS Image Sensor With 1.5 Transistor/Pixel", IEEE Journal of Solid-State Circuits, Vol. 39, No. 12, pp. 2417-2425 (December 2004), drains in pixels are connected to each other via the first connection metal layer 7a. In this case, drains and sources of pixels are connected to another metal wiring in an upper layer portion via contact holes or the like and it is not necessary to connect the drains and sources to one another. Thus, the degree of integration of pixels in the solid-state imaging device can be further increased.

Fifth Embodiment

Hereinafter, a method for forming an electrical resistor in a semiconductor device according to a fifth embodiment of the present invention will be described with reference to FIGS. 5A to 5C. The steps for producing the semiconductor device in the embodiment and a modification of the embodiment are the same as in the first embodiment unless otherwise specified below.

In the embodiment, the polycrystalline silicon layer 5 formed on the first semiconductor substrate 1 illustrated in FIG. 1B is used to form an electrical resistor, which is a circuit element of a semiconductor device.

In the embodiment, in the step illustrated in FIG. 1A, the division layer 2 for dividing the first semiconductor substrate 1 into two portions of an upper portion and a lower portion is formed at a predetermined depth of the first semiconductor substrate 1; and the first silicon oxide layer 3, which is an insulator, is formed on the first semiconductor substrate 1.

In the step illustrated in FIG. 1B, the polycrystalline silicon layer 5 is subsequently formed on the first silicon oxide layer 3. In the step illustrated in FIG. 1C, the polycrystalline silicon layer 5 is doped with ions of a donor impurity such as phosphorus (P) or arsenic (As) to thereby form the $N^+$ polycrystalline silicon layer 5a.

Figure 5A:
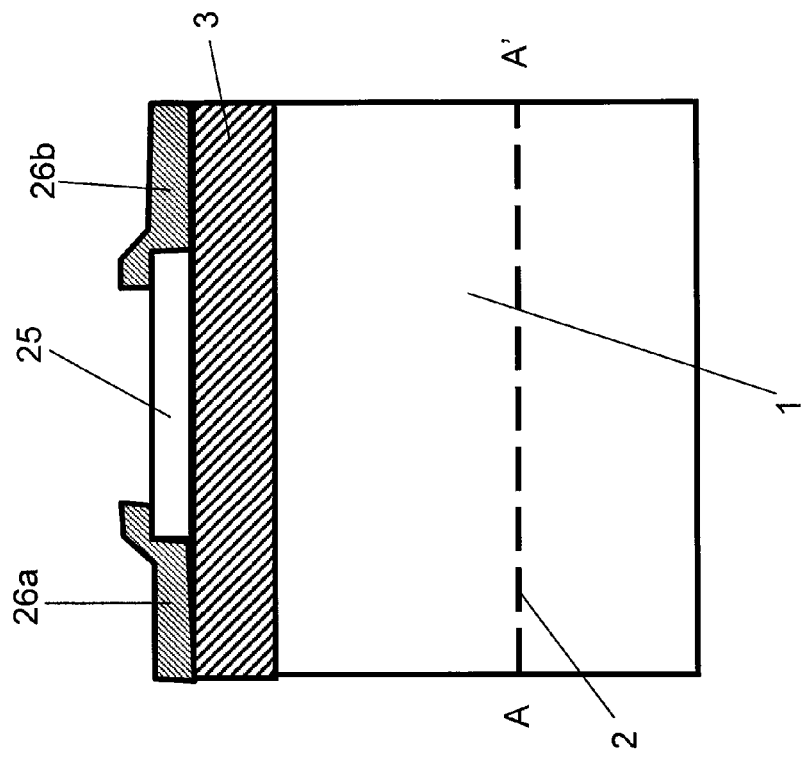
FIG. 5A is a sectional view for illustrating a method for forming an electrical resistor in a semiconductor device according to a fifth embodiment of the present invention.
Figure 5B:
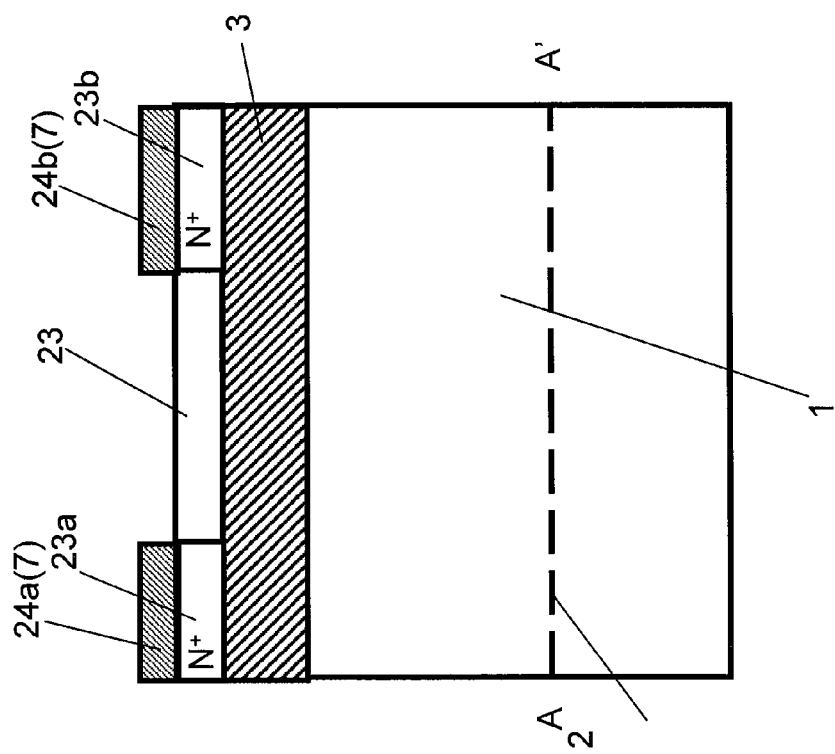
FIG. 5B is a sectional view for illustrating a method for forming an electrical resistor in a semiconductor device according to the fifth embodiment.

In the embodiment, in the steps illustrated in FIGS. 1B and 1C, as illustrated in FIG. 5A, predetermined regions of the polycrystalline silicon layer 5 on the first silicon oxide layer 3 are doped with ions of a donor impurity such as phosphorus (P) or arsenic (As) at a predetermined concentration to thereby form N$^+$ polycrystalline silicon layers 23a and 23b. Due to the N$^+$ polycrystalline silicon layers 23a and 23b and a polycrystalline silicon layer 23 that is not doped with ions of a donor impurity or a polycrystalline silicon layer 23 that is doped with a predetermined impurity, the electrical resistance of a predetermined region (polycrystalline silicon layer 23) of the polycrystalline silicon layer 5 is decreased and an electrical resistor is formed. Since the N$^+$ polycrystalline silicon layers 23a and 23b and the polycrystalline silicon layer 23 are thus formed from the polycrystalline silicon layer 5 (refer to FIG. 1B) as with the N$^+$ polycrystalline silicon layer 5a (refer to FIG. 1C) and hence are positioned in the same layer as the N$^+$ polycrystalline silicon layer 5a.

In the step illustrated in FIG. 1D, metal wiring layers 24a and 24b positioned in the same layer as the metal layer 7 are subsequently formed on the N$^+$ polycrystalline silicon layers 23a and 23b in the same manner as in the metal layer 7.

According to the embodiment, predetermined regions of the polycrystalline silicon layer 5 are doped with ions of a donor impurity at a predetermined concentration to thereby form the N$^+$ polycrystalline silicon layers 23a and 23b and the polycrystalline silicon layer 23 that have predetermined electrical resistances. The N$^+$ polycrystalline silicon layers 23a and 23b and the polycrystalline silicon layer 23 are formed in the same layer as the N$^+$ polycrystalline silicon layer 5a. As a result, an electrical resistor (circuit element) and semiconductor devices such as a solid-state imaging device and SGTs can be formed on the same semiconductor substrate; and the production steps are also simplified.

In the embodiment, referring to FIG. 5B, in the step illustrated in FIG. 1B, a polycrystalline silicon layer 25 is formed and etched so as to have a predetermined shape; and metal wiring layers 26a and 26b that are connected to the polycrystalline silicon layer 25 are subsequently formed by a deposition process or a CVD process. Thus, an electrical resistor in a semiconductor device is also formed with the polycrystalline silicon layer 25.

Figure 5C:
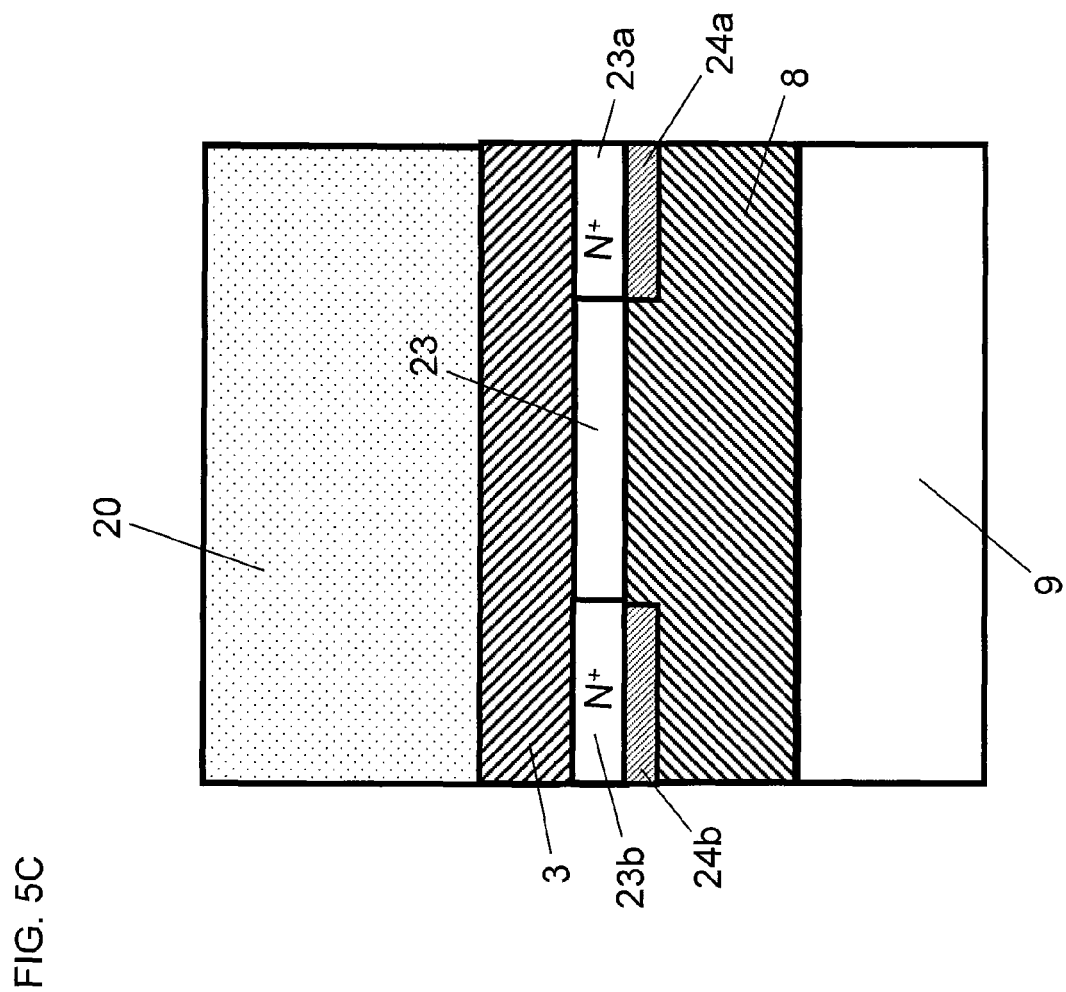
FIG. 5C is a sectional view for illustrating a method for forming an electrical resistor in a semiconductor device according to the fifth embodiment.

In a modification of the embodiment, referring to FIG. 5C, the second silicon oxide layer 8 is formed on the second semiconductor substrate 9; and the N$^+$ polycrystalline silicon layers 23a and 23b and the polycrystalline silicon layer 23 are formed on the second silicon oxide layer 8 in the above-described manner. After that, the first silicon oxide layer 3 can be formed on the N$^+$ polycrystalline silicon layers 23a and 23b and the polycrystalline silicon layer 23; and the silicon oxide layer 20 (refer to FIG. 4) can be formed on the first silicon oxide layer 3. In FIG. 5C, the electrical resistor illustrated in FIG. 5A is constituted by the N$^+$ polycrystalline silicon layers 23a and 23b and the polycrystalline silicon layer 23.

In the embodiment and the modification illustrated in FIG. 5C, referring to FIG. 4, circuit elements including SGTs or metal wirings are formed on the first silicon oxide layer 3.

In the modification illustrated in FIG. 5C, the polycrystalline silicon layer 23 constituting the electrical resistor is formed under the first silicon oxide layer 3, which is an insulator.

According to the modification, as illustrated in FIG. 5C, the metal wiring layers 22a, 22b, and 22c for the circuit elements illustrated in FIG. 4 can be formed so as to overlap the polycrystalline silicon layer 23 constituting the electrical resistor with the SiO$_2$ layer (first silicon oxide layer 3) therebetween. As a result, the degree of integration of a semiconductor device (circuit element) having an electrical resistor can be further increased.

Sixth Embodiment

Figure 6B:
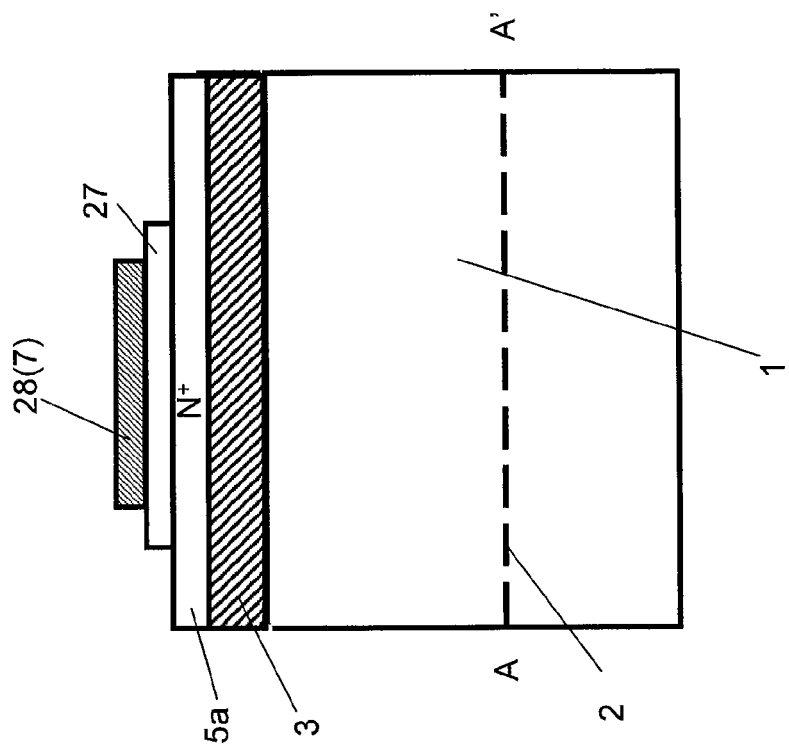
FIG. 6B is a sectional view for illustrating a method for forming a capacitor in a semiconductor device according to the sixth embodiment.

Hereinafter, a method for forming a capacitor in a semiconductor device according to a sixth embodiment of the present invention will be described with reference to FIGS. 6A to 6C. The steps for producing the semiconductor device in the embodiment are the same as in the first embodiment unless otherwise specified below.

In the embodiment, the polycrystalline silicon layer 5 formed on the first semiconductor substrate 1 illustrated in FIG. 1B is used to form a capacitor, which is a circuit element of a semiconductor device.

In the embodiment, in the step illustrated in FIG. 1A, the division layer 2 for dividing the first semiconductor substrate 1 into two portions of an upper portion and a lower portion is formed at a predetermined depth of the first semiconductor substrate 1; and the first silicon oxide layer 3, which is an insulator, is formed on first semiconductor substrate 1.

In the step illustrated in FIG. 1B, the polycrystalline silicon layer 5 is subsequently formed on the first silicon oxide layer 3. In the step illustrated in FIG. 1C, the polycrystalline silicon layer 5 is doped with ions of a donor impurity such as phosphorus (P) or arsenic (As) to thereby form the N$^+$ polycrystalline silicon layer 5a.

Figure 6A:
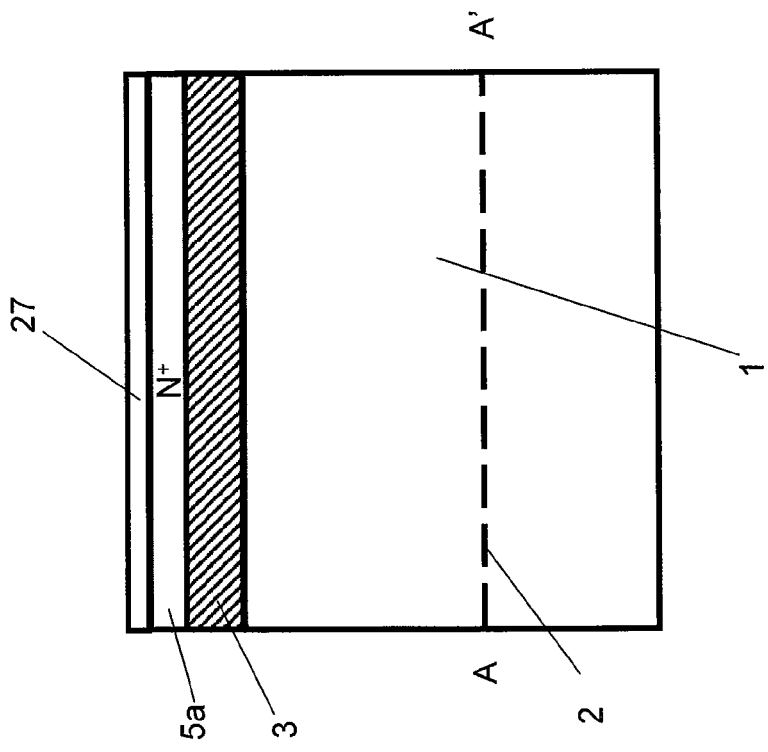
FIG. 6A is a sectional view for illustrating a method for forming a capacitor in a semiconductor device according to a sixth embodiment of the present invention.
Figure 6C:
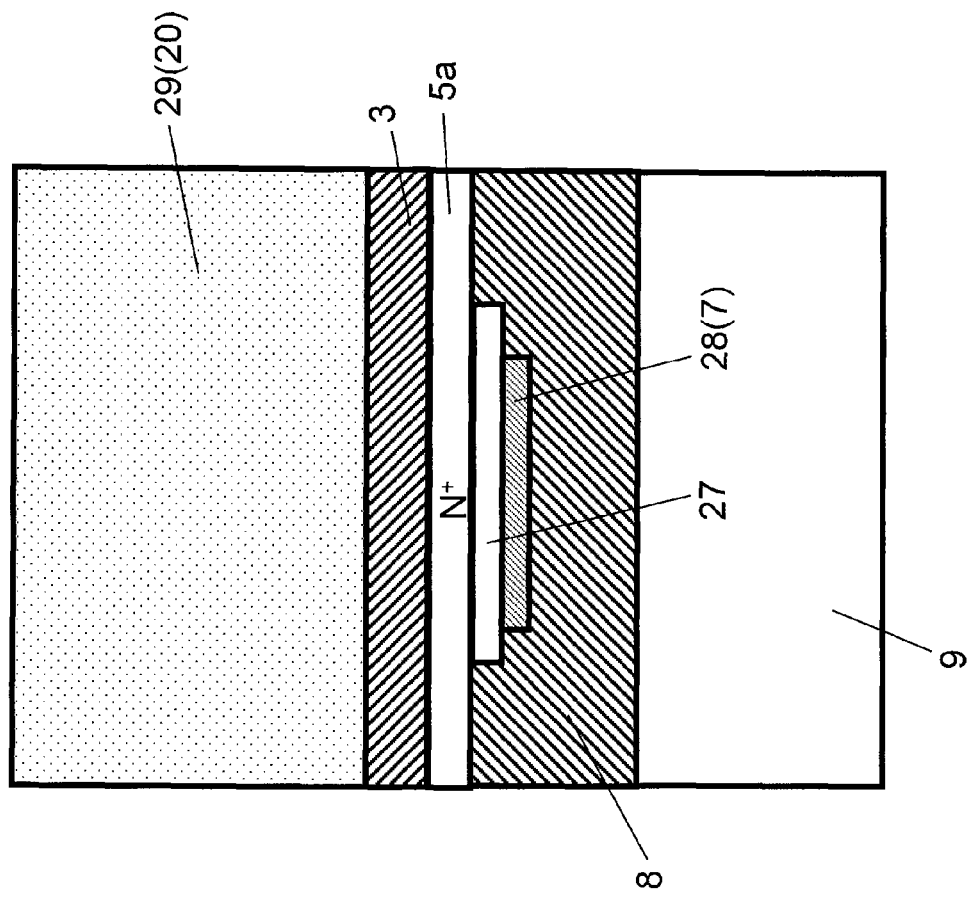
FIG. 6C is a sectional view for illustrating a method for forming a capacitor in a semiconductor device according to the sixth embodiment.

After the step illustrated in FIG. 1C, referring to FIG. 6A, a capacitor silicon oxide layer 27 is formed in the surface of the N$^+$ polycrystalline silicon layer 5a by thermal oxidation or a CVD process.

Referring to FIG. 6B, the capacitor silicon oxide layer 27 that functions as a capacitor insulating film in a capacitor region in which a capacitor is to be formed is subsequently shaped by etching through a mask so as to have a predetermined shape.

In the step illustrated in FIG. 1D, a metal layer 28 that functions as a capacitor electrode is formed by a deposition process or a CVD process on the capacitor silicon oxide layer 27 that has been shaped into the predetermined shape. The metal layer 28 is formed in the same layer as the metal layer 7 in the first embodiment.

The steps illustrated in FIGS. 1E to 1H and FIG. 4 are subsequently conducted to form a stack structure illustrated in FIG. 6C. Specifically, the second silicon oxide layer 8 is formed on the second semiconductor substrate 9; in the capacitor region in which the capacitor is formed within the second silicon oxide layer 8, the metal layer 28 that functions as a capacitor electrode and the capacitor silicon oxide layer 27 that is formed on the metal layer 28 and functions as a capacitor insulating film are disposed. Thus, a structure is provided in which the N$^+$ polycrystalline silicon layer 5a, the first silicon oxide layer 3, and a silicon oxide layer 29 (silicon oxide layer 20) are stacked in this order on the capacitor silicon oxide layer 27 and the second silicon oxide layer 8. In this structure, a capacitor is formed in which the metal layer 28 and the N$^+$ polycrystalline silicon layer 5a function as capacitor electrodes and the capacitor silicon oxide layer 27 functions as a capacitor insulating film.

In the embodiment, in the steps illustrated in FIGS. 1D to 1H of the method for producing a solid-state imaging device according to the first embodiment, the step of forming the insulating layer 27 in the surface of the N$^+$ polycrystalline silicon layer 5a (refer to FIG. 6A) and the step of forming the capacitor silicon oxide layer 27 and the metal layer 28 (refer to FIG. 6B) are added. As a result, a capacitor (circuit element) and semiconductor devices such as pixels and SGTs of a solid-state imaging device can be formed on the same semiconductor substrate; and the production steps are also simplified.

Seventh Embodiment

Hereinafter, a method for forming a capacitor in a semiconductor device according to a seventh embodiment of the present invention will be described with reference to FIGS. 7A and 7B. The steps for producing the semiconductor device in the embodiment are the same as in the first embodiment unless otherwise specified below.

In the embodiment, the polycrystalline silicon layer 5 formed on the first semiconductor substrate 1 illustrated in FIG. 1B is used to form a capacitor, which is a circuit element of a semiconductor device.

In the embodiment, in the step illustrated in FIG. 1A, the division layer 2 for dividing the first semiconductor substrate 1 into two portions of an upper portion and a lower portion is formed at a predetermined depth of the first semiconductor substrate 1; and the first silicon oxide layer 3, which is an insulator, is formed on the first semiconductor substrate 1.

Figure 7B:
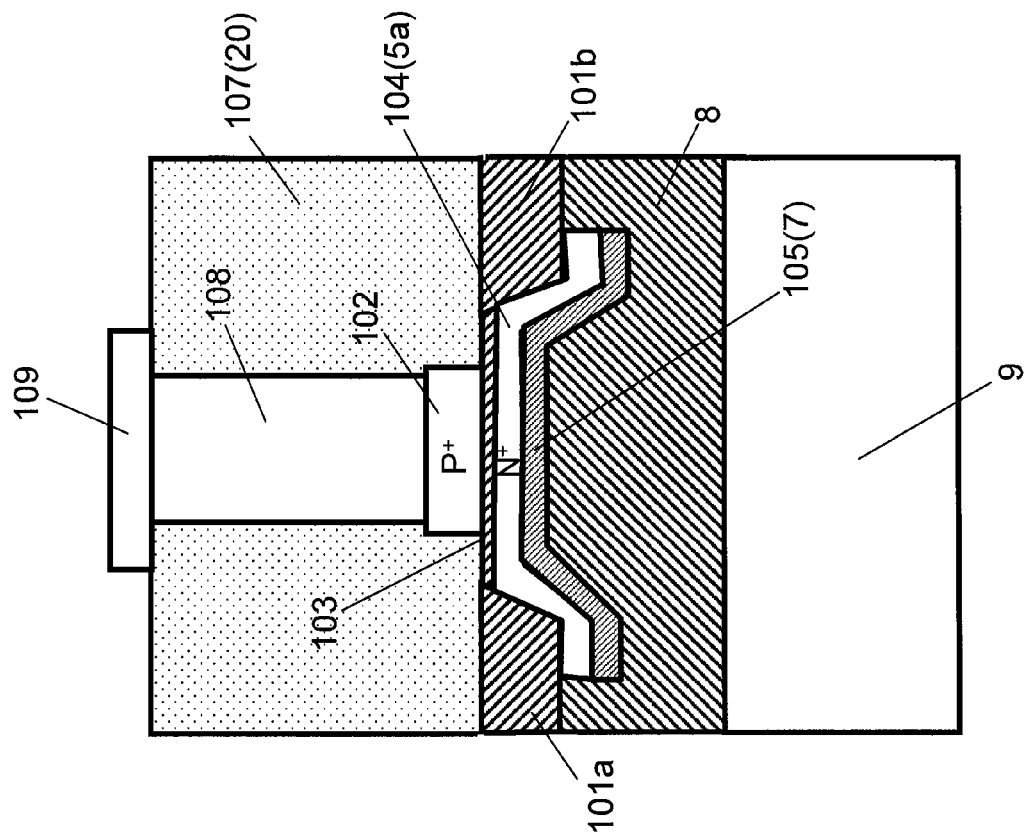
FIG. 7B is a sectional view for illustrating a method for forming a capacitor in a semiconductor device according to the seventh embodiment.
Figure 7A:
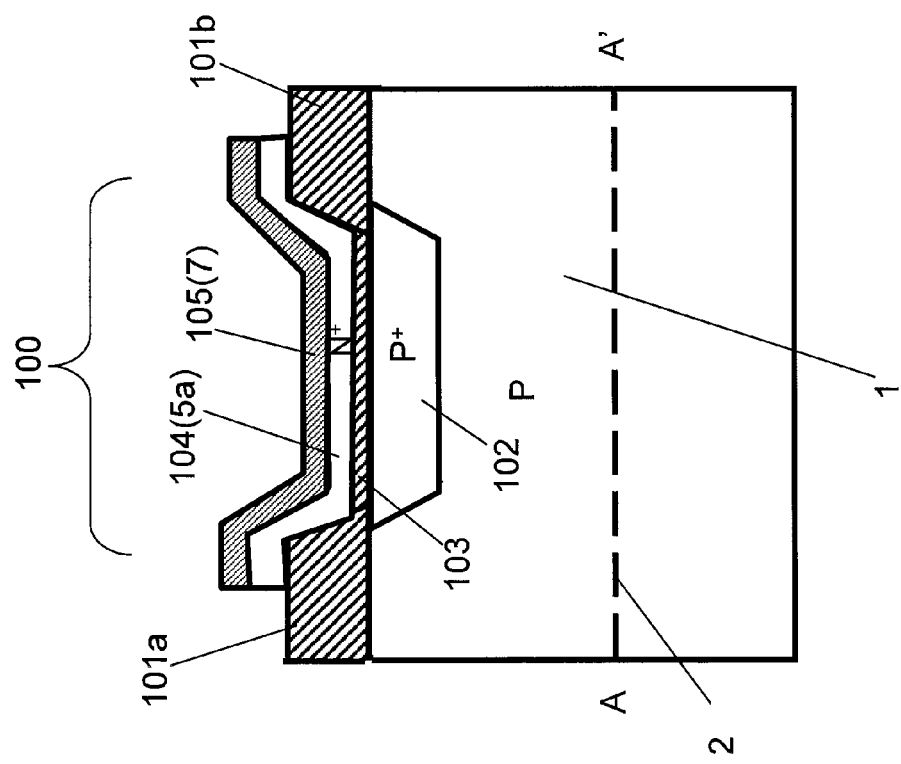
FIG. 7A is a sectional view for illustrating a method for forming a capacitor in a semiconductor device according to a seventh embodiment of the present invention.

In the step illustrated in FIG. 1B, prior to the formation of the polycrystalline silicon layer 5, a capacitor-forming region 100 illustrated in FIG. 7A is subsequently defined on the first silicon oxide layer 3 and silicon oxide in the capacitor-forming region 100 is removed by etching to thereby form a silicon-oxide-layer-removed region having the shape of a recess. Specifically, in the step illustrated in FIG. 1B, as illustrated in FIG. 7A, silicon oxide layers 101*a* and 101*b* are left around the silicon-oxide-layer-removed region; and a silicon oxide layer 103, which is thinner than the silicon oxide layers 101*a* and 101*b*, is left in the silicon-oxide-layer-removed region. By conducting ion doping or thermal diffusion of an acceptor impurity such as boron (B) via the silicon oxide layer 103 with the silicon oxide layers 101*a* and 101*b* that serve as masks, a P$^+$ diffusion layer 102 is formed in the surface of the first semiconductor substrate 1 in the capacitor-forming region 100. Referring to FIG. 1B, the polycrystalline silicon layer 5 is formed on the first silicon oxide layer 3 so as to fill the silicon-oxide-layer-removed region.

In the step illustrated in FIG. 1C, the polycrystalline silicon layer 5 is subsequently doped with ions of a donor impurity such as phosphorus (P) or arsenic (As) to thereby form an N$^+$ polycrystalline silicon layer 104 (refer to FIG. 7A).

In the step illustrated in FIG. 1D, a metal layer 105 is subsequently formed on the N$^+$ polycrystalline silicon layer 104 by a deposition process or a CVD process (refer to FIG. 7A). The metal layer 105 is formed in the same layer as the metal layer 7 in the first embodiment.

As in the step illustrated in FIG. 1E, in the capacitor-forming region 100 where a capacitor is to be formed, the N$^+$ polycrystalline silicon layer 104 and the metal layer 105 that is formed on the N$^+$ polycrystalline silicon layer 104 and functions as a capacitor electrode are subsequently shaped into predetermined shapes.

After the steps illustrated in FIGS. 1F to 1I of the first embodiment are subsequently conducted, referring to FIG. 7B, the P$^+$ diffusion layer 102 is left in the silicon pillar 1*a* and a silicon oxide layer 107 is formed so as to cover the P$^+$ diffusion layer 102 and the silicon oxide layers 101*a* and 101*b*.

Referring to FIG. 7B, a contact hole 108 is subsequently formed in the silicon oxide layer 107; and a metal wiring layer 109 on the silicon oxide layer 107 is electrically connected to the P$^+$ diffusion layer 102 via the contact hole 108.

As a result, as illustrated in FIG. 7B, a capacitor in which the N$^+$ polycrystalline silicon layer 104, the metal layer 105, and the P$^+$ diffusion layer 102 function as capacitor electrodes and the silicon oxide layer 103 between the silicon oxide layers 101*a* and 101*b* functions as a capacitor insulating film, is formed in the capacitor-forming region 100 (refer to FIG. 7A).

In the embodiment, the P$^+$ diffusion layer 102 is formed by conducting ion doping or thermal diffusion of an acceptor impurity such as boron (B) with the silicon oxide layers 101*a* and 101*b* that serve as masks in the first semiconductor substrate 1. This is not limitative and the P$^+$ diffusion layer 102 may be formed in a predetermined region other than the capacitor-forming region 100 by conducting ion doping at a high acceleration voltage from above the first silicon oxide layer 3 having a uniform thickness (refer to FIG. 1A) prior to the formation of the silicon oxide layers 101*a* and 101*b*.

According to the embodiment, in the structure illustrated in FIG. 7B, electrical signals can be extracted via the contact hole 108 from desired positions in the semiconductor device to connection between capacitors or an external circuit. As a result, the degree of integration of circuit elements can be further increased.

Eighth Embodiment

Hereinafter, a method for forming a diode in a semiconductor device according to an eighth embodiment of the present invention will be described with reference to FIGS. 8A to 8C. The steps for producing the semiconductor device in the embodiment and a modification of the embodiment are the same as in the first embodiment unless otherwise specified below.

In the embodiment, the polycrystalline silicon layer 5 formed on the first semiconductor substrate 1 illustrated in FIG. 1B is used to form a diode, which is a circuit element of a semiconductor device.

In the embodiment, the steps illustrated in FIGS. 1A to 1I of the first embodiment are conducted. As a result, as illustrated in FIG. 8A, the second silicon oxide layer 8 is formed on the second semiconductor substrate 9; and the metal layer 7, the N$^+$ polycrystalline silicon layer 5*a*, and the silicon pillar 1*a* are formed in the ascending order in a diode-forming region 100*a*. The first silicon oxide layer 3 is formed on the second silicon oxide layer 8 so as to surround the N$^+$ polycrystalline silicon layer 5*a*.

In the structure illustrated in FIG. 8A, when the silicon pillar 1*a* is formed of intrinsic silicon, it is subsequently doped with ions of an acceptor impurity such as boron (B) to thereby form the P-type silicon layer 30 illustrated in FIG. 8B. However, when the silicon pillar 1*a* is formed so as to be of P-type as in the first embodiment, the ion doping of an acceptor impurity is not necessary.

Figure 8B:
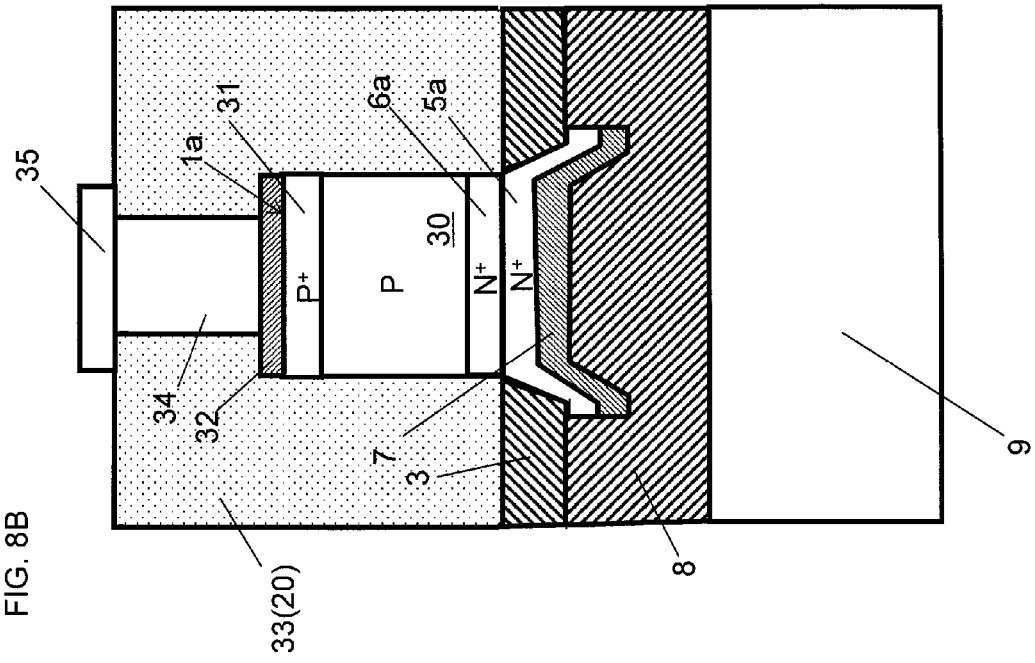
FIG. 8B is a sectional view for illustrating a method for forming a diode in a semiconductor device according to the eighth embodiment.
Figure 8A:
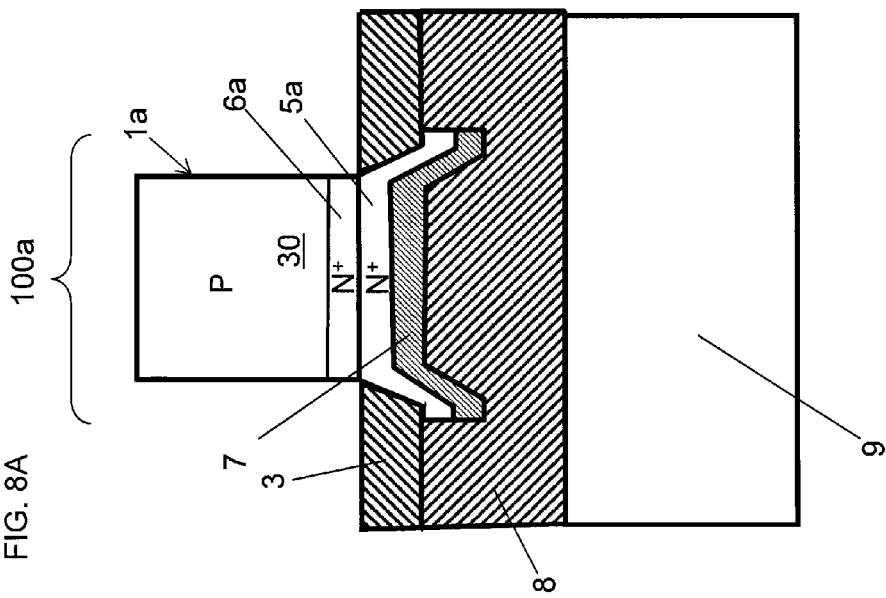
FIG. 8A is a sectional view for illustrating a method for forming a diode in a semiconductor device according to an eighth embodiment of the present invention.

Referring to FIG. 8B, a heat treatment is subsequently conducted to thermally diffuse a donor impurity from the N$^+$ polycrystalline silicon layer 5*a* to the P-type silicon layer 30. Thus, the N$^+$ diffusion layer 6*a* is formed in a lower portion of the P-type silicon layer 30 (silicon pillar 1*a*).

Referring to FIG. 8B, an upper portion of the P-type silicon layer 30 (silicon pillar 1*a*) is subsequently doped with ions of an acceptor impurity such as boron (B) to thereby form a P$^+$-type silicon layer 31. A metal layer 32 is also formed on the P$^+$-type silicon layer 31 by a deposition process and etching.

Referring to FIG. 8B, a silicon oxide layer 33 is subsequently formed so as to cover the P-type silicon layer 30 and the metal layer 32; and, in the silicon oxide layer 33, a contact hole 34 and a metal wiring layer 35 are formed in this order in a region above the metal layer 32. As a result, the metal wiring layer 35 is electrically connected to the metal layer 32 via the contact hole 34.

In the embodiment, the P+-type silicon layer 31 and the P-type silicon layer 30 constitute a pn junction diode.

According to the embodiment, a diode (circuit element) and semiconductor devices such as pixels and SGTs of a solid-state imaging device can be formed on the same semiconductor substrate; and the production steps are also simplified.

Figure 8C:
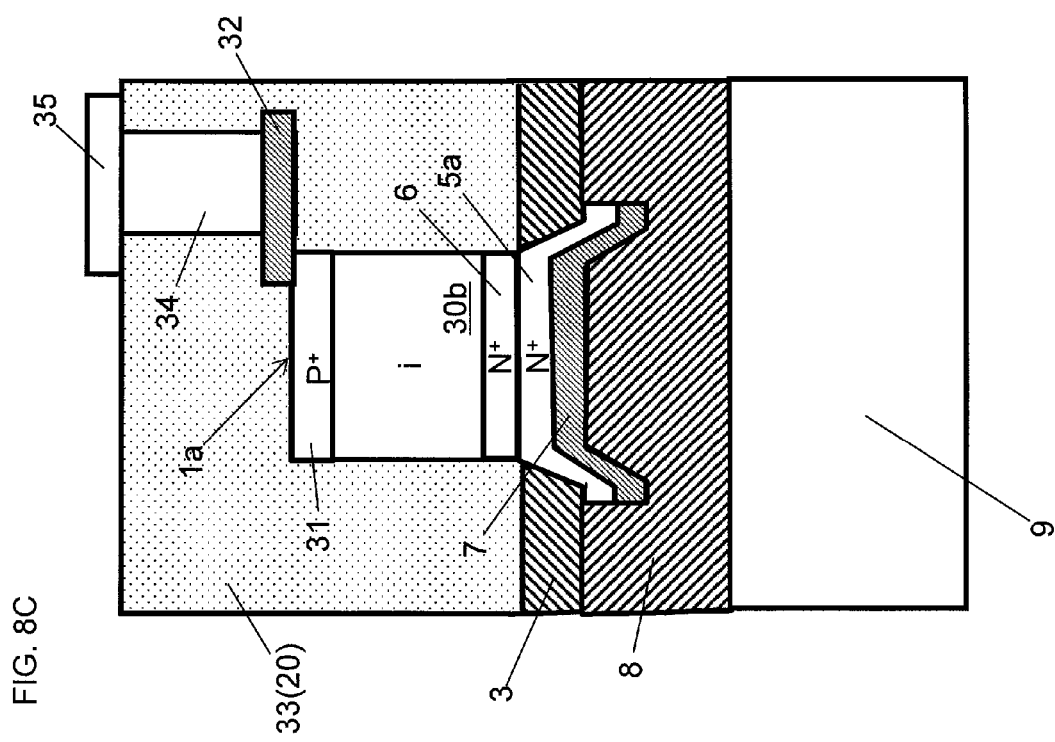
FIG. 8C is a sectional view for illustrating a method for forming a PIN diode in a semiconductor device according to a modification of the eighth embodiment.

FIG. 8C illustrates a modification of the embodiment in which a PIN photodiode is formed in the silicon pillar 1a. In this modification, in the silicon pillar 1a illustrated in the eighth embodiment, an i-type silicon layer 30b composed of an intrinsic semiconductor is formed instead of the P-type silicon layer 30. The P+-type silicon layer 31 is formed on the i-type silicon layer 30b. The i-type silicon layer 30b and the P+-type silicon layer 31 constitute a PIN photodiode.

In this PIN photodiode, referring to FIG. 8C, light comes from above the P+-type silicon layer 31. Accordingly, to avoid blocking of the incident light, the metal layer 32 for connecting the P+-type silicon layer 31 to an external circuit is formed in a region located around the P+-type silicon layer 31.

In the PIN photodiode of the modification, a depletion layer is formed in the entity of or a large region of the i-type silicon layer 30b, and hence a large photoelectric conversion region can be provided. In addition, the thickness of the depletion layer corresponding to the thickness of the capacitor-forming region becomes large and hence the capacitance is decreased. The PIN photodiode serving as an optical-connection light-receiving element and circuit elements of a semiconductor device are formed on the same semiconductor substrate.

The PIN photodiode of the modification functions as an optical switch. Accordingly, RC delay due to the resistance and capacitance of input circuit wiring is not caused and the operation speed of the circuit input unit and the operation speed of the entire circuit can be increased.

According to the modification, a PIN photodiode (circuit element) and semiconductor devices such as pixels and SGTs of a solid-state imaging device can be formed on the same semiconductor substrate; and the production steps are also simplified.

Ninth Embodiment

Hereinafter, a CMOS inverter circuit having SGTs according to a ninth embodiment of the present invention will be described with reference to FIGS. 9A to 9C.

Figure 9B:
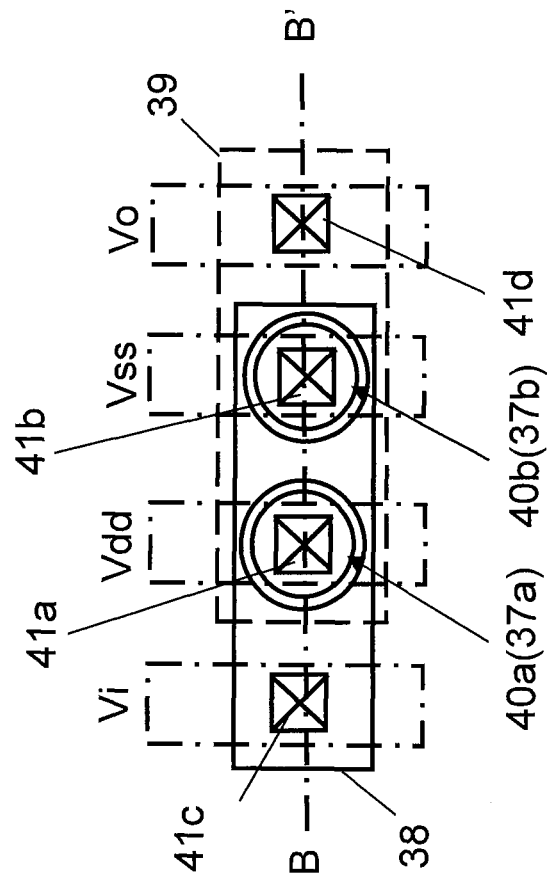
FIG. 9B is a circuit arrangement plan view for illustrating a CMOS inverter circuit according to the ninth embodiment.
Figure 9A:
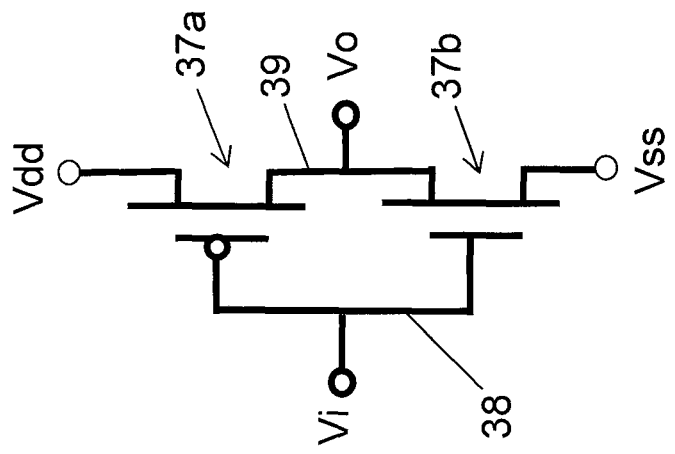
FIG. 9A is a circuit diagram for illustrating a CMOS inverter circuit according to a ninth embodiment of the present invention.

FIG. 9A illustrates a CMOS inverter circuit having SGTs according to the embodiment. As illustrated in FIG. 9A, a P-channel MOS transistor 37a and an N-channel MOS transistor 37b are connected in series. The gate of the P-channel MOS transistor 37a is connected to the gate of the N-channel MOS transistor 37b via gate connection wiring 38. The gate connection wiring 38 is connected to input terminal wiring Vi. The source of the P-channel MOS transistor 37a is connected to power supply terminal wiring Vdd. The drain of the P-channel MOS transistor 37a and the drain of the N-channel transistor 37b are connected to output terminal wiring Vo via drain connection wiring 39. The source of the N-channel MOS transistor 37b is connected to ground terminal wiring Vss that is at a ground potential.

FIG. 9B illustrates an arrangement plan view of the CMOS inverter circuit having SGTs.

As illustrated in FIG. 9B, a contact hole 41c, a silicon pillar 40a, a contact hole 41a, a contact hole 41b, and a contact hole 41d are linearly arranged.

The input terminal wiring Vi is configured to input electrical signals (gate voltage) through the contact hole 41c. The power supply terminal wiring Vdd is configured to supply a power supply voltage through the contact hole 41a. The ground terminal wiring Vss is configured to establish a connection to the ground through the contact hole 41b. The output terminal wiring Vo is configured to output electrical signals through the contact hole 41d.

The contact hole 41c is formed above the gate connection wiring 38 that connects the gate of the P-channel MOS transistor 37a and the gate of the N-channel MOS transistor 37b to each other. The silicon pillar 40a constitutes the P-channel MOS transistor 37a. The contact hole 41a is formed above the silicon pillar 40a. A silicon pillar 40b constitutes the N-channel MOS transistor 37b. The contact hole 41b is formed above the silicon pillar 40b. The contact hole 41d is formed above the drain connection wiring 39 that connects the drain of the P-channel MOS transistor 37a and the drain of the N-channel MOS transistor 37b to each other.

The input terminal wiring Vi, the power supply terminal wiring Vdd, the ground terminal wiring Vss, and the output terminal wiring Vo are arranged in a row direction that is orthogonal to the column direction of the contact hole 41b and the contact hole 41d (refer to FIG. 9A).

Figure 9C:
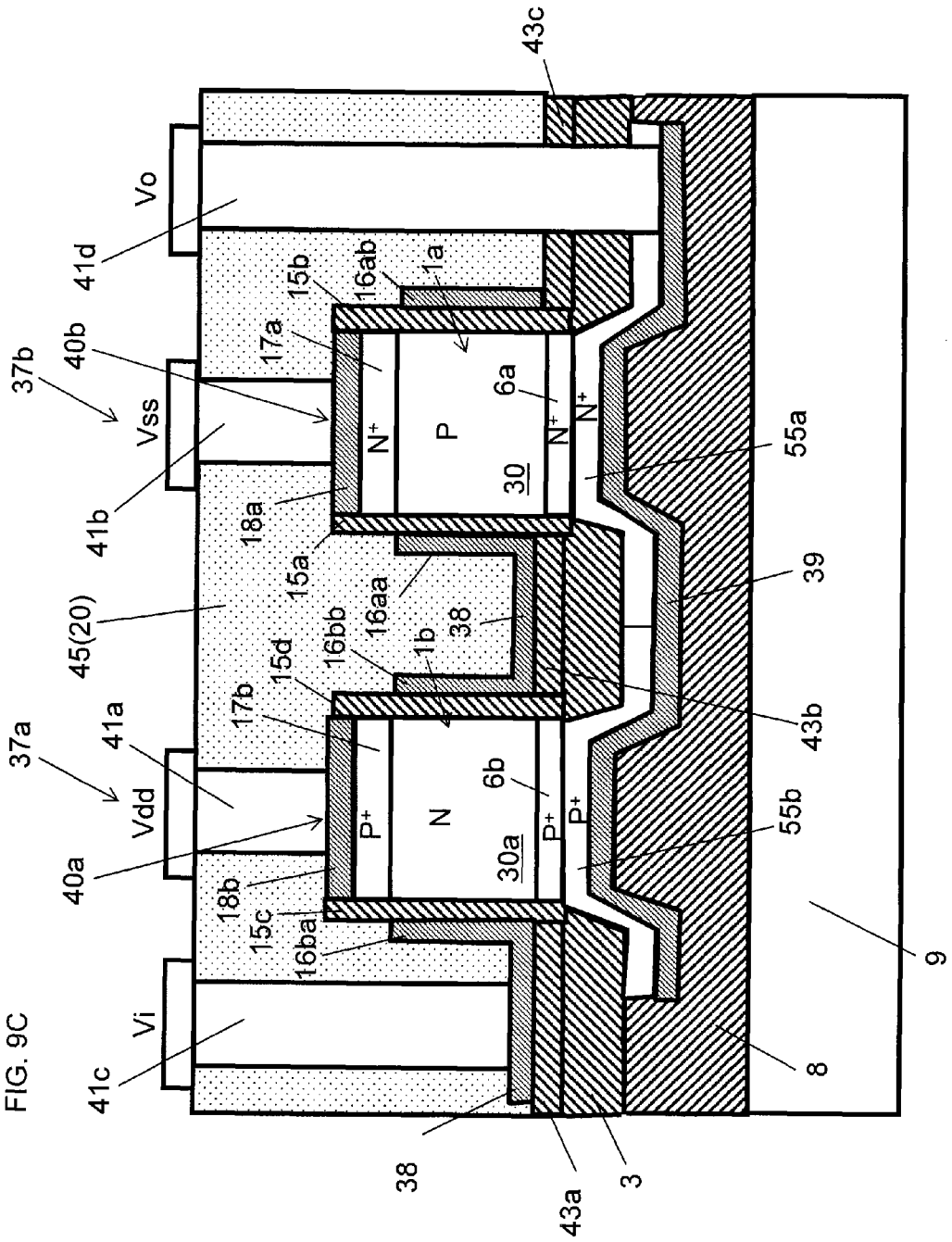
FIG. 9C is a sectional view for illustrating a method for forming a CMOS inverter circuit in a semiconductor device according to the ninth embodiment.

FIG. 9C is a sectional structural view, taken along B-B' line in FIG. 9B. Hereinafter, a method for forming the above-described CMOS inverter circuit will be described with reference to FIG. 9C. The steps for forming the CMOS inverter circuit in the embodiment are the same as in the first embodiment unless otherwise specified below.

In the embodiment, the CMOS inverter circuit including the P-channel MOS transistor 37a and the N-channel MOS transistor 37b illustrated in FIG. 9C are formed in the same manner as in the third embodiment illustrated in FIGS. 3A and 3B though the positions of the N-channel MOS transistor and the P-channel MOS transistor in the circuit illustrated in FIG. 3B are exchanged therebetween in the CMOS inverter circuit illustrated in FIG. 9C. Hereafter, descriptions of portions denoted with reference signs that are common to or corresponding to those in the above-described embodiments are abbreviated.

As illustrated in FIG. 9C, the drain connection wiring 39 is formed under the P+ diffusion layer 6b and the P+ polycrystalline silicon layer 55b that function as the drain of the P-channel MOS transistor 37a and the N+ diffusion layer 6a and the N+ polycrystalline silicon layer 55a that function as the drain of the N-channel MOS transistor 37b. The drain connection wiring 39 is connected to the bottom surfaces of the N+ polycrystalline silicon layer 55a and the P+ polycrystalline silicon layer 55b. The N+ polycrystalline silicon layer 55a is connected to the P+ polycrystalline silicon layer 55b via the drain connection wiring 39. The drain connection wiring 39 is connected to the output terminal wiring layer Vo through the contact hole 41d extending through a silicon oxide layer 45 formed on an insulating layer 43b.

Gate conductor layers 16ba and 16bb of the P-channel MOS transistor 37a are connected to gate conductor layers 16aa and 16ab of the N-channel MOS transistor 37b via the gate connection wiring 38 formed on an insulating layer 43a.

The gate connection wiring 38, the metal wiring layer 18b formed on the N+ diffusion layer 6a and the P+-type silicon layer 17b that function as the drain of the P-channel MOS transistor 37a, the metal wiring layer 18a formed on the N+ diffusion layer 6a and the N+-type silicon layer 17a that function as the drain of the N-channel MOS transistor 37b, and the drain connection wiring 39 are respectively connected to the input terminal wiring layer Vi, the power supply terminal wiring layer Vdd, the ground terminal wiring layer Vss, and the output terminal wiring layer Vo that are formed on the silicon oxide layer 45 via the contact holes 41c, 41a, 41b, and 41d that extend through the silicon oxide layer 45. The input terminal wiring layer Vi, the power supply terminal wiring layer Vdd, the ground terminal wiring layer Vss, and the output terminal wiring layer Vo are arranged so as to be parallel to one another (refer to FIG. 9C).

According to the embodiment, the $P^+$ diffusion layer 6a and the $P^+$ polycrystalline silicon layer 55b that function as the drain of the P-channel MOS transistor 37a and the $N^+$ diffusion layer 6a and the $N^+$ polycrystalline silicon layer 55a that function as the drain of the N-channel MOS transistor 37b are connected to each other at positions close to each other and are also electrically connected to each other via the drain connection wiring 39 having a low electrical resistance. Due to this structure, an integrated circuit including a CMOS inverter circuit in which a high speed and a high degree of integration are achieved is obtained.

Tenth Embodiment

Hereinafter, a two-stage CMOS inverter circuit according to a tenth embodiment of the present invention will be described with reference to FIGS. 10A to 10C. Hereafter, descriptions of portions and structures denoted with reference signs that are common to or corresponding to those in the ninth embodiment are abbreviated.

Figure 10B:
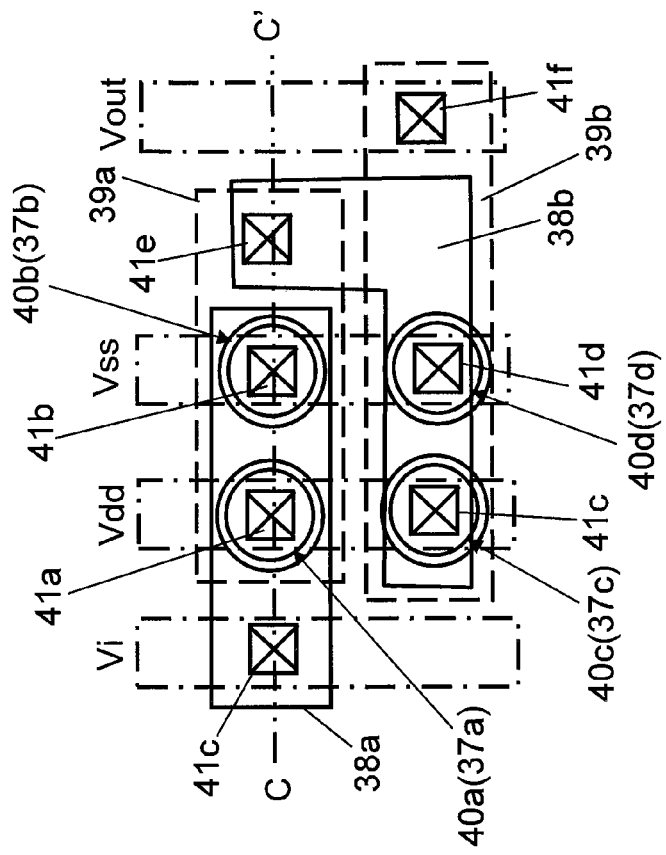
FIG. 10B is a circuit arrangement plan view for illustrating a two-stage CMOS inverter circuit according to the tenth embodiment.
Figure 10A:
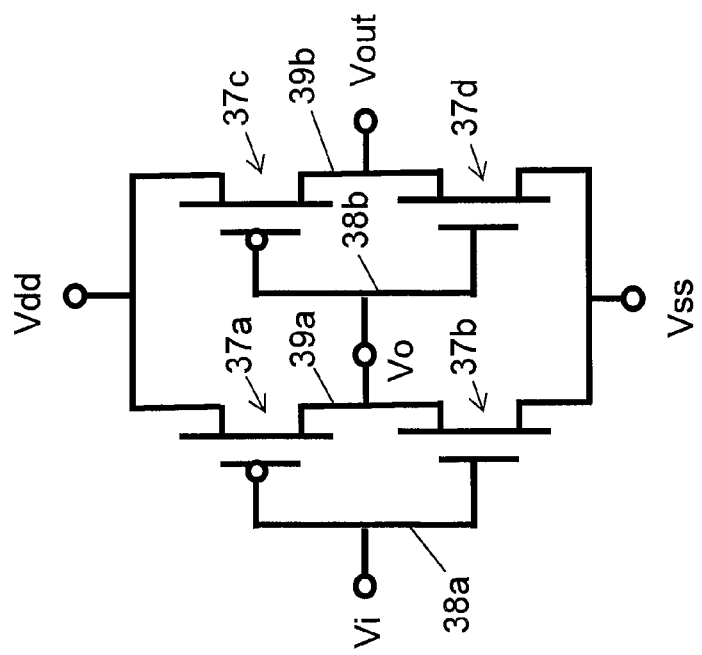
FIG. 10A is a circuit diagram for illustrating a two-stage CMOS inverter circuit according to a tenth embodiment of the present invention.

FIG. 10A illustrates a two-stage CMOS inverter circuit according to the embodiment.

As illustrated in FIG. 10A, P-channel MOS transistors 37a and 37c and N-channel MOS transistors 37b and 37d are respectively connected in series in the first stage and the second stage. The gate of the P-channel MOS transistor 37a and the gate of the N-channel MOS transistor 37b in the first stage are connected to the input terminal wiring Vi via gate connection wiring 38a. The gate of the P-channel MOS transistor 37c and the gate of the N-channel MOS transistor 37d in the second stage are connected to the output terminal wiring Vo via gate connection wiring 38b. The drains of the P-channel MOS transistors 37a and 37c in the first and second stages are connected to the power supply terminal wiring Vdd. The sources of the N-channel MOS transistors 37b and 37d in the first and second stages are connected to the ground terminal wiring Vss.

In the first stage, the drain of the P-channel MOS transistor 37a and the drain of the N-channel transistor 37b are connected to the output terminal wiring Vo in the first stage via drain connection wiring 39a.

In the second stage, the drain of the P-channel transistor 37c and the drain of the N-channel transistor 37d are connected to an output terminal wiring Vout via drain connection wiring 39b.

FIG. 10B illustrates an arrangement plan view of the CMOS inverter circuit.

As illustrated in FIG. 10B, a contact hole 41c is formed above the gate connection wiring 38a that is formed for the silicon pillar 40a constituting the P-channel MOS transistor 37a and the silicon pillar 40b constituting the N-channel MOS transistor 37b in the first stage. The contact hole 41c is connected to the input terminal wiring Vi. The gate connection wiring 38a connects the gate of the P-channel MOS transistor 37a and the gate of the N-channel MOS transistor 37b to each other.

In the first stage, the drain of the P-channel MOS transistor 37a and the drain of the N-channel MOS transistor 37b are connected to each other via the drain connection wiring 39a in the first stage.

A contact hole 41e is formed above the gate connection wiring 38b that is formed for a silicon pillar 40c constituting the P-channel MOS transistor 37c and a silicon pillar 40d constituting the N-channel MOS transistor 37d in the second stage. The contact hole 41e is connected to the output terminal wiring Vo in the first stage (refer to FIG. 10A).

The drain connection wiring 39a in the first stage is connected to the gate connection wiring 38b via the contact hole 41e (refer to FIG. 10C). The gate connection wiring 38b connects the gate of the P-channel MOS transistor 37c to the gate of the N-channel MOS transistor 37d in the second stage.

The contact holes 41a and 41c are respectively formed above the silicon pillars 40a and 40c in the P-channel MOS transistors 37a and 37c in the first and second stages. Both of the contact holes 41a and 41c are connected to the power supply terminal wiring layer Vdd.

The contact holes 41b and 41d are respectively formed above the silicon pillars 40b and 40d in the N-channel MOS transistors 37b and 37d in the first and second stages. Both of the contact holes 41b and 41d are connected to the ground terminal wiring layer Vss.

A contact hole 41f is formed above the drain connection wiring 39b in the second stage. The contact hole 41f is connected to the output terminal wiring layer Vout.

The input terminal wiring layer Vi, the power supply terminal wiring layer Vdd, the ground terminal wiring layer Vss, and the output terminal wiring layer Vout are arranged so as to be parallel to one another.

FIG. 10C is a sectional structural view, taken along C-C' line in FIG. 10B. Hereinafter, the above-described two-stage CMOS inverter circuit will be described with reference to FIG. 10C. In the embodiment, the two-stage CMOS inverter circuit is formed in the same manner as in the first embodiment.

The CMOS inverter circuit including the P-channel MOS transistor 37a and the N-channel MOS transistor 37b and illustrated in FIG. 10C is formed in the same manner as in the third embodiment illustrated in FIGS. 3A and 3B though the positions of the N-channel MOS transistor and the P-channel MOS transistor in the CMOS inverter circuit illustrated in FIG. 3B are exchanged therebetween in the CMOS inverter circuit illustrated in FIG. 10C.

As illustrated in FIG. 10C, in the first stage, the gate conductor layers 16ba and 16bb surrounding the silicon pillar 40a of the P-channel MOS transistor 37a are connected to the gate conductor layers 16aa and 16ab surrounding the silicon pillar 40b of the N-channel MOS transistor 37b via the gate connection wiring 38a. The contact hole 41b connected to the metal wiring layer 18a on the N-channel MOS transistor 37b is formed in the silicon oxide layer 45 formed on the gate connection wiring 38a. The contact hole 41b is connected to the ground terminal wiring Vss of the N-channel MOS transistor 37b. In FIG. 10C, a silicon oxide layer 43 is formed between the first silicon oxide layer 3 and the gate connection wiring 38a.

In the first stage, the $P^+$ polycrystalline silicon layer 55b that is formed in a lower end portion of the silicon pillar 40a of the P-channel MOS transistor 37a and functions as the drain is electrically connected to the $N^+$ polycrystalline silicon layer 55a that is formed in a lower end portion of the silicon pillar 40b of the N-channel MOS transistor 37b and functions as the drain, via a metal wiring layer 42, which is the drain connection wiring 39a in the first stage.

The metal wiring layer 42 is connected to the gate connection wiring 38b that connects the gate of the P-channel MOS transistor 37c to the gate of the N-channel MOS transistor 37d in the second stage, via the contact hole 41e formed in the silicon oxide layer 45 (refer to FIGS. 10A and 10B).

The contact hole 41a is formed above the silicon pillar 40a of the P-channel MOS transistor 37a in the first stage. The contact hole 41a is connected to the power supply terminal wiring layer Vdd. The contact hole 41b is formed above the silicon pillar 40b of the N-channel MOS transistor 37b in the first stage. The contact hole 41b is connected to the ground terminal wiring layer Vss.

The contact hole 41f is formed above the drain connection wiring 39b in the second stage. The contact hole 41f is connected to the output terminal wiring layer Vout on the silicon oxide layer 45 (refer to FIGS. 10A and 10B).

The input terminal wiring layer Vi, the power supply terminal wiring layer Vdd, the ground terminal wiring layer Vss, and the output terminal wiring layer Vout are arranged so as to be parallel to one another (refer to FIG. 10B).

According to the embodiment, the metal wiring layer 42 that functions as the drain connection wiring 39a for the P-channel MOS transistor 37a and the N-channel MOS transistor 37b in the first stage is directly connected to the gate connection wiring 38b for the P-channel MOS transistor 37c and the N-channel MOS transistor 37d in the second stage via the contact hole 41e. In this configuration, it is not necessary to route the metal wiring layer 42 (39a) up to the same layer as the input terminal wiring layer Vi, the power supply terminal wiring layer Vdd, the ground terminal wiring layer Vss, and the output terminal wiring layer Vout (refer to FIG. 10B) via a contact hole formed in the silicon oxide layer 45. Accordingly, the degree of integration of circuit elements is increased.

Eleventh Embodiment

Hereinafter, a method for forming a mask alignment mark in a semiconductor substrate according to an eleventh embodiment of the present invention will be described with reference to FIGS. 11A and 11B.

Figure 11A:
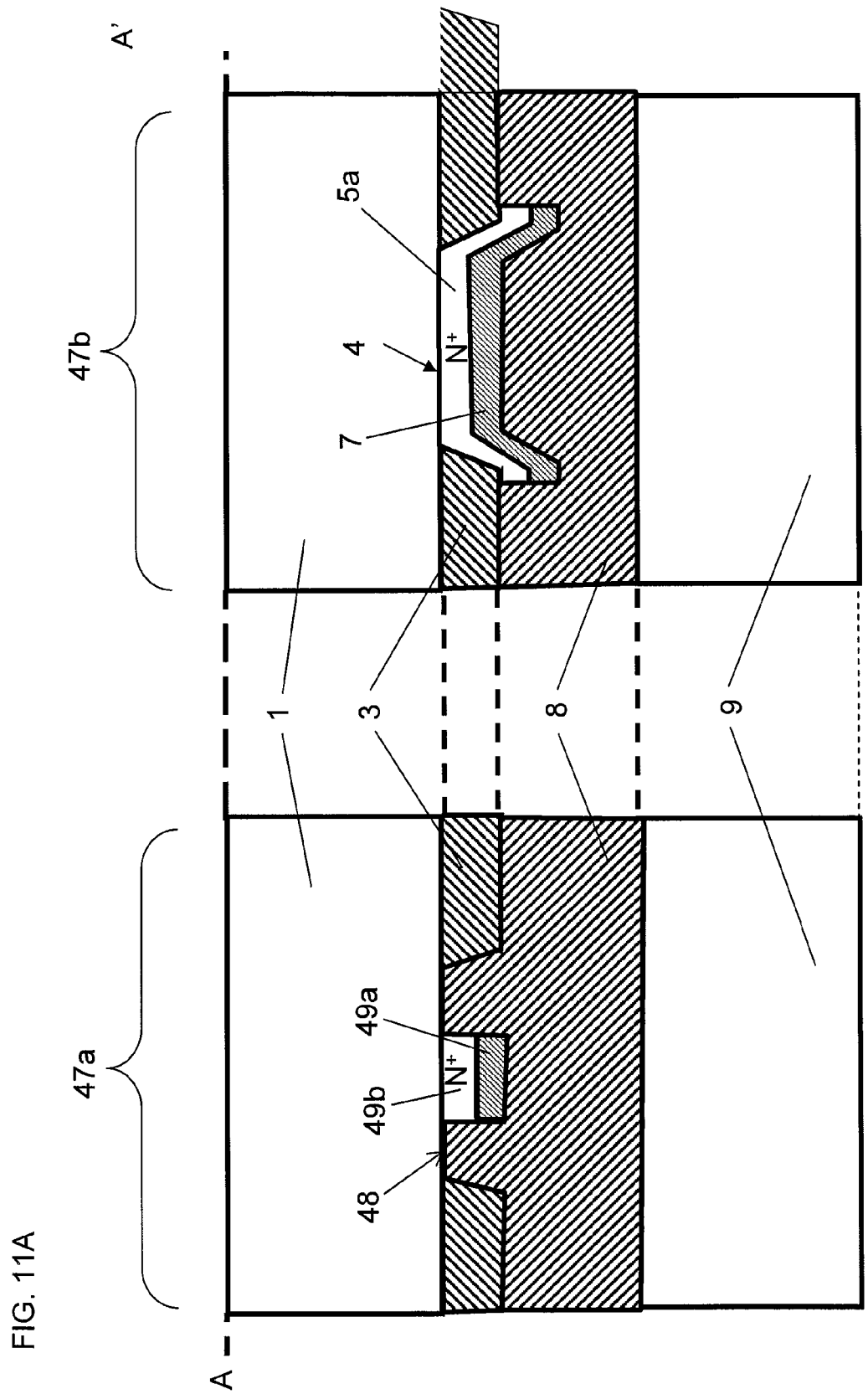
FIG. 11A is a sectional view for illustrating a method for enhancing the dimensional accuracy of a silicon pillar according to an eleventh embodiment of the present invention.

The step illustrated in FIG. 11A corresponds to the step illustrated in FIG. 1H in the first embodiment. The other steps are the same as in the first embodiment unless otherwise specified below.

As illustrated in FIG. 11A, the second silicon oxide layer 8 is formed on the second semiconductor substrate 9. The first silicon oxide layer 3 and the first semiconductor substrate 1 are formed in this order on the second silicon oxide layer 8.

As illustrated in FIG. 11A, a mask-alignment-mark-forming region 47a for mask alignment and a circuit-forming region 47b for circuit formation are defined in predetermined positions on the first semiconductor substrate 1.

In the mask-alignment-mark-forming region 47a illustrated in FIG. 11A, a silicon-oxide-layer-removed region 48 is formed in the first silicon oxide layer 3 (refer to FIG. 1B). In the central portion of the silicon-oxide-layer-removed region 48, a mark metal layer 49a and a mark polycrystalline silicon layer 49b are formed so as to be stacked.

As illustrated in FIG. 1B, the silicon-oxide-layer-removed region 48 is simultaneously formed with the hole 4 in which the source or drain of a junction field-effect transistor in a pixel of the solid-state imaging device is to be formed.

As illustrated in FIG. 11A, in the central portion of the circuit-forming region 47b, the metal layer 7 and the N+ polycrystalline silicon layer 5a are formed so as to be stacked (refer to FIG. 1H).

Figure 11B:
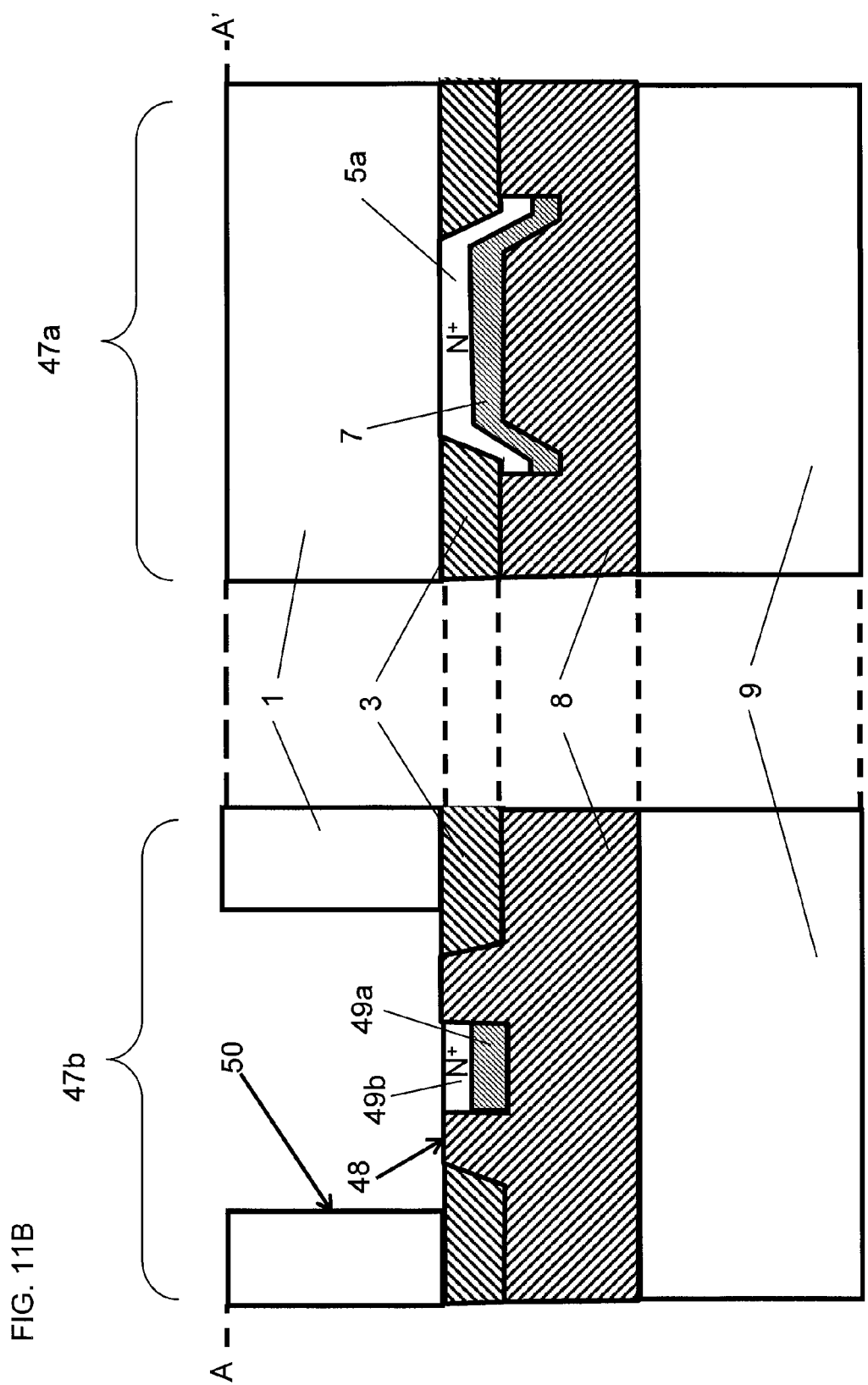
FIG. 11B is a sectional view for illustrating a method for forming a mask alignment mark in a semiconductor substrate according to the eleventh embodiment.

In the state illustrated in FIG. 11A, the first semiconductor substrate 1 is etched in the mask-alignment-mark-forming region 47a to thereby form a mask alignment hole 50 at a predetermined position as illustrated in FIG. 11B. As a result, the mark metal layer 49a, the mark polycrystalline silicon layer 49b, and the silicon-oxide-layer-removed region 48 are exposed through the mask alignment hole 50.

A photomask is subsequently aligned with a reference mask alignment mark selected from the mark metal layer 49a, the mark polycrystalline silicon layer 49b, and the silicon-oxide-layer-removed region 48 in the mask alignment hole 50.

The photomask is then placed over a region where a photoresist is formed and light is radiated through the photomask to thereby transfer the circuit.

In contrast, when the mask alignment hole 50 is not present, a photoresist is formed over the first semiconductor substrate 1 and the mask is aligned with a mark selected from the mark metal layer 49a, the mark polycrystalline silicon layer 49b, and the silicon-oxide-layer-removed region 48 that are positioned under the first semiconductor substrate 1. In this case, since the first semiconductor substrate 1 is composed of silicon and considerably absorbs blue light and ultraviolet rays, the mask alignment is performed with a light having a high transmittance such as a red wavelength light or infrared rays. Accordingly, the resolution of the mark image is degraded and the accuracy of mask alignment is degraded.

In contrast, according to the embodiment, since a silicon layer that considerably absorbs blue light and ultraviolet rays is not present in the mask-alignment-mark-forming region 47a, a photoresist can be directly formed on the mark metal layer 49a, the mark polycrystalline silicon layer 49b, and the silicon-oxide-layer-removed region 48. Therefore, a mark image having a high resolution is obtained and the accuracy of mask alignment is enhanced.

According to the embodiment, since the photoresist is directly formed on the silicon-oxide-layer-removed region 48, the accuracy of alignment between the N+ polycrystalline silicon layer 5a and the silicon pillar 1a illustrated in FIG. 1I can be enhanced.

Hereinafter, a modification of the embodiment in which the accuracy of photomask alignment is further enhanced will be described with reference to FIG. 12 in comparison with the embodiment illustrated in FIGS. 11A and 11B. The modification is the same as the eleventh embodiment unless otherwise specified below.

Figure 12:
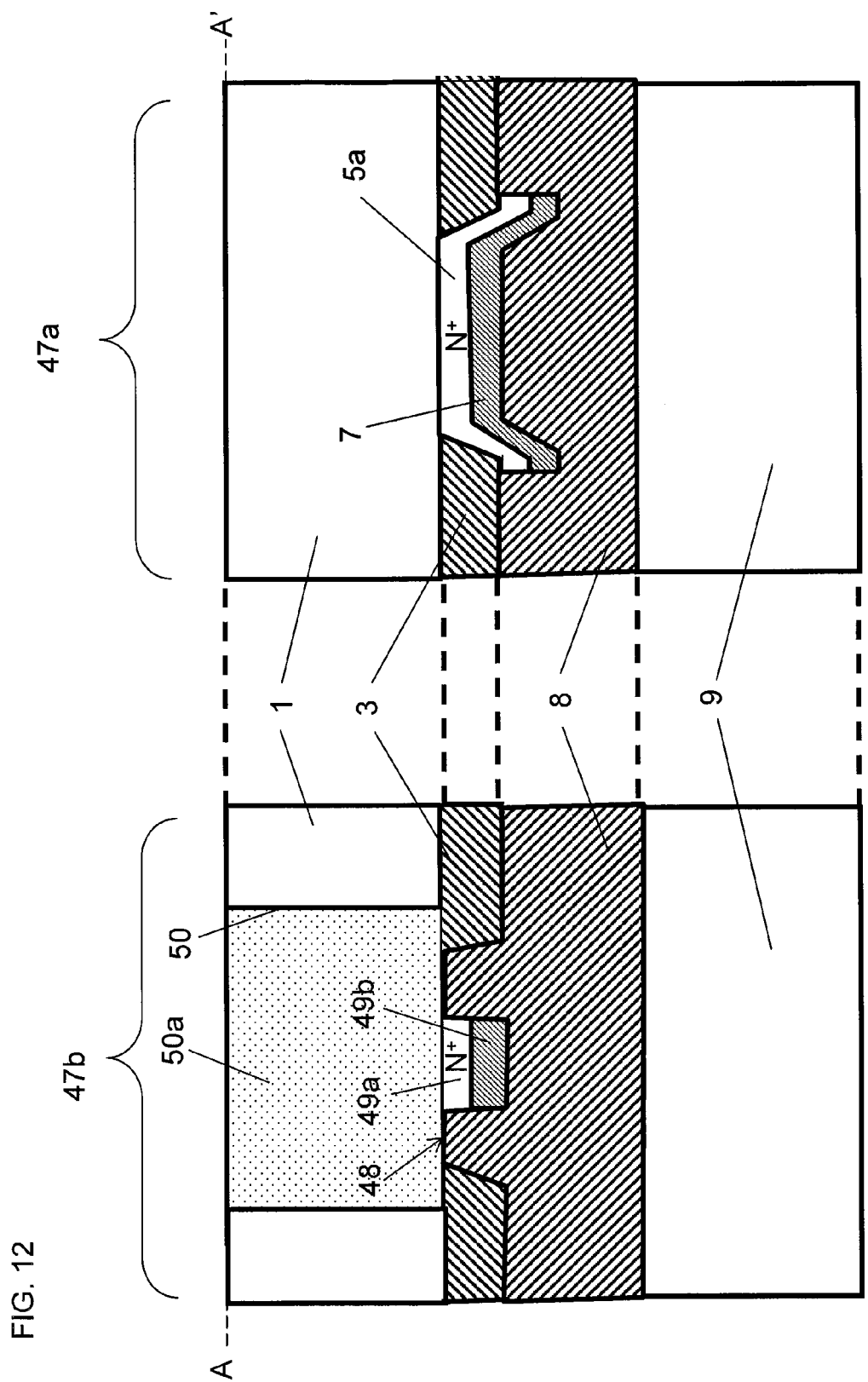
FIG. 12 is a sectional view for illustrating a production method for enhancing the dimensional accuracy of a silicon pillar according to a modification of the eleventh embodiment.

As illustrated in FIG. 12, a transparent insulating layer 50a through which blue light or ultraviolet rays pass is formed so as to fill the mask alignment hole 50 illustrated in FIG. 11B. The transparent insulating layer 50a is constituted by a $SiO_2$ film.

After that, the surfaces of the $SiO_2$ film and the first semiconductor substrate 1 are planarized by CMP. The step of filling the mask alignment hole 50 with the $SiO_2$ film is performed prior to the formation of the silicon pillar 1a in which a junction field-effect transistor is formed, referring to FIG. 1I.

According to the modification, a photoresist covering the mask-alignment-mark-forming region 47a and the circuit-forming region 47b can be uniformly formed so as to have a small thickness due to the transparent insulating layer 50a in the mask alignment hole 50. Accordingly, the accuracy of mask alignment is further enhanced, compared with the eleventh embodiment.

Twelfth Embodiment

Hereinafter, a method for producing a semiconductor device according to a twelfth embodiment of the present invention will be described with reference to FIGS. 13A and 13B.

Figure 13A:
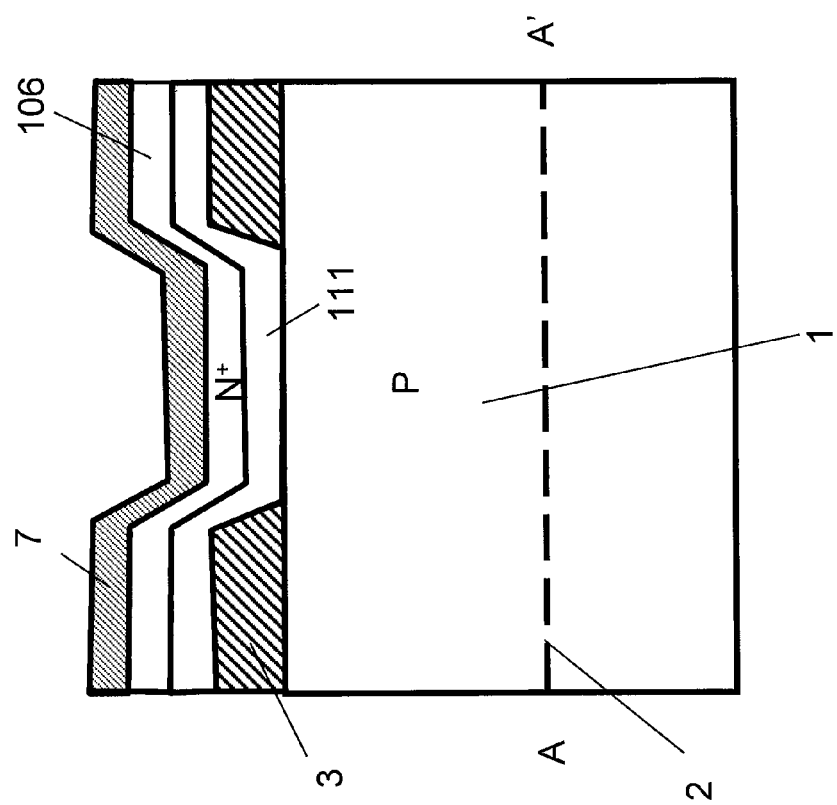
FIG. 13A is a sectional view for illustrating a method for producing a semiconductor device according to a twelfth embodiment of the present invention.

FIG. 13A corresponds to the step illustrated in FIG. 1B in the first embodiment. The other steps are the same as in the first embodiment unless otherwise specified below.

In the embodiment, in the step illustrated in FIG. 13A, the division layer 2 for dividing the first semiconductor substrate 1 into two portions of an upper portion and a lower portion is formed at a predetermined depth of the first semiconductor substrate 1; and the first silicon oxide layer 3, which is an insulator, is formed on the first semiconductor substrate 1.

As illustrated in FIG. 13A, silicon oxide ($SiO_2$) in a predetermined region of the first silicon oxide layer 3 is subsequently removed to thereby form the hole 4.

As illustrated in FIG. 13A, a polycrystalline silicon layer 111 is subsequently formed by a CVD process on the first silicon oxide layer 3 and the first semiconductor substrate 1 so as to fill the hole 4 (silicon-oxide-layer-removed region 48). The polycrystalline silicon layer 111 is not doped with donor impurities or acceptor impurities.

Figure 13B:
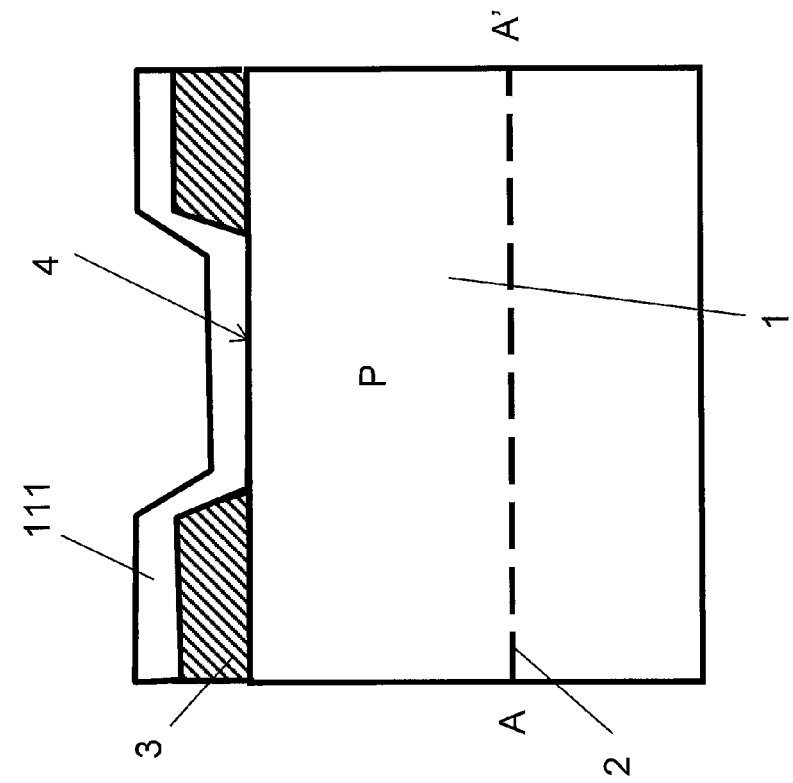
FIG. 13B is a sectional view for illustrating a method for producing a semiconductor device according to the twelfth embodiment.

As illustrated in FIG. 13B, an $N^+$ polycrystalline silicon layer 106 doped with a donor impurity is subsequently formed on the polycrystalline silicon layer 111 by a CVD process and ion doping of the donor impurity.

The metal layer 7 is subsequently formed on the $N^+$ polycrystalline silicon layer 106 in the same manner as the step illustrated in FIG. 1D. A semiconductor device is formed in the same manner as the steps illustrated in FIGS. 1E to 1L.

According to the embodiment, the polycrystalline silicon layer 111 that is not doped with impurities is formed between the first semiconductor substrate 1 and the $N^+$ polycrystalline silicon layer 106. Due to the presence of the polycrystalline silicon layer 111, the depth of diffusing a donor impurity to the silicon pillar 1a by a heat treatment in the step illustrated in FIG. 1J can be adjusted in the case of using the $N^+$ polycrystalline silicon layer 106 as a diffusion source.

For example, in the step illustrated in FIG. 1G, this is advantageous for decreasing the depth of diffusion when the $N^+$ diffusion layer 6a is expected to extend beyond a desired depth by a heat treatment under conditions (temperature and time) after the bonding of the second semiconductor substrate 9 and the second silicon oxide layer 8 on the first semiconductor substrate 1.

On the other hand, when an acceptor impurity is diffused, a $P^+$ polycrystalline silicon layer can be used instead of the $N^+$ polycrystalline silicon layer 106. The polycrystalline silicon layer 111 that is not doped with donor impurities or acceptor impurities may contain a very small amount of impurities without being deliberately doped with impurities, which does not affect the advantages of the embodiment.

Thirteenth Embodiment

Hereinafter, methods for producing a semiconductor device according to a thirteenth embodiment of the present invention will be described with reference to FIGS. 14A, 14B, 15A, and 15B.

Figure 14B:
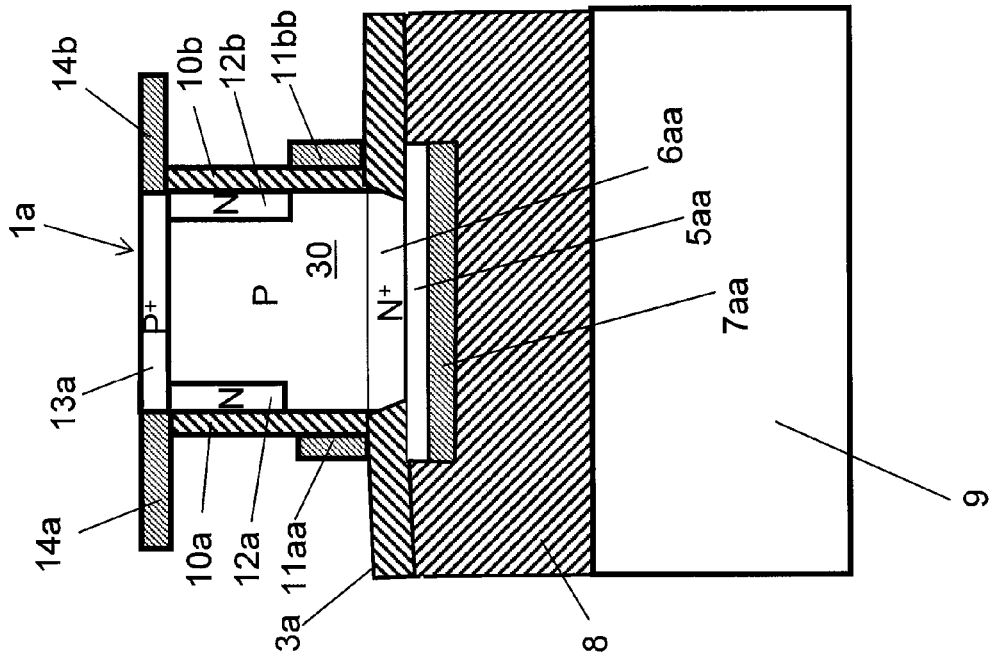
FIG. 14B is a sectional view for illustrating a method for producing a semiconductor device according to the thirteenth embodiment.
Figure 14A:
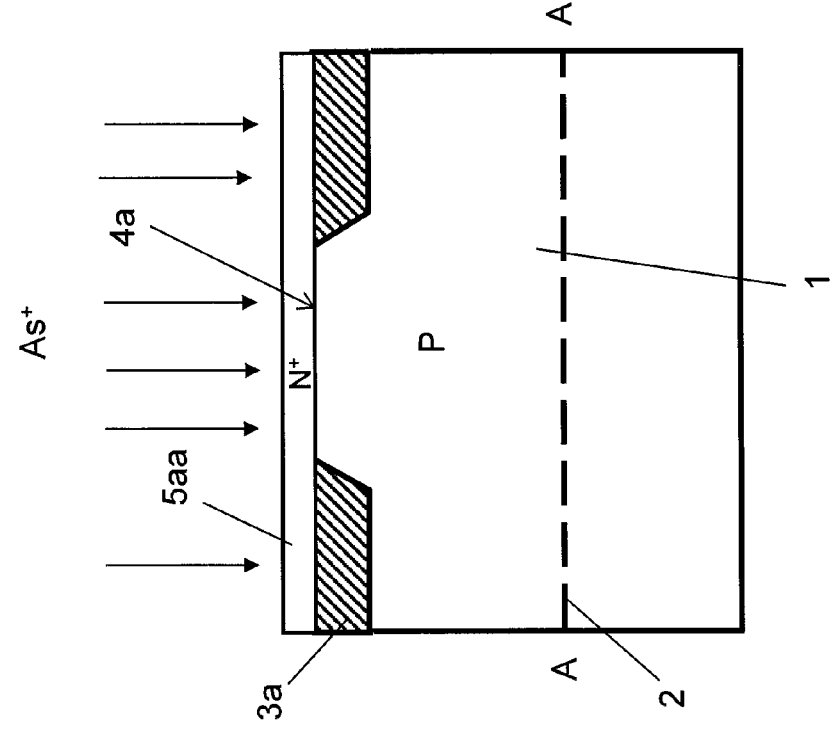
FIG. 14A is a sectional view for illustrating a method for producing a semiconductor device according to a thirteenth embodiment of the present invention.

FIG. 14A corresponds to the step illustrated in FIG. 1C in the first embodiment. FIG. 14B corresponds to the step illustrated in FIG. 1K in the first embodiment. The other steps are the same as in the first embodiment unless otherwise specified below.

In the embodiment, as illustrated in FIG. 14A, a silicon oxide layer 3a is formed, on the surface of the first semiconductor substrate 1, around a region 4a corresponding to the hole 4 in FIG. 1B by a shallow trench isolation (STI) process. Specifically, for example, a portion of the silicon semiconductor substrate 1 around the region 4a is first etched. Subsequently, a silicon oxide layer is deposited by a chemical vapor deposition (CVD) process and the surface thereof is planarized by chemical mechanical polishing (CMP) to thereby form the first silicon oxide layer 3a. The etching of the silicon semiconductor substrate 1 is desirably performed not in a direction perpendicular to the surface of the silicon semiconductor substrate 1 through a silicon nitride layer serving as a mask but so as to form a tapered shape. As a result, the bottom of the first silicon oxide layer 3a can be positioned inward in the silicon semiconductor substrate 1 with respect to the surface of the silicon semiconductor substrate 1 in the region 4a. After that, a polycrystalline silicon layer 5aa containing a donor impurity (corresponding to the polycrystalline silicon layer 5a in FIG. 1C) is formed.

Subsequently, steps similar to those illustrated in FIGS. 1D to 1K are performed to thereby provide a pixel structure illustrated in FIG. 14B. Comparison between FIG. 1K and FIG. 14B indicates that FIG. 14B is different from FIG. 1K in the following three points.

(1) In FIG. 14B, the $N^+$ polycrystalline silicon layer 5aa and the metal layer 7aa are formed in flat shapes, whereas, in FIG. 1K, the $N^+$ polycrystalline silicon layer 5a and the metal layer 7 are formed so as to project upward.

(2) In FIG. 14B, the $N^+$ diffusion layer 6aa surrounded by the first silicon oxide layer 3a is formed in an inverted trapezoid shape, whereas, in FIG. 1K, the $N^+$ diffusion layer 5a is formed in a trapezoid shape along the side surface of the first silicon oxide layer 3.

(3) In FIG. 14B, the gate conductor layers 11aa and 11bb are in contact with the first silicon oxide layer 3a, whereas, in FIG. 1K, the gate conductor layers 11a and 11b are separated from the first silicon oxide layer 3.

In the embodiment, these differences (1) to (3) provide the following advantages.

(1) The $N^+$ diffusion layer 6aa is formed by thermal diffusion from the $N^+$ polycrystalline silicon layer 5aa and, prior to a heat treatment for the thermal diffusion, serves as a layer without donor impurities and can function as with the polycrystalline silicon layer 111 in FIG. 13B in the twelfth embodiment. Accordingly, without using the polycrystalline silicon layer 111, the $N^+$ diffusion layer 6aa can be formed such that the ends of the diffusion layer are positioned below the gate conductor layers 11aa and 11bb.

(2) When the silicon pillar 1a is formed by etching so as to be aligned with the $N^+$ diffusion layer 6aa, even when the side surface of the silicon pillar 1a is deviated inward with respect to the $N^+$ diffusion layer 6aa, the first silicon oxide layer 3a is a thick $N^+$ diffusion layer or formed so as to be inwardly tapered and hence silicon etching is less likely to reach the metal layer 7aa (in FIG. 1K, when the silicon pillar 1a is deviated with respect to the $N^+$ polycrystalline silicon layer 5a, the $N^+$ polycrystalline silicon layer 5a is directly exposed and hence the $N^+$ polycrystalline silicon layer 5a and the metal layer 7 thereunder are easily etched).

(3) It is not necessary to form gaps between the gate conductor layers 11aa and 11bb and the first silicon oxide layer 3a. Accordingly, the gate conductor layers 11aa and 11bb and gate-conductor-layer wiring on the first silicon oxide layer 3a can be easily formed. In FIG. 1K, to reduce leak current, the PN junction interface between the $N^+$ diffusion layer 6a and the P-type silicon layer 30 needs to be positioned within the silicon pillar 1a and hence the first silicon oxide layer 3 needs to be separated from the gate conductor layers 11a and 11b.

Figure 15B:
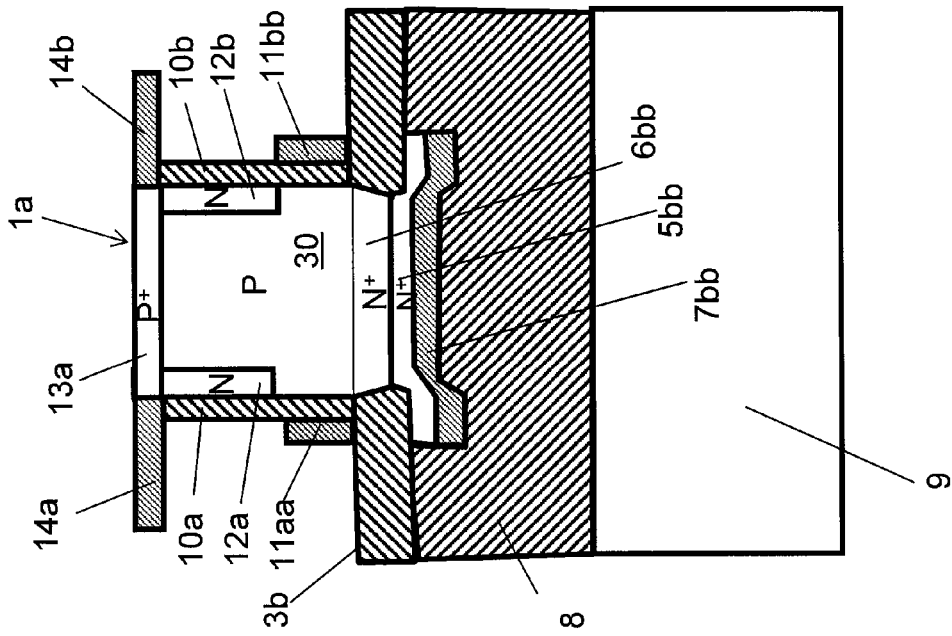
FIG. 15B is a sectional view for illustrating a method for producing a semiconductor device according to the thirteenth embodiment.
Figure 15A:
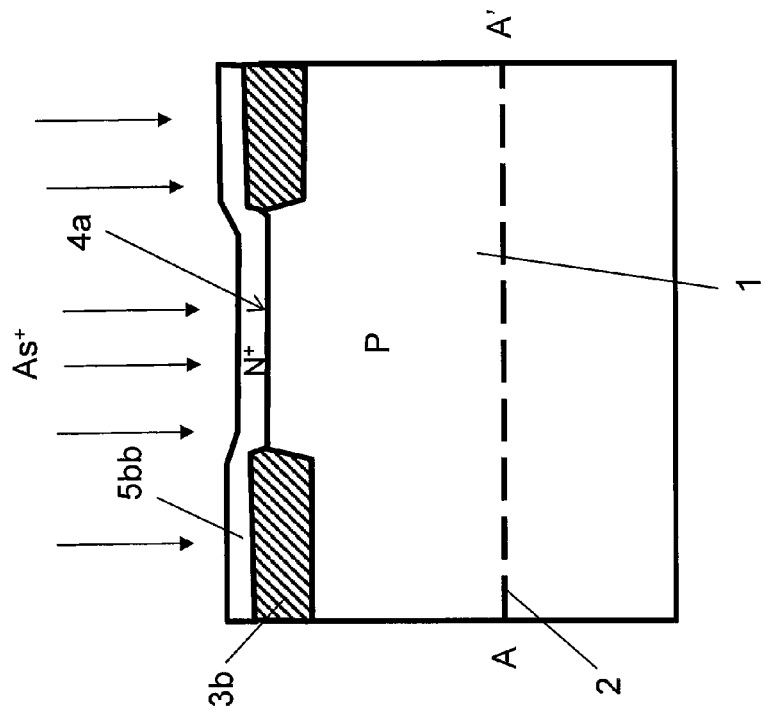
FIG. 15A is a sectional view for illustrating a method for producing a semiconductor device according to the thirteenth embodiment.

Another method for producing a semiconductor device according to the thirteenth embodiment will be described with reference to FIGS. 15A and 15B. FIG. 15A corresponds to the step illustrated in FIG. 1C in the first embodiment. FIG. 15B corresponds to the step illustrated in FIG. 1K in the first embodiment. The other steps are the same as in the first embodiment unless otherwise specified below.

In the embodiment, as illustrated in FIG. 15A, a first silicon oxide layer 3b is formed in a region surrounding the region 4a by a local oxidation of silicon (LOCOS) process. In this LOCOS process, a thin silicon oxide layer and a silicon nitride layer are formed on the region 4a and an oxidation treatment is subsequently performed to thereby form the silicon oxide layer 3b. After that, a step similar to that in FIG. 1C is performed to form the N$^+$ polycrystalline silicon layer 5bb.

Subsequently, the steps illustrated in FIGS. 1D to 1K are performed to thereby provide a pixel structure illustrated in FIG. 15B. Comparison between FIG. 1K and FIG. 15B indicates that FIG. 15B is different from FIG. 1K in the following two points.

(1) In FIG. 15B, the N$^+$ diffusion layer 6bb surrounded by the first silicon oxide layer 3b is formed in an inverted trapezoid shape as in FIG. 14B, whereas, in FIG. 1K, the N$^+$ diffusion layer 5a is formed in a trapezoid shape along the side surface of the first silicon oxide layer 3.

(2) In FIG. 15B, the gate conductor layers 11aa and 11bb are in contact with the first silicon oxide layer 3b, whereas, in FIG. 1K, the gate conductor layers 11a and 11b are separated from the first silicon oxide layer 3.

In the embodiment, these differences (1) and (2) provide the following advantages.

(1) As in FIG. 14B, the N$^+$ diffusion layer 6bb is formed by thermal diffusion from the N$^+$ polycrystalline silicon layer 5bb and, prior to a heat treatment for the thermal diffusion, serves as a layer without donor impurities and can function as with the polycrystalline silicon layer 111 in FIG. 13B in the twelfth embodiment. Accordingly, without using the polycrystalline silicon layer 111, the N$^+$ diffusion layer 6bb can be formed such that the ends of the diffusion layer are positioned below the gate conductor layers 11aa and 11bb.

(2) As in FIG. 14B, when the silicon pillar 1a is formed by etching so as to be aligned with the N$^+$ diffusion layer 6bb, even when the side surface of the silicon pillar 1a is deviated inward with respect to the N$^+$ diffusion layer 6bb, the first silicon oxide layer 3b is a thick N$^+$ diffusion layer 6bb or formed so as to be inwardly tapered and hence silicon etching is less likely to reach the metal layer 7aa.

(3) As in FIG. 14B, it is not necessary to form gaps between the gate conductor layers 11aa and 11bb and the first silicon oxide layer 3b. Accordingly, the gate conductor layers 11aa and 11bb and gate-conductor-layer wiring on the first silicon oxide layer 3b can be easily formed.

Fourteenth Embodiment

Hereinafter, a method for producing a semiconductor device according to a fourteenth embodiment of the present invention will be described with reference to FIGS. 16A and 16B. This embodiment has a feature that two or more impurity regions are formed in bottom portions of the silicon pillar 1a.

Figure 16A:
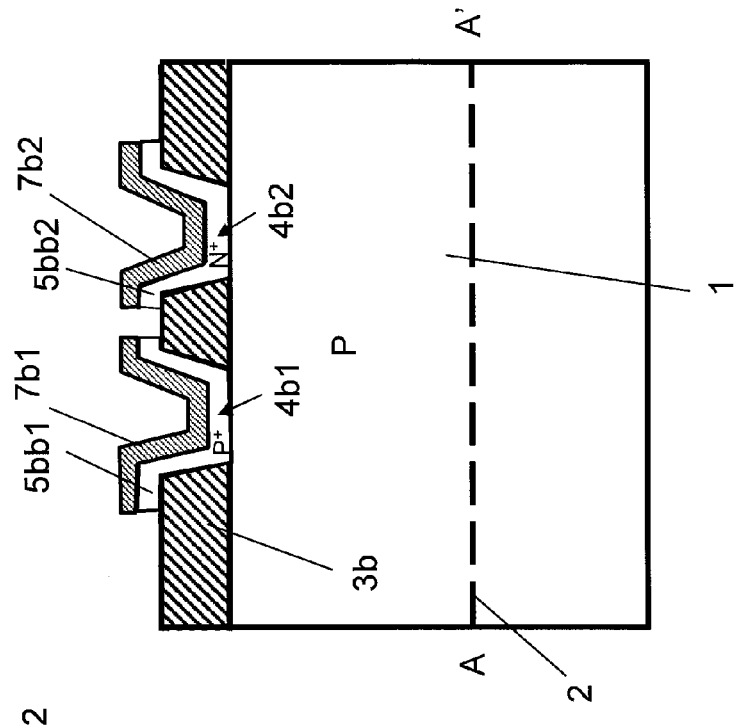
FIG. 16A is a sectional view for illustrating a method for producing a semiconductor device according to a fourteenth embodiment.

FIG. 16A illustrates a sectional view corresponding to FIG. 1C. In a region of the first silicon oxide layer 3b corresponding to the hole 4 in FIG. 1B, a first hole 4b1 and a second hole 4b2 are formed to expose the surface of the P-type silicon semiconductor substrate 1. After that, a first region B1 including the first hole 4b1 is doped with acceptor ions (in this case, boron (B) ions) to form a P$^+$ polycrystalline silicon layer 5b1; and a second region B2 including the second hole 4b2 is doped with donor ions (in this case, arsenic (As) ions) to form an N$^+$ polycrystalline silicon layer 5b2. This doping with acceptor ions and donor ions is performed such that doping with acceptor ions or donor ions is performed and then doping with the other ions is performed.

Figure 16B:
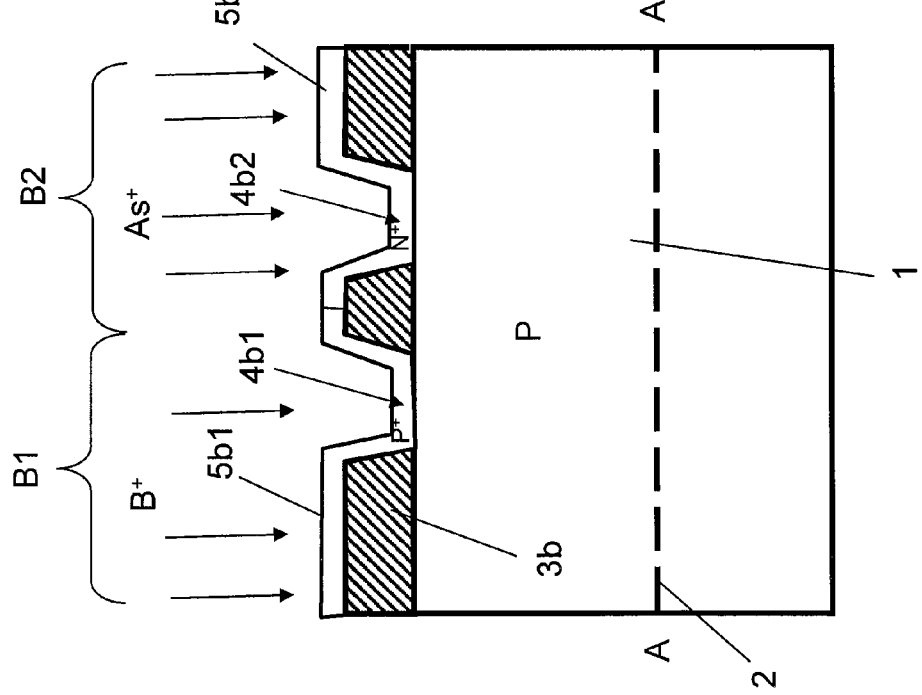
FIG. 16B is a sectional view for illustrating a method for producing a semiconductor device according to the fourteenth embodiment.

As illustrated in FIG. 16B, the P$^+$ polycrystalline silicon layer 5b1 and the N$^+$ polycrystalline silicon layer 5b2 are then covered with metal layers to form a P$^+$ polycrystalline silicon layer 5bb1 and a metal layer 7b1 and an N$^+$ polycrystalline silicon layer 5bb2 and a metal layer 7b2 that surround a portion of the first silicon oxide layer 3b between the holes 4b1 and 4b2.

Figure 16C:
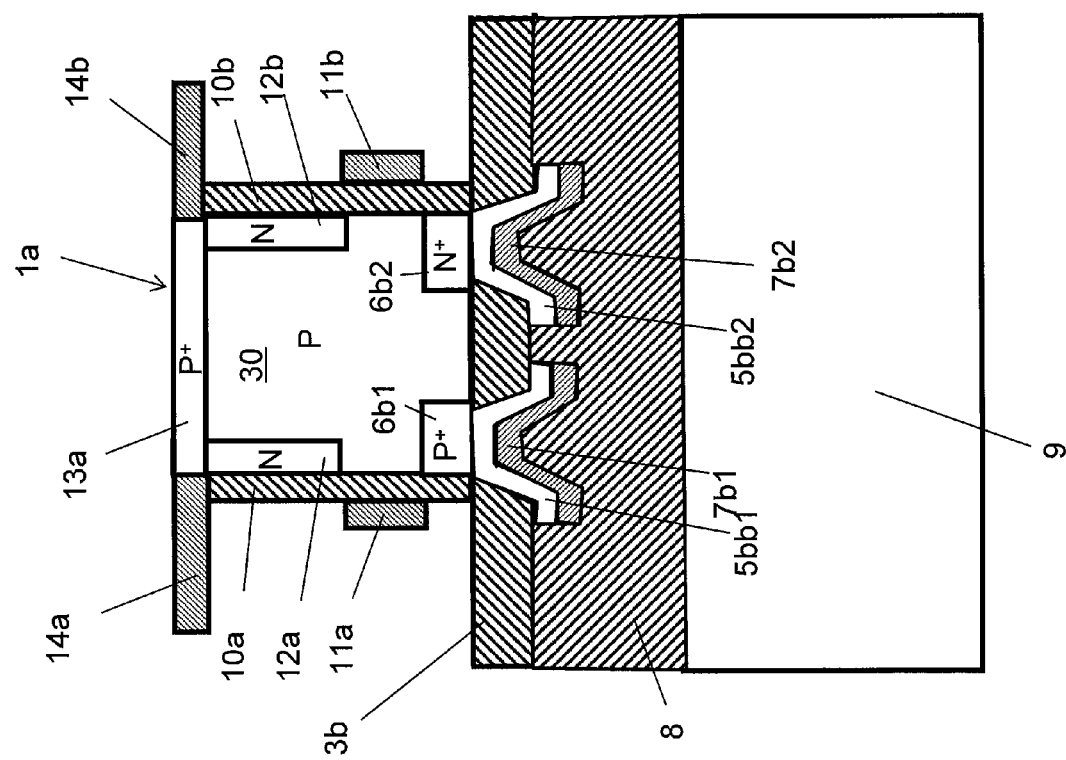
FIG. 16C is a sectional view for illustrating a method for producing a semiconductor device according to the fourteenth embodiment.
Figure 17:
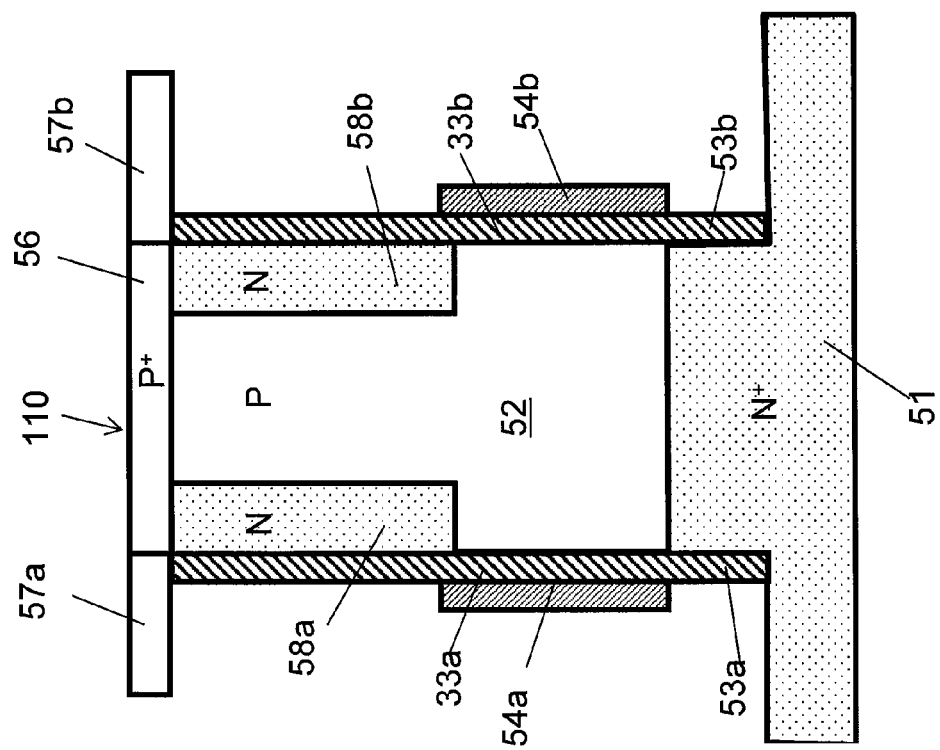
FIG. 17 is a sectional view illustrating the structure of a pixel of a solid-state imaging device of a conventional example.
Figure 18A:
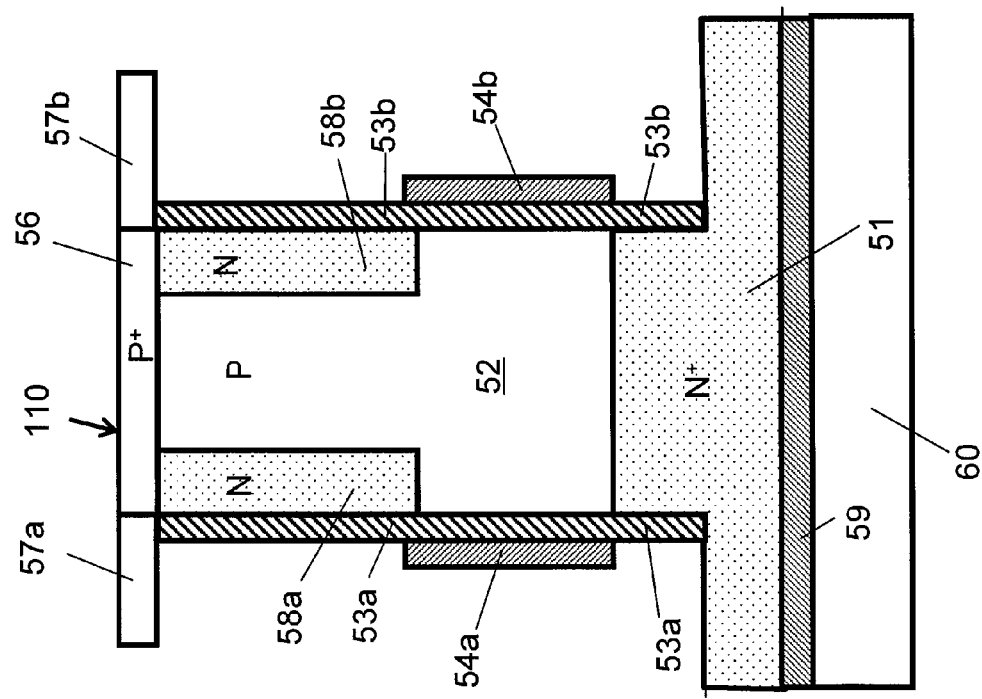
FIG. 18A is a sectional view of a pixel with which a solid-state imaging device of a conventional example is operated at a high speed.
Figure 18B:
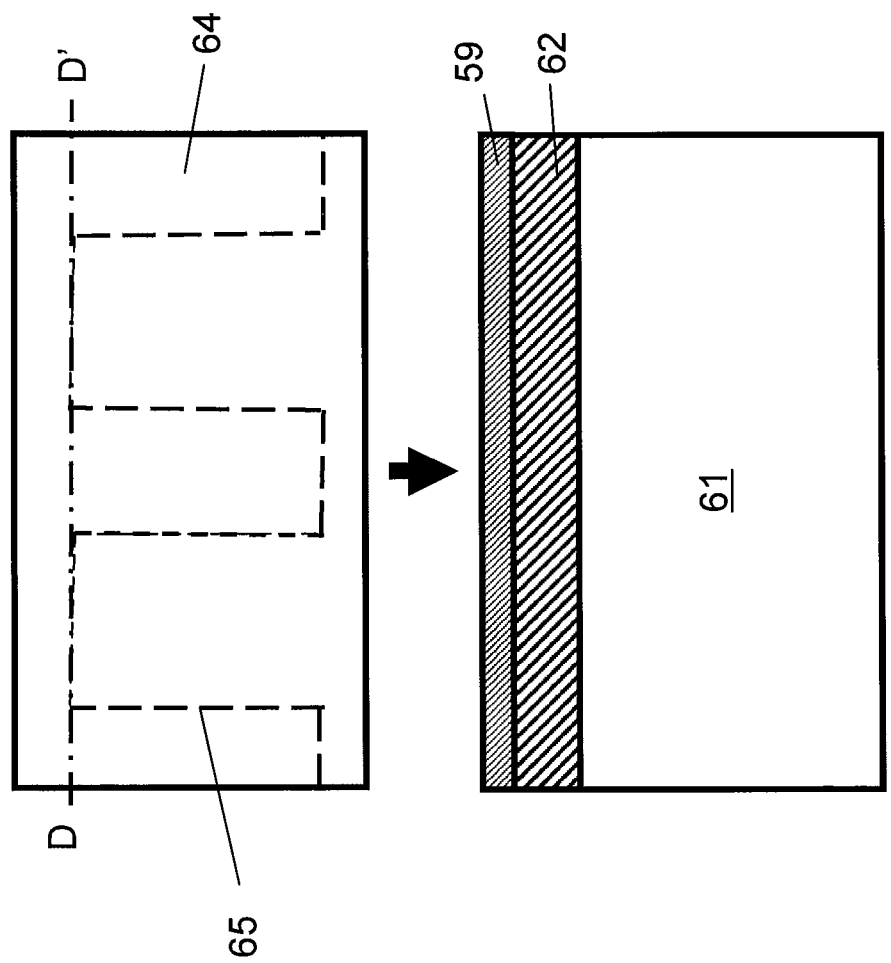
FIG. 18B illustrates a step of bonding a semiconductor substrate for obtaining a pixel with which a solid-state imaging device of a conventional example is operated at a high speed.
Figure 19:
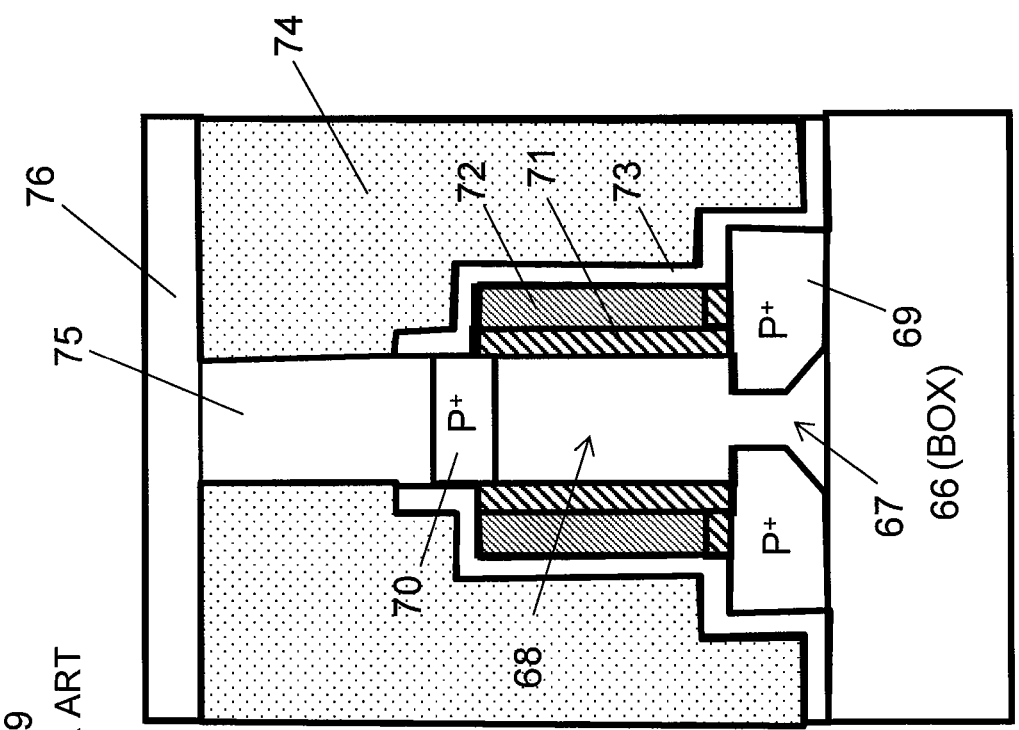
FIG. 19 is a sectional view of a pixel having an SGT of a conventional example.

Subsequently, steps similar to those illustrated in FIGS. 1F to 1K are performed. As a result, as illustrated in FIG. 16C, in bottom portions of the silicon pillar 1a, a P$^+$ diffusion layer 6b1 is formed by thermal diffusion from the P$^+$ polycrystalline silicon layer 5bb1 and an N$^+$ diffusion layer 6b2 is formed by thermal diffusion from the N$^+$ polycrystalline silicon layer 5bb2.

In such a solid-state imaging device, the P$^+$ diffusion layer 6b1 and the P$^+$ polycrystalline silicon layer 5bb1 function as drains of a junction field-effect transistor for reading signals, and the N$^+$ diffusion layer 6b2 and the N$^+$ polycrystalline silicon layer 5bb2 function as drains for discharging signal charges stored in a photodiode constituted by the N-type silicon layers 12a and 12b and the P-type silicon layer 30. The P$^+$ polycrystalline silicon layer 5bb1 and the N$^+$ polycrystalline silicon layer 5bb2 are connected to the metal layers 7b1 and 7b2 to establish connections with an external circuit. As a result, the resistance of the signal-reading line and the signal-charge-discharging line that extend from the pixel formed in the silicon pillar 1a to the external circuit is decreased to thereby achieve a high-speed operation of the solid-state imaging device.

According to the embodiment, by performing steps similar to the above-described steps, two or more impurity regions can be formed in bottom portions of the silicon pillar 1a. It is apparent that this embodiment is also applicable to another embodiment, for example, a method for producing a semiconductor device in which a circuit element other than the solid-state imaging device is formed in the silicon pillar 1a.

The first silicon oxide layer 3 in the first embodiment and the embodiments relating to the first embodiment is formed by thermal oxidation, anodic oxidation, CVD (chemical vapor deposition), and the like. This is not limitative and the first silicon oxide layer 3 may be formed so as to have a multilayer structure including another insulating film such as a silicon nitride (SiN) film.

The present invention is not limited to the embodiments described as the first to twelfth embodiments and various modifications can be made.

In the embodiments, the first semiconductor substrate 1 is of the P conductivity type. This is not limitative and the first semiconductor substrate 1 may be composed of an intrinsic semiconductor and may be of the i-type (intrinsic type). The first semiconductor substrate 1 may be of an N conductivity type depending on circuit elements formed in the first semiconductor substrate 1.

Similarly, although, in the embodiments in FIGS. 3B, 4, 9C, and 10C, the channel of the P-channel MOS transistor is formed in the N-type silicon layer 30a and the channel of the N-channel MOS transistor is formed in the P-type silicon layer 30, these channels may be formed in i-type silicon, which is an intrinsic semiconductor.

In the embodiments, in FIG. 1K, the N$^+$ polycrystalline silicon layer 5a, the metal layer 7, and the N$^+$ diffusion layer 6a are formed of different materials in the pixel of the solid-state imaging device formed in the silicon pillar 1a. The entirety of or a part of the metal layer 7, the N$^+$ polycrystalline silicon layer 5a, and the N$^+$ diffusion layer 6a may be turned into silicide layers (NiSi, WSi, or the like) through reactions between the metal material (Ni, W, or the like) of the metal layer 7 and the N$^+$ polycrystalline silicon layer 5a or a portion of the N$^+$ diffusion layer 6a by the heat treatments performed in the steps of FIGS. 1D to 1K. The entirety of or a part of the metal layer 7, the N$^+$ polycrystalline silicon layer 5a, and the N$^+$ diffusion layer 6a may be turned into silicide layers (NiSi, WSi, or the like) through reactions between the metal material of the metal layer 7 and the N$^+$ polycrystalline silicon layer 5a or a portion of the N$^+$ diffusion layer 6a by the heat treatments performed in the steps of FIGS. 1L, 2, 3B, 4, 8A, 8B, 8C, 9C, 10C, 11B, and 12. As a result, the effect of decreasing the electrical resistance of the portion serving as a signal line (electrical wiring) can also be provided.

In the embodiments, as illustrated in FIG. 1H, the first semiconductor substrate 1 is divided into two portions of an upper portion and a lower portion with respect to the division layer 2 formed by ion implantation of protons (H$^+$) at a high concentration to a predetermined depth of the first semiconductor substrate 1, by a heat treatment at 400° C. to 600° C. to thereby thin the first semiconductor substrate 1 to a predetermined thickness. This is not limitative and the first semiconductor substrate 1 may be thinned to a predetermined thickness by, for example, a method of forming a porous layer in the division layer 2 as described in Takao Yonehara, Kiyofumi Sakaguchi, and Nobuhiko Sato: "Epitaxial layer transfer by bond and etch back of porous Si", Appl. Phys. Lett. Vol. 64, No. 16, pp. 2108-2110 (18 Apr., 1994). Another method of dividing the first semiconductor substrate 1 into two portions of an upper portion and a lower portion may be employed.

The second semiconductor substrate 9 may be composed of a semiconductor other than silicon such as a compound semiconductor such as silicon carbide (SiC), an insulator, or an organic resin. In such configurations, circuit elements formed in the first semiconductor substrate 1 can also be supported.

The second silicon oxide layer 8 and the silicon oxide layers 20, 29, and 45 may be formed so as to have a multilayer configuration including another insulating film such as a silicon nitride (SiN) film.

The N$^+$ polycrystalline silicon layers 5a and 55a and the P$^+$ polycrystalline silicon layer 55b are formed by ion doping. This is not limitative and these layers may be formed by thermal diffusion of an impurity or with a doped polycrystalline silicon layer containing an impurity. Such a doped polycrystalline silicon layer is also similarly applicable to the other embodiments in the present specification.

In FIG. 1B, the polycrystalline silicon layer 5 is formed by a CVD process. This is not limitative and the polycrystalline silicon layer 5 may be formed by epitaxial growth. In this case, a single crystal silicon layer is grown on the first semiconductor substrate 1 and a polycrystalline silicon layer is formed on the first silicon oxide layer 3 under the growth conditions. In this case, the single crystal silicon layer serves as a diffusion source of a donor or an acceptor into the silicon pillar 1a. Alternatively, it is possible that a silicon layer is not formed on the first silicon oxide layer 3 under growth conditions (temperature and the like) of the single crystal silicon layer. This feature that a silicon layer is not formed on the first silicon oxide layer 3 is also similarly applicable to the other embodiments in the present specification.

In FIG. 1G, the second semiconductor substrate 9 composed of silicon and the second silicon oxide layer 8 having been planarized by CMP are bonded together. Alternatively, after an oxide layer or an insulating layer is formed on a surface of the second semiconductor substrate 9 by oxidation or a CVD process, the second semiconductor substrate 9 and the second silicon oxide layer 8 may be bonded together.

In FIG. 9C, the drain connection wiring 39 is connected to the output terminal wiring Vo through the contact hole 41d. This is not limitative and the drain connection wiring 39 may be connected to the output terminal wiring Vo such that the bottom of the contact hole 41d is in contact with the N$^+$ polycrystalline silicon layer 55a on the drain connection wiring 39. In this configuration, since the N$^+$ polycrystalline silicon layer 55a has a sufficiently low electrical resistance, a high-speed operation of the circuit element can also be achieved.

In FIG. 10C, the metal wiring layer 42, which functions as drain connection wiring (39a), is connected to the gate connection wiring 38b in the second stage via the contact hole 41e. This is not limitative and the connection may be established such that the bottom of the contact hole 41e is in contact with the N$^+$ polycrystalline silicon layer 55a on the metal wiring layer 42. In this configuration, since the N$^+$ polycrystalline silicon layer 55a has a sufficiently low electrical resistance, a high-speed operation of the circuit element can also be achieved.

The gate conductor layers 11a, 11b, 11c, 11d, 16a, 16b, 16c, and 16d illustrated in FIGS. 1L, 2, and 3B and the gate connection wirings 38, 38a, and 38b illustrated in FIG. 10C are formed by a deposition process or a CVD process. This is not limitative and such a layer or wiring may be constituted as a single layer, a plurality of metal layers composed of different metals, a polycrystalline silicon layer doped with an impurity, or a multilayer including such a polycrystalline silicon layer and a metal layer. The gate connection wirings 38, 38a, and 38b may be composed of different materials between the N-channel type and the P-channel type. The feature that the gate connection wirings 38, 38a, and 38b are composed of different materials between the N-channel type and the P-channel type is also similarly applicable to the other embodiments in the present specification.

In the two-stage CMOS inverter circuit illustrated in FIGS. 10B and 10C, the following configuration may be employed. The P$^+$-type silicon layer 17b and the N$^+$-type silicon layer 17a, which are respectively an upper portion of the silicon pillar 40a of the P-channel MOS transistor 37a and an upper portion of the silicon pillar 40b of the N-channel MOS transistor 37b, are connected to the output terminal wiring layer Vout in the first stage through the contact holes 41a and 41b formed in the silicon oxide layer 45. A metal layer 46b that is connected to the P$^+$ polycrystalline silicon layer 55b, which is a lower portion of the silicon pillar 40a of the P-channel MOS transistor 37a, and to the P$^+$ diffusion layer 6b, is used as the power supply terminal wiring layer Vdd; and a metal layer 46a that is connected to the N$^+$ polycrystalline silicon layer 55a, which is a lower portion of the silicon pillar 40b of the N-channel MOS transistor 37b, and to the N$^+$ diffusion layer 6a, is used as the ground terminal wiring layer Vss. In this structure, the same advantage as in the structure illustrated in FIG. 10C is also provided.

In the pixel structure illustrated in FIG. 1K, to achieve self alignment between the gate conductor layers 11a and 11b and the N$^+$ diffusion layer 6a that is to serve as a signal line, after the gate conductor layers 11a and 11b are formed, an N$^+$-type silicon layer may be formed in the silicon pillar 1a between the gate conductor layers 11a and 11b and the N$^+$ diffusion layer 6a by ion doping of arsenic (As) or with a deposited As doped silicon oxide layer serving as a diffusion source.

In FIG. 1I of the first embodiment, the first semiconductor substrate 1 is etched to the surface of the first silicon oxide layer 3 to form the silicon pillar 1a. However, this etching may be stopped before reaching the surface of the first silicon oxide layer 3. For example, as illustrated in FIG. 14A, an N⁺-type silicon layer may be formed by doping a silicon layer that has been left without being etched, with a donor impurity.

In the SGT illustrated in FIG. 2, to achieve self alignment between the gate conductor layers 16a and 16b and the N⁺ diffusion layer 6a that is to serve as a source or drain, an N⁺-type silicon layer may also be formed in the silicon pillar 1a between the gate conductor layers 16a and 16b and the N⁺ diffusion layer 6a by ion doping of arsenic (As) or with a deposited As doped silicon oxide layer serving as a diffusion source.

In a pixel of a solid-state imaging device illustrated in FIG. 1K and formed by the production method of the first embodiment, a conductor layer that reflects light via the third silicon oxide layers 10a and 10b may be formed on the outer peripheral portions of the N-type silicon layers 12a and 12b constituting the photodiode. As a result, mixing of colors is suppressed. Alternatively, a P⁺-type silicon layer that is connected to the P⁺-type silicon layer 13a may be formed in outer peripheral portions of the N-type silicon layers 12a and 12b and within the silicon pillar 1a to thereby provide a structure in which low image lag and low noise are achieved. In this way, a structure that further enhances a function of the solid-state imaging device can be appropriately formed in the silicon pillar 1a.

It is apparent that the technical idea of the present invention is applicable not only to a case where circuit elements according to a single embodiment are formed on the same substrate but also to a case where circuit elements according to a plurality of embodiments are formed on the same substrate. The order of production steps in the embodiments can be appropriately changed when an identical configuration is produced.

In the present invention, various embodiments and modifications can be made without departing from the broad spirit and scope of the present invention. In addition, the above-described embodiments are intended to illustrate examples of the present invention and not limit the scope of the present invention.

What is claimed is:

1. A method for producing a semiconductor device, comprising:
   a first insulating-layer-forming and removing step of forming a first insulating layer over a semiconductor substrate and removing the first insulating layer of a predetermined region on the semiconductor substrate to form an insulating-layer-removed region or
   a second insulating-layer-forming and removing step of removing, in a thickness direction of the semiconductor substrate, a portion of the semiconductor substrate around the predetermined region, and forming a first insulating layer in a semiconductor-substrate-removed region from which the portion of the semiconductor substrate has been removed;
   a first-semiconductor-layer-forming step of forming a first semiconductor layer containing a donor impurity or an acceptor impurity on the semiconductor substrate so as to cover at least the predetermined region;
   a conductor-layer-forming step of forming a conductor layer on the first semiconductor layer;
   a shaping step of shaping the conductor layer and the first semiconductor layer into predetermined shapes;
   a second-insulating-layer-forming step of forming a second insulating layer so as to cover the conductor layer and the first semiconductor layer that have been formed into the predetermined shapes;
   a planarizing step of planarizing a surface of the second insulating layer;
   a bonding step of bonding a substrate to the planarized surface of the second insulating layer;
   a thinning step of thinning the semiconductor substrate to a predetermined thickness;
   a pillar-shaped-semiconductor-forming step of forming, from the semiconductor substrate, a pillar-shaped semiconductor having a pillar-shaped structure on the first semiconductor layer; and
   a circuit-element-forming step of forming a circuit element in the pillar-shaped semiconductor,
   the method further comprising, at least after the first-semiconductor-layer-forming step, a first-semiconductor-region-forming step of forming a first semiconductor region in the pillar-shaped semiconductor through diffusion of the impurity from the first semiconductor layer containing the donor impurity or the acceptor impurity.

2. The method for producing a semiconductor device according to claim 1, wherein the circuit-element-forming step includes
   a step of forming a third insulating layer in an outer peripheral portion of the pillar-shaped semiconductor;
   a step of forming a gate conductor layer on an outer peripheral portion of the third insulating layer;
   a step of forming a fourth semiconductor region in a surface portion of the pillar-shaped semiconductor, the surface portion being located above the gate conductor layer, the fourth semiconductor region being of the same conductivity type as a conductivity type of the first semiconductor region; and
   a step of forming a third semiconductor region in the pillar-shaped semiconductor and above the third insulating layer, the third semiconductor region being of a conductivity type opposite to the conductivity type of the first semiconductor region.

3. The method for producing a semiconductor device according to claim 1, wherein the circuit-element-forming step includes
   a step of forming a third insulating layer in an outer peripheral portion of the pillar-shaped semiconductor and forming a gate conductor layer on an outer peripheral portion of the third insulating layer; and
   a step of forming a fifth semiconductor region in the pillar-shaped semiconductor and above the third insulating layer, the fifth semiconductor region being of the same conductivity type as a conductivity type of the first semiconductor region.

4. The method for producing a semiconductor device according to claim 1, wherein the circuit-element-forming step includes
   a step of forming a sixth semiconductor region in an upper portion of the pillar-shaped semiconductor, the sixth semiconductor region being of a conductivity type opposite to a conductivity type of the first semiconductor region.

5. The method for producing a semiconductor device according to claim 1, wherein the first-semiconductor-layer-forming step includes a step of forming a second semiconductor layer that functions as an electrical resistor in the same layer as the first semiconductor layer.

6. The method for producing a semiconductor device according to claim 1, wherein the first-semiconductor-layer-forming step includes a step of forming an insulating film that functions as a capacitor insulating film in a predetermined region on the first semiconductor layer that functions as a capacitor electrode, and the conductor-layer-forming step includes a step of forming the conductor layer on the insulating film, the conductor layer functioning as a capacitor electrode together with the first semiconductor layer.

7. The method for producing a semiconductor device according to claim 1, wherein the first insulating-layer-forming step includes a step of forming the first insulating layer and a fourth insulating layer on the semiconductor substrate and forming a fifth insulating layer that is thinner than the fourth insulating layer and functions as a capacitor insulating film in a predetermined capacitor-forming region;

the conductor-layer-forming step includes a step of forming the conductor layer on the fifth insulating layer, the conductor layer functioning as a capacitor electrode; and the first or second insulating-layer-forming and removing step includes a capacitor-forming step of forming, in the capacitor-forming region, an impurity layer that contains a donor impurity or an acceptor impurity and functions as a capacitor electrode.

8. The method for producing a semiconductor device according to claim 1, further comprising:

a mask-alignment-mark-forming-region-defining step of defining a mask-alignment-mark-forming region on the semiconductor substrate;

a step of forming a mask alignment hole in the mask-alignment-mark-forming region such that at least one of the insulating-layer-removed region, the first insulating layer, and the conductor layer is exposed;

a mask-alignment-mark-forming step of forming a mask alignment mark through the mask alignment hole, the mask alignment mark being constituted by at least one of the insulating-layer-removed region, the first insulating layer, and the conductor layer; and a mask alignment step of conducting mask alignment of a photomask with reference to the mask alignment mark.

9. The method for producing a semiconductor device according to claim 8, further comprising a step of filling the mask alignment hole with a transparent insulator, wherein, in the mask-alignment-mark-forming step, the mask alignment mark is formed through the transparent insulator, the mask alignment mark being constituted by at least one of the insulating-layer-removed region, the first insulating layer, and the conductor layer; and in the mask alignment step, the mask alignment of the photomask is conducted with reference to the mask alignment mark.

10. The method for producing a semiconductor device according to claim 1, further comprising, between the first or second insulating-layer-forming and removing step and the first-semiconductor-layer-forming step, a step of forming a second semiconductor layer that is not doped with donor impurities or acceptor impurities so as to cover the insulating-layer-removed region.

11. A semiconductor device produced by the method for producing a semiconductor device according to claim 2, wherein the pillar-shaped semiconductor includes a second semiconductor region that is formed on the first semiconductor region and is composed of a semiconductor of a conductivity type opposite to the conductivity type of the first semiconductor region or an intrinsic semiconductor, a diode is formed that stores signal charges generated from the second semiconductor region and the fourth semiconductor region by irradiation with electromagnetic energy waves, a junction field-effect transistor is formed in which the diode functions as a gate, one of the first semiconductor region and the third semiconductor region functions as a source and the other functions as a drain, and a current that flows through a channel formed in the second semiconductor region and varies in accordance with an amount of the signal charges stored in the diode can be extracted with a signal extraction unit, and a MOS transistor in which the gate conductor layer functions as a gate and one of the first semiconductor region and the fourth semiconductor region functions as a source and the other functions as a drain, forms a signal-charge discharging unit that discharges the signal charges stored in the diode to the first semiconductor region upon application of a voltage to the gate conductor layer.

12. A semiconductor device produced by the method for producing a semiconductor device according to claim 3, wherein the pillar-shaped semiconductor includes a second semiconductor region that is formed on the first semiconductor region and is composed of a semiconductor of a conductivity type opposite to the conductivity type of the first semiconductor region or an intrinsic semiconductor, and a MOS transistor in which the gate conductor layer functions as a gate and one of the first semiconductor region and the fifth semiconductor region functions as a source and the other functions as a drain is formed.

13. A semiconductor device produced by the method for producing a semiconductor device according to claim 4, wherein the pillar-shaped semiconductor includes a second semiconductor region that is formed between the first semiconductor region and the sixth semiconductor region, the second semiconductor region being composed of a semiconductor of a conductivity type opposite to the conductivity type of the first semiconductor region or an intrinsic semiconductor, and the second semiconductor region and the sixth semiconductor region form a diode.

14. A semiconductor device produced by the method for producing a semiconductor device according to claim 1, wherein a plurality of the pillar-shaped semiconductors are formed on the first semiconductor layer, and the plurality of the pillar-shaped semiconductors include a plurality of first pillar-shaped semiconductors in which the first semiconductor region is doped with an acceptor impurity and a plurality of second pillar-shaped semiconductors in which the first semiconductor region is doped with a donor impurity.

15. A semiconductor device produced by the method for producing a semiconductor device according to claim 1, wherein a plurality of the pillar-shaped semiconductors are formed on the first semiconductor layer, and in the plurality of the pillar-shaped semiconductors, a plurality of the first semiconductor regions are connected to one another and/or a plurality of the conductor layers are connected to one another.

16. A semiconductor device produced by the method for producing a semiconductor device according to claim 3, wherein a plurality of the pillar-shaped semiconductors are formed on the first semiconductor layer, each of the pillar-shaped semiconductors includes a second semiconductor region that is formed on the first semiconductor region and is composed of a semiconductor of a conductivity type opposite to the conductivity type of the first semiconductor region or an intrinsic semiconductor, the fifth semiconductor region formed on the second semiconductor region, the third insulating layer formed on an outer peripheral portion of the second semiconductor region, and the gate conductor layer formed on the outer peripheral portion of the third insulating layer, and a MOS transistor is formed in which the gate conductor layer functions as a gate and one of the first semiconductor region and the fifth semiconductor region functions as a source and the other functions as a drain, and the first semiconductor layer is formed so as to continuously extend along the plurality of the pillar-shaped semiconductors and the first semiconductor layer formed so as to extend is connected through a contact hole formed in an insulating layer to a wiring layer for establishing a connection with an external circuit.

17. A semiconductor device produced by the method for producing a semiconductor device according to claim 3, wherein a plurality of the pillar-shaped semiconductors are formed on the first semiconductor layer, each of the pillar-shaped semiconductors includes a second semiconductor region that is formed on the first semiconductor region and is composed of a semiconductor of a conductivity type opposite to the conductivity type of the first semiconductor region or an intrinsic semiconductor, the fifth semiconductor region formed on the second semiconductor region, the third insulating layer formed on an outer peripheral portion of the second semiconductor region, and the gate conductor layer formed on the outer peripheral portion of the third insulating layer, a MOS transistor is formed in which the gate conductor layer functions as a gate and one of the first semiconductor region and the fifth semiconductor region functions as a source and the other functions as a drain, and the first semiconductor layer is formed so as to continuously extend along the plurality of the pillar-shaped semiconductors and the first semiconductor layer is connected through a contact hole formed in an insulating layer to a wiring layer for establishing a connection with a gate of a predetermined transistor.

18. The method for producing a semiconductor device according to claim 1, wherein the second insulating-layer-forming and removing step includes a semiconductor-substrate etching step of etching the portion of the semiconductor substrate around the region in which the pillar-shaped semiconductor is to be formed, a step of forming the first insulating layer in the region formed by the etching on the semiconductor substrate, and a step of forming the first semiconductor layer on a portion of the semiconductor substrate having been exposed by the etching and on the first insulating layer positioned around the exposed portion of the semiconductor substrate.

19. The method for producing a semiconductor device according to claim 1, wherein the second insulating-layer-forming and removing step includes a step of forming a local oxidation layer serving as the first insulating layer by selectively oxidizing the portion of the semiconductor substrate around the region in which the pillar-shaped semiconductor is to be formed.

20. The method for producing a semiconductor device according to claim 1, further comprising:

a step of forming two or more regions of the first insulating layer that are separated from each other in the region in which the pillar-shaped semiconductor is to be formed, on the semiconductor substrate; and a step of forming, on an exposed surface portion of the semiconductor substrate that is surrounded by the regions of the first insulating layer that are separated from each other, a plurality of the first semiconductor layers that are separated from each other and are doped with a donor and an acceptor, and the conductor layer connected to the first semiconductor layers.

* * * * *